United States Patent
Zhou et al.

(10) Patent No.: US 9,935,221 B1
(45) Date of Patent: Apr. 3, 2018

(54) SHINGLED ARRAY SOLAR CELLS AND METHOD OF MANUFACTURING SOLAR MODULES INCLUDING THE SAME

(71) Applicant: Flex Ltd., Singapore (SG)

(72) Inventors: Lisong Zhou, Freemont, CA (US); Huaming Zhou, Wuxi Jiangsu (CN)

(73) Assignee: Flex Ltd., Singapore (SG)

( * ) Notice: Subject to any disclaimer, the term of this patent is extended or adjusted under 35 U.S.C. 154(b) by 0 days.

(21) Appl. No.: 15/622,783

(22) Filed: Jun. 14, 2017

Related U.S. Application Data

(63) Continuation of application No. PCT/CN2017/076017, filed on Mar. 9, 2017.

(51) Int. Cl.
*H01L 31/18* (2006.01)
*H01L 31/02* (2006.01)
*H02S 20/25* (2014.01)
*H01L 31/042* (2014.01)
*H01L 31/0203* (2014.01)
*H01L 31/0224* (2006.01)
*H01L 31/05* (2014.01)

(52) U.S. Cl.
CPC ........ *H01L 31/042* (2013.01); *H01L 31/0201* (2013.01); *H01L 31/0203* (2013.01); *H01L 31/022433* (2013.01); *H01L 31/0508* (2013.01); *H01L 31/18* (2013.01); *H02S 20/25* (2014.12)

(58) Field of Classification Search
CPC ............... H01L 31/02; H01L 31/02002; H01L 31/0224; H01L 31/022425; H01L 31/022433; H01L 31/022441; H01L 31/04; H01L 31/043; H01L 31/046; H01L 31/05
See application file for complete search history.

(56) References Cited

U.S. PATENT DOCUMENTS

| | | |
|---|---|---|
| 3,340,096 A | 9/1967 | Mann et al. |
| 3,769,091 A | 10/1973 | Leinkram et al. |
| 3,811,181 A | 5/1974 | Leinkram et al. |

(Continued)

FOREIGN PATENT DOCUMENTS

| | | |
|---|---|---|
| CN | 102655030 A | 9/2012 |
| CN | 202977481 U | 6/2013 |

(Continued)

OTHER PUBLICATIONS

International Search Report and Written Opinion issued in International Application No. PCT/CN2017/076017 dated Nov. 13, 2017.

*Primary Examiner* — Susan D Leong

(74) *Attorney, Agent, or Firm* — Carter, DeLuca, Farrell & Schmidt, LLP

(57) ABSTRACT

A solar cell is provided including a substrate having a front and back side, a metallization pattern deposited on the front side, the metallization pattern including a plurality of front side bus bars each including fingers extending therefrom, and a plurality of back side bus bars deposited on the back side. On the front side, one front side bus bar is formed along an edge of the front side of the substrate, and a remainder of the front side bus bars are unequally spaced across the substrate. On the back side of the substrate, only one back side bus bar is formed along an edge of the back side of the substrate, and a remainder of the back side bus bars are unequally spaced across the substrate.

16 Claims, 54 Drawing Sheets

(56) References Cited

U.S. PATENT DOCUMENTS

| | | |
|---|---|---|
| 3,837,924 A | 9/1974 | Baron |
| 4,040,867 A | 8/1977 | Forestieri et al. |
| 4,617,421 A | 10/1986 | Nath et al. |
| 4,877,460 A | 10/1989 | Flodl |
| 5,096,505 A | 3/1992 | Fraas et al. |
| 5,547,516 A | 8/1996 | Luch |
| 5,575,861 A | 11/1996 | Younan et al. |
| 5,735,966 A | 4/1998 | Luch |
| 6,232,545 B1 | 5/2001 | Samaras et al. |
| 6,414,235 B1 | 7/2002 | Luch |
| 6,459,032 B1 | 10/2002 | Luch |
| 7,732,243 B2 | 6/2010 | Luch |
| 7,740,497 B2 | 6/2010 | Nightingale |
| 7,898,053 B2 | 3/2011 | Luch |
| 7,898,054 B2 | 3/2011 | Luch |
| 7,989,692 B2 | 8/2011 | Luch |
| 7,989,693 B2 | 8/2011 | Luch |
| 8,007,306 B2 | 8/2011 | Nightingale et al. |
| 8,033,857 B2 | 10/2011 | Nightingale et al. |
| 8,198,696 B2 | 6/2012 | Luch |
| 8,242,351 B2 | 8/2012 | Gibson et al. |
| 8,563,848 B1 | 10/2013 | Wen et al. |
| D699,176 S | 2/2014 | Salomon et al. |
| D762,163 S | 7/2016 | Parilla et al. |
| D763,787 S | 8/2016 | Parilla et al. |
| D781,230 S | 3/2017 | Gibson et al. |
| D784,254 S | 4/2017 | Parilla et al. |
| D788,027 S | 5/2017 | Gibson et al. |
| 2003/0121228 A1 | 7/2003 | Stoehr et al. |
| 2007/0235077 A1 | 10/2007 | Nagata et al. |
| 2008/0011350 A1 | 1/2008 | Luch |
| 2008/0216887 A1 | 9/2008 | Hacke et al. |
| 2008/0314433 A1 | 12/2008 | Luch |
| 2009/0107538 A1 | 4/2009 | Luch |
| 2009/0120484 A1 | 5/2009 | Nightingale |
| 2009/0293941 A1 | 12/2009 | Luch |
| 2010/0024881 A1 | 2/2010 | Hacke et al. |
| 2010/0078058 A1 | 4/2010 | Nightingale et al. |
| 2010/0108118 A1 | 5/2010 | Luch |
| 2010/0175743 A1 | 7/2010 | Gonzalez et al. |
| 2011/0067754 A1 | 3/2011 | Luch |
| 2011/0126878 A1 | 6/2011 | Hacke et al. |
| 2011/0168238 A1 | 7/2011 | Metin et al. |
| 2011/0186104 A1 | 8/2011 | Shugar et al. |
| 2011/0186107 A1 | 8/2011 | Gibson et al. |
| 2011/0197947 A1 | 8/2011 | Croft |
| 2011/0240096 A1 | 10/2011 | Maheshwari |
| 2011/0315196 A1 | 12/2011 | Gibson et al. |
| 2012/0031461 A1 | 2/2012 | Luch |
| 2012/0125391 A1 | 5/2012 | Pinarbasi et al. |
| 2012/0167945 A1 | 7/2012 | Shugar et al. |
| 2012/0167946 A1 | 7/2012 | Maheshwari et al. |
| 2012/0167947 A1 | 7/2012 | Battaglia, Jr. et al. |
| 2012/0167948 A1 | 7/2012 | Marathe et al. |
| 2012/0171802 A1 | 7/2012 | Luch et al. |
| 2012/0204938 A1 | 8/2012 | Hacke et al. |
| 2012/0211052 A1 | 8/2012 | Marathe et al. |
| 2012/0318318 A1 | 12/2012 | Metin et al. |
| 2012/0318319 A1 | 12/2012 | Pinarbasi et al. |
| 2012/0325282 A1 | 12/2012 | Snow et al. |
| 2013/0032194 A1 | 2/2013 | Gibson et al. |
| 2013/0068827 A1 | 3/2013 | Akimoto |
| 2014/0102502 A1 | 4/2014 | Luch et al. |
| 2014/0318613 A1* | 10/2014 | Von Campe ........ H01L 31/0201 136/256 |
| 2016/0118515 A1* | 4/2016 | Mori ............... H01L 31/022441 136/256 |
| 2016/0172515 A1 | 6/2016 | Shugar et al. |
| 2016/0226438 A1 | 8/2016 | Gibson et al. |
| 2016/0226439 A1 | 8/2016 | Gibson |
| 2016/0233352 A1* | 8/2016 | Yang ............... H01L 31/022433 |
| 2017/0243992 A1* | 8/2017 | Rostan ........... H01L 31/022433 |
| 2017/0301802 A1 | 10/2017 | Gibson |
| 2017/0301821 A1 | 10/2017 | Gibson et al. |
| 2017/0301822 A1 | 10/2017 | Gibson et al. |
| 2017/0336105 A1 | 11/2017 | Au |

FOREIGN PATENT DOCUMENTS

| | | |
|---|---|---|
| CN | 203242643 U | 10/2013 |
| CN | 203445139 U | 2/2014 |
| CN | 104201227 A | 12/2014 |
| CN | 104810412 A | 7/2015 |
| CN | 205609546 U | 9/2016 |
| CN | 205609547 U | 9/2016 |
| CN | 205609548 U | 9/2016 |
| ES | 1073379 U | 12/2010 |
| JP | 2013140841 A | 7/2013 |
| WO | 2012091781 A1 | 7/2012 |
| WO | 2012091782 A1 | 7/2012 |
| WO | 2012106003 A1 | 8/2012 |
| WO | 2014/112424 A1 | 7/2014 |
| WO | 2016123559 A1 | 8/2016 |

* cited by examiner

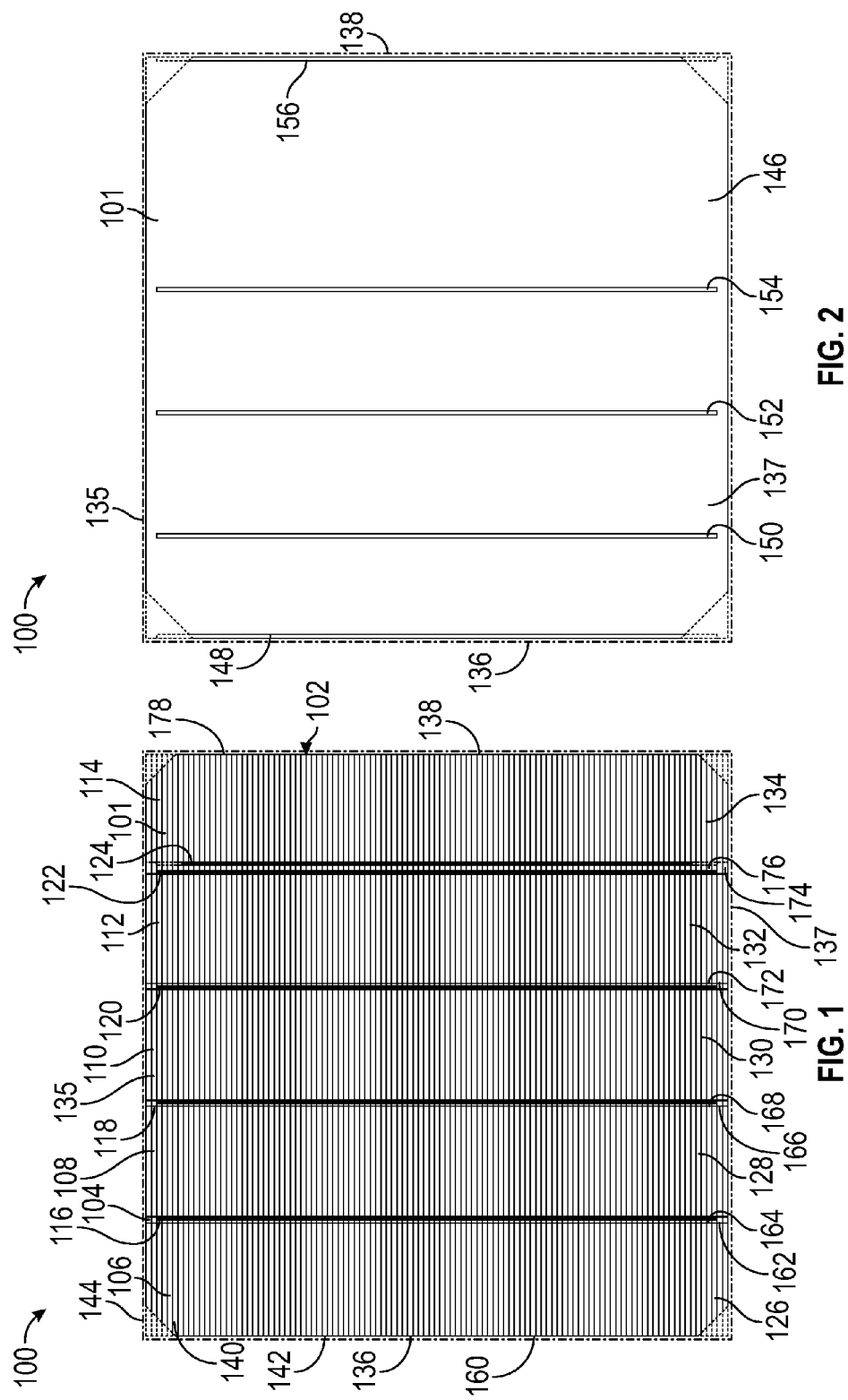

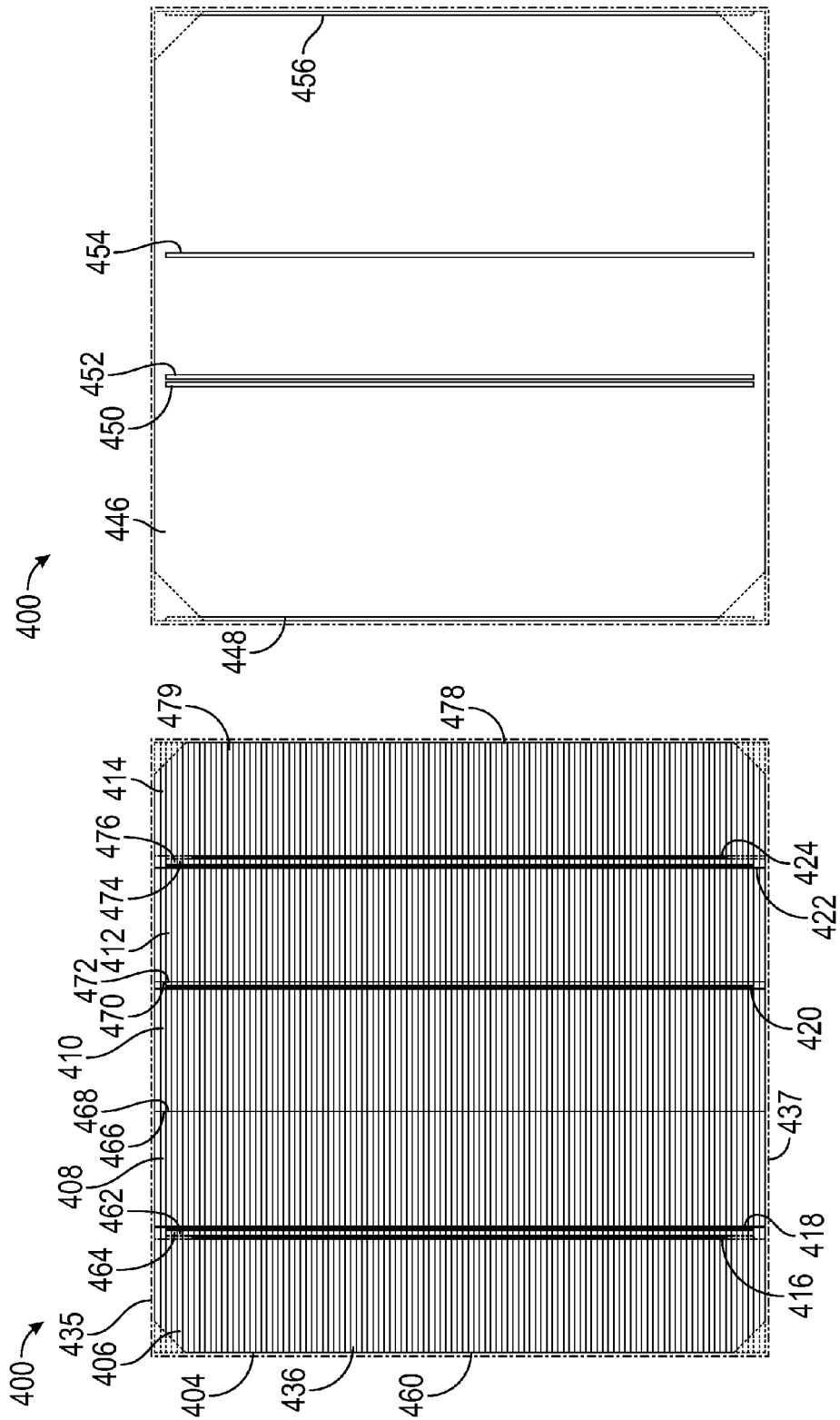

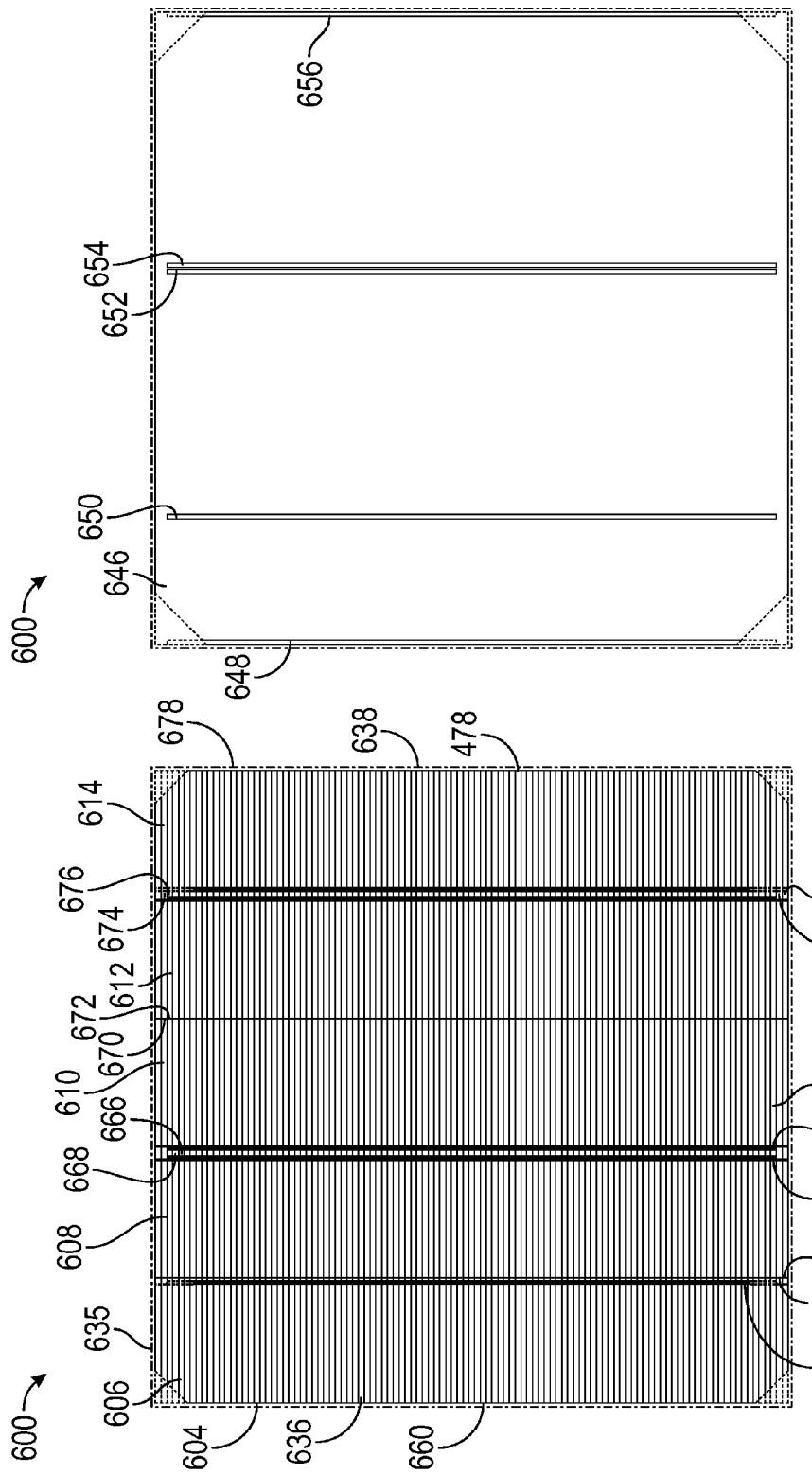

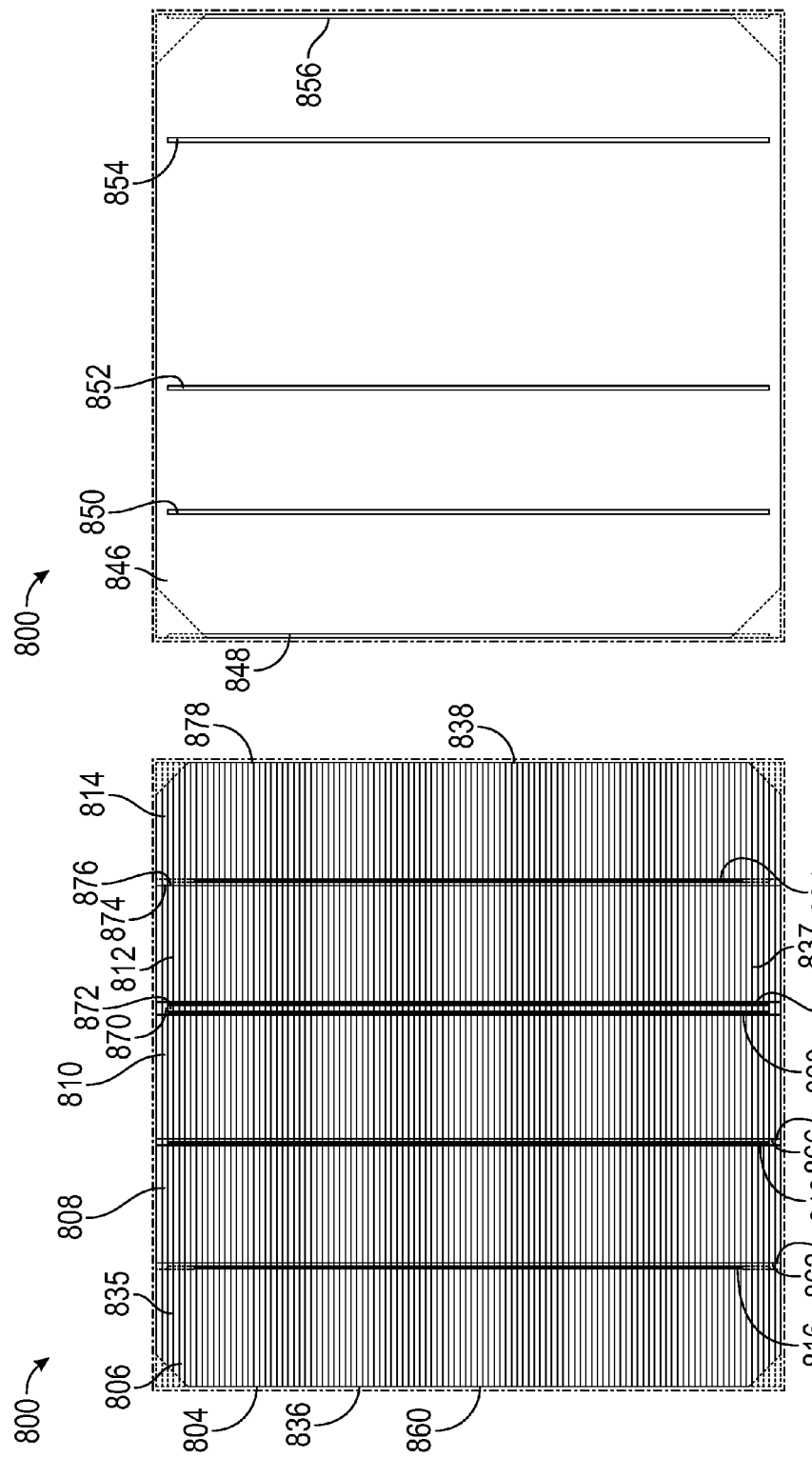

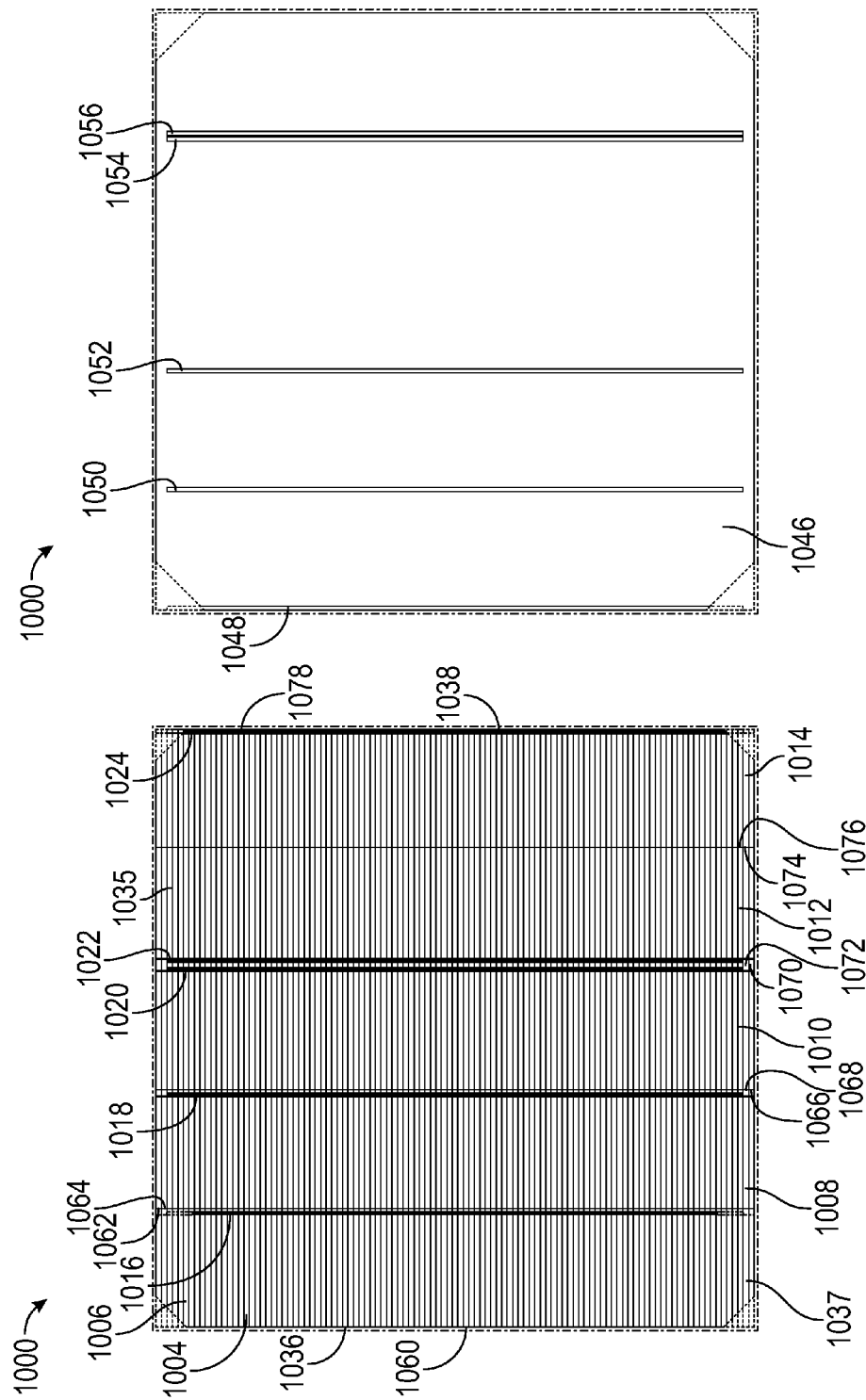

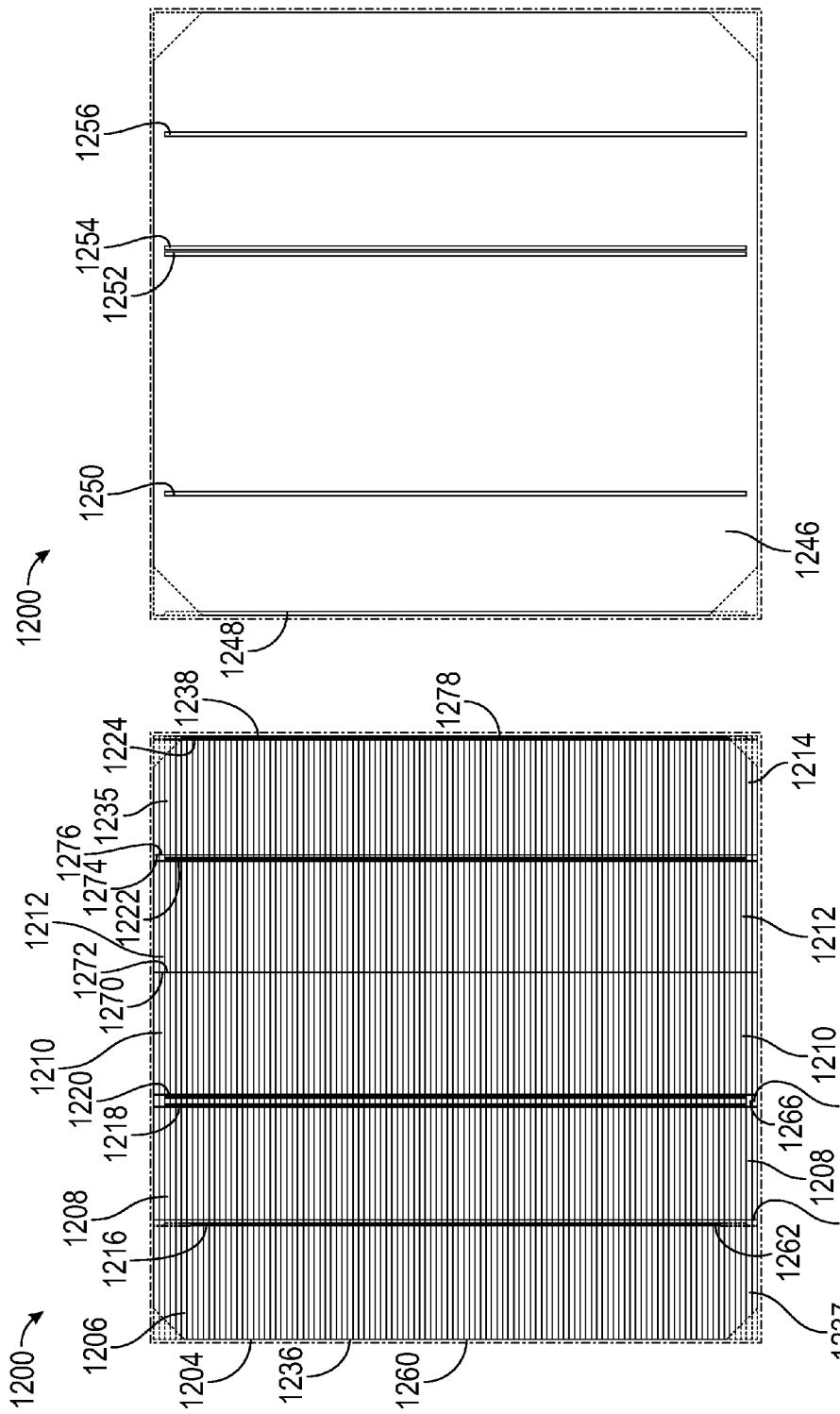

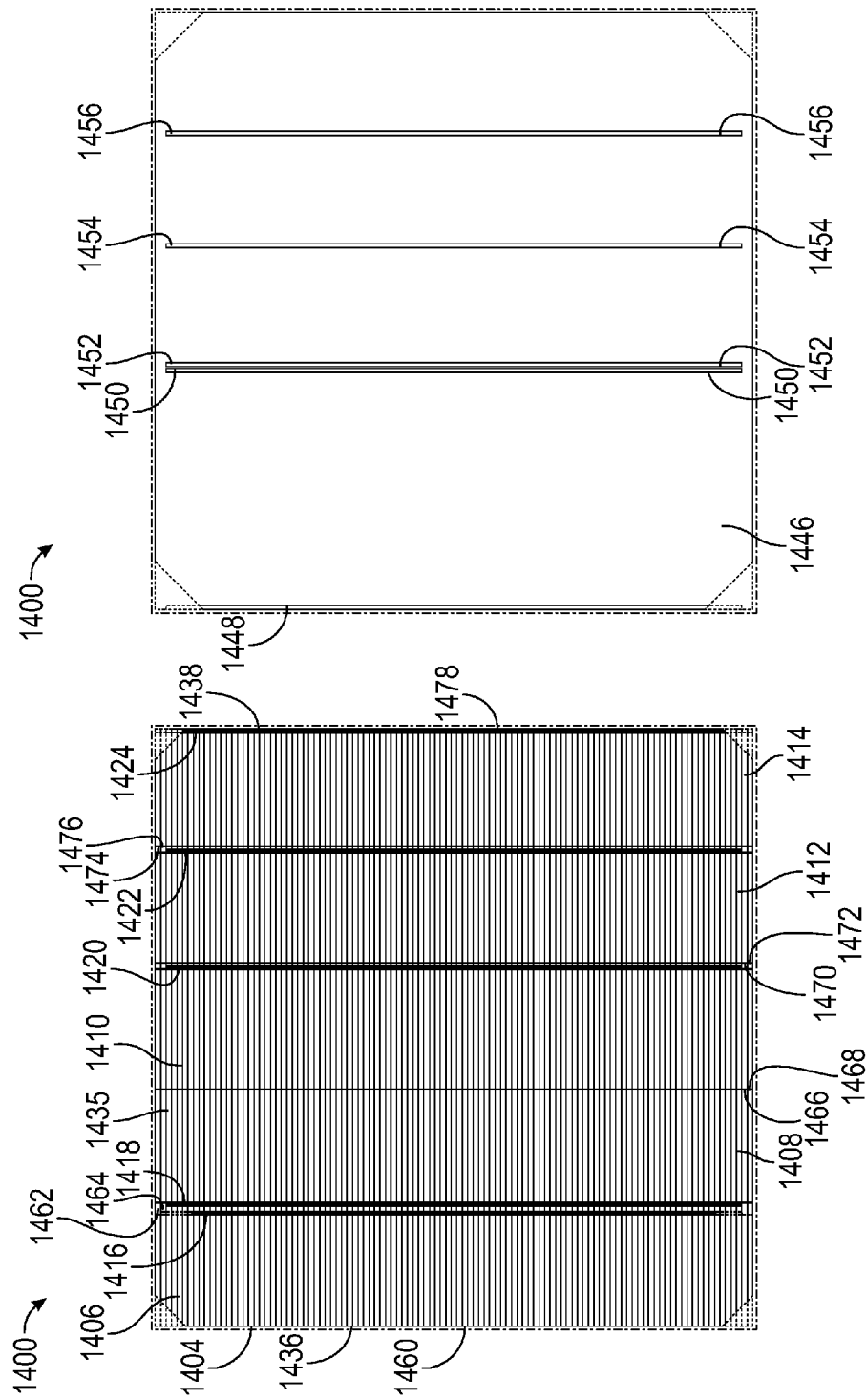

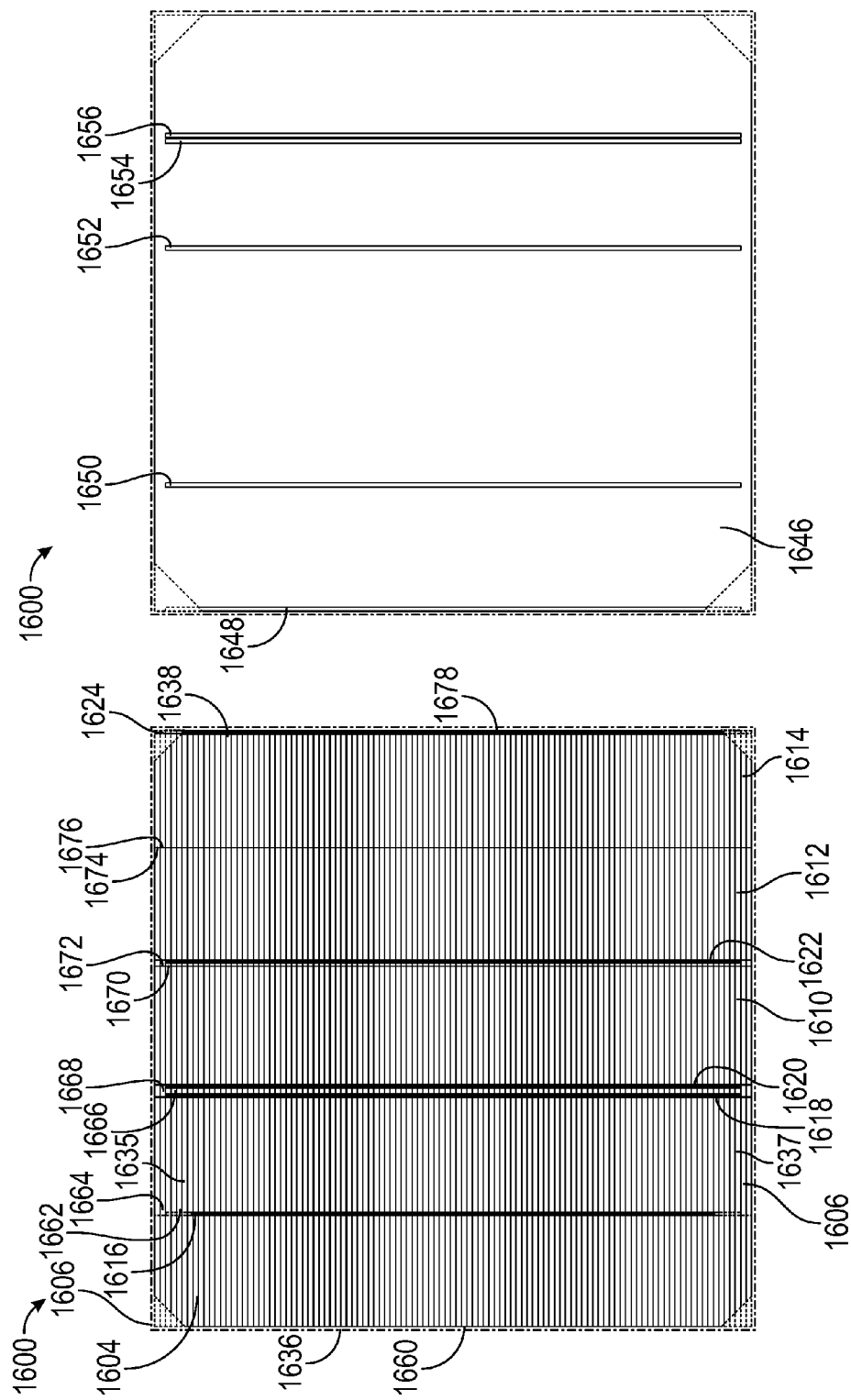

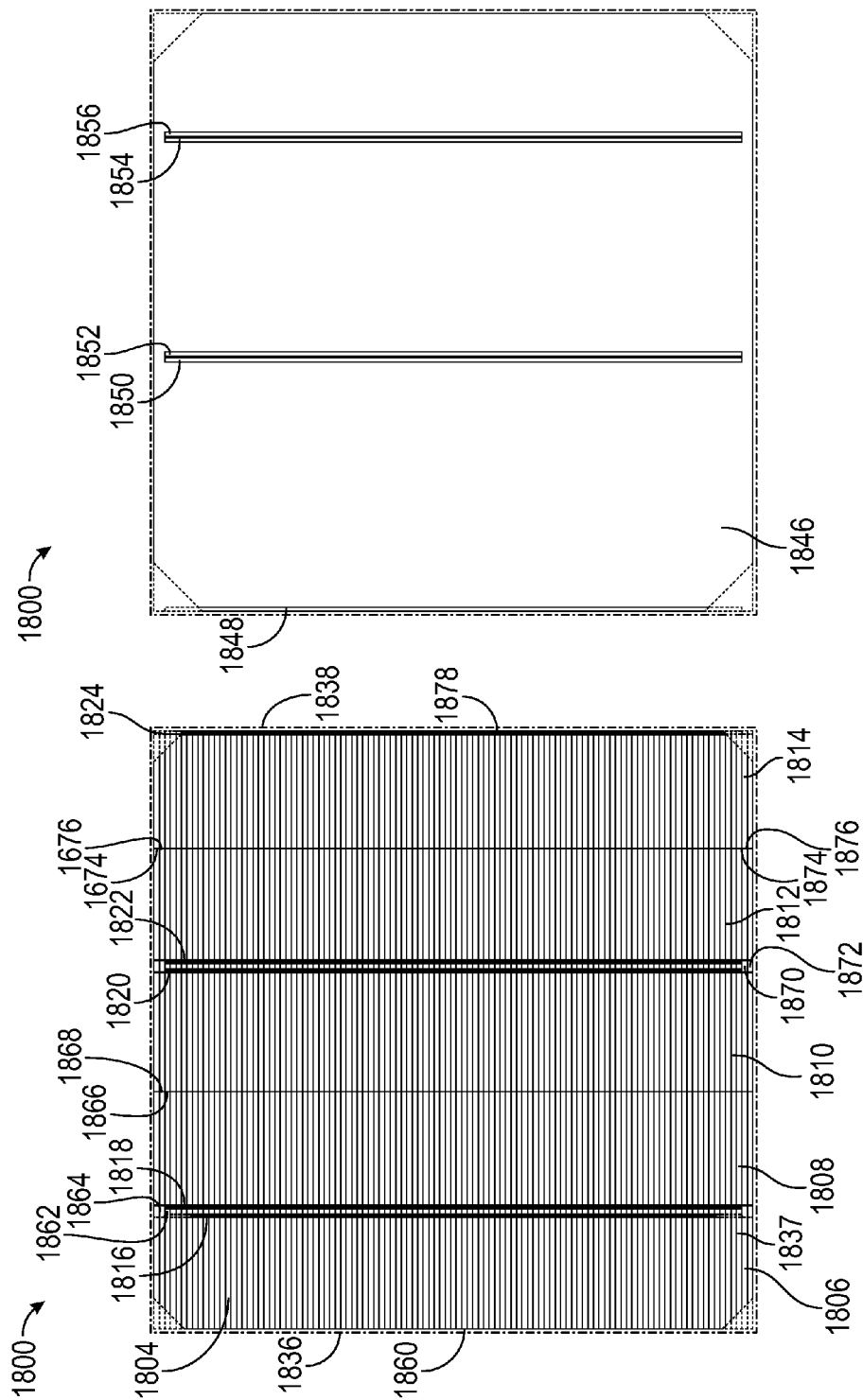

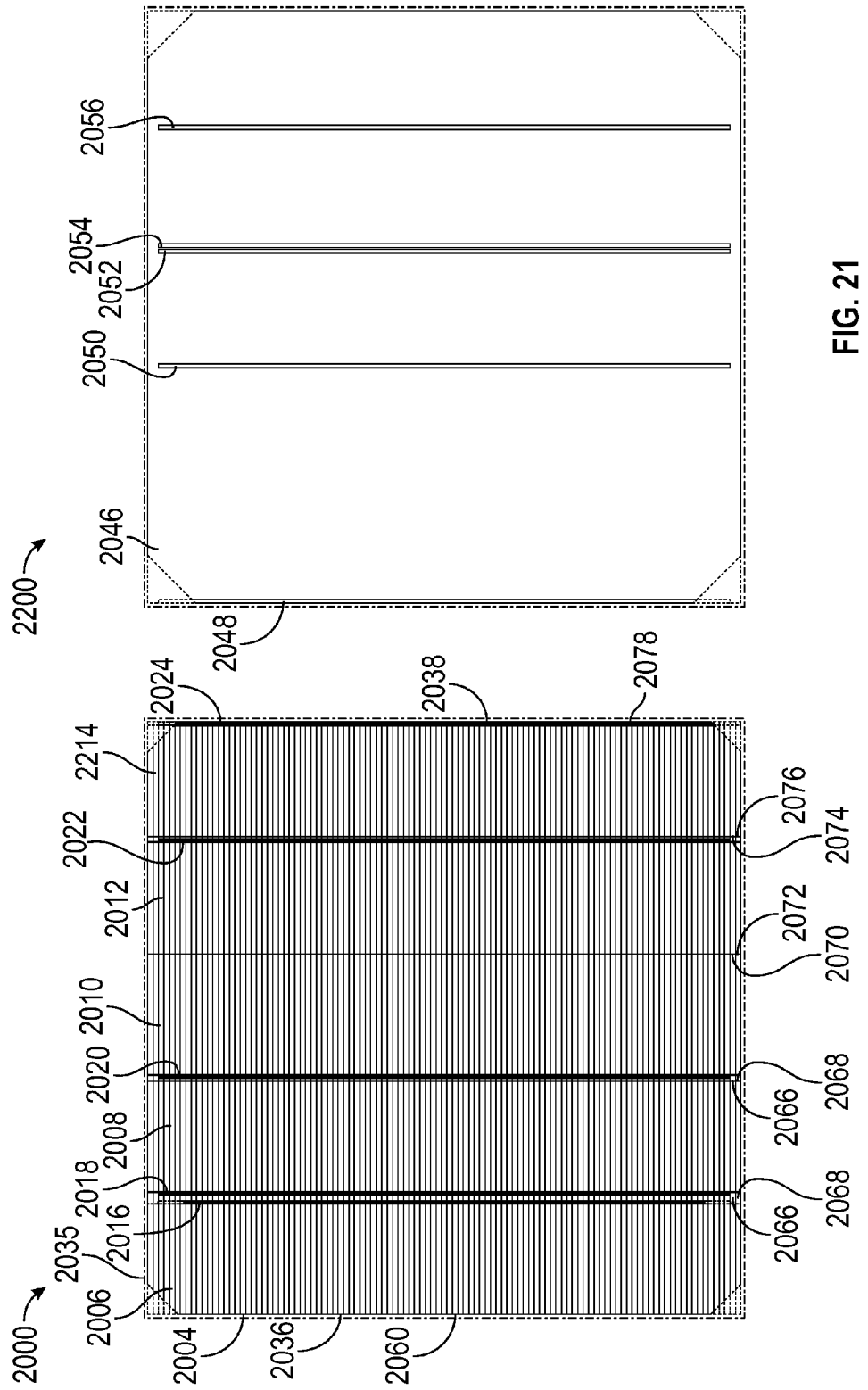

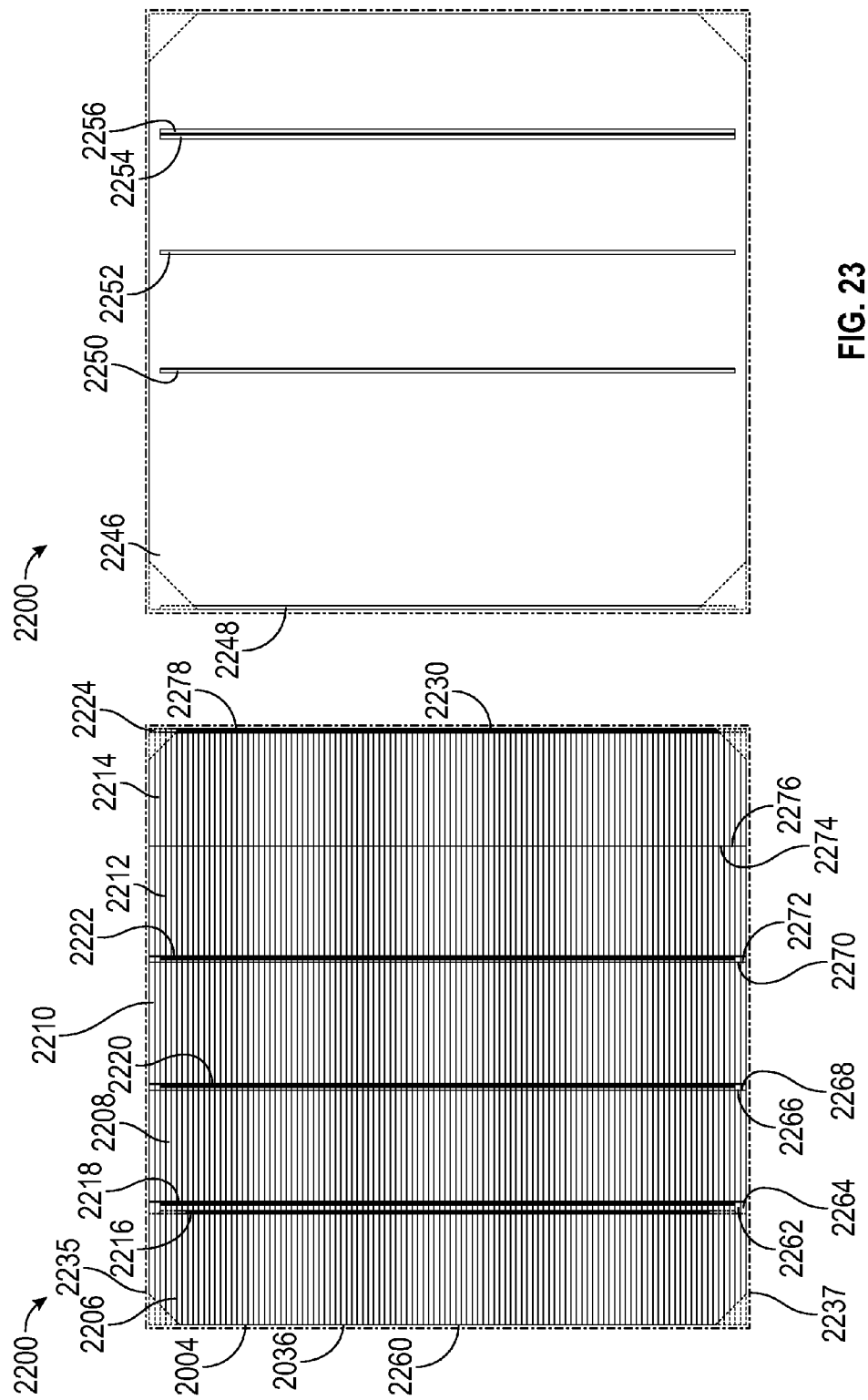

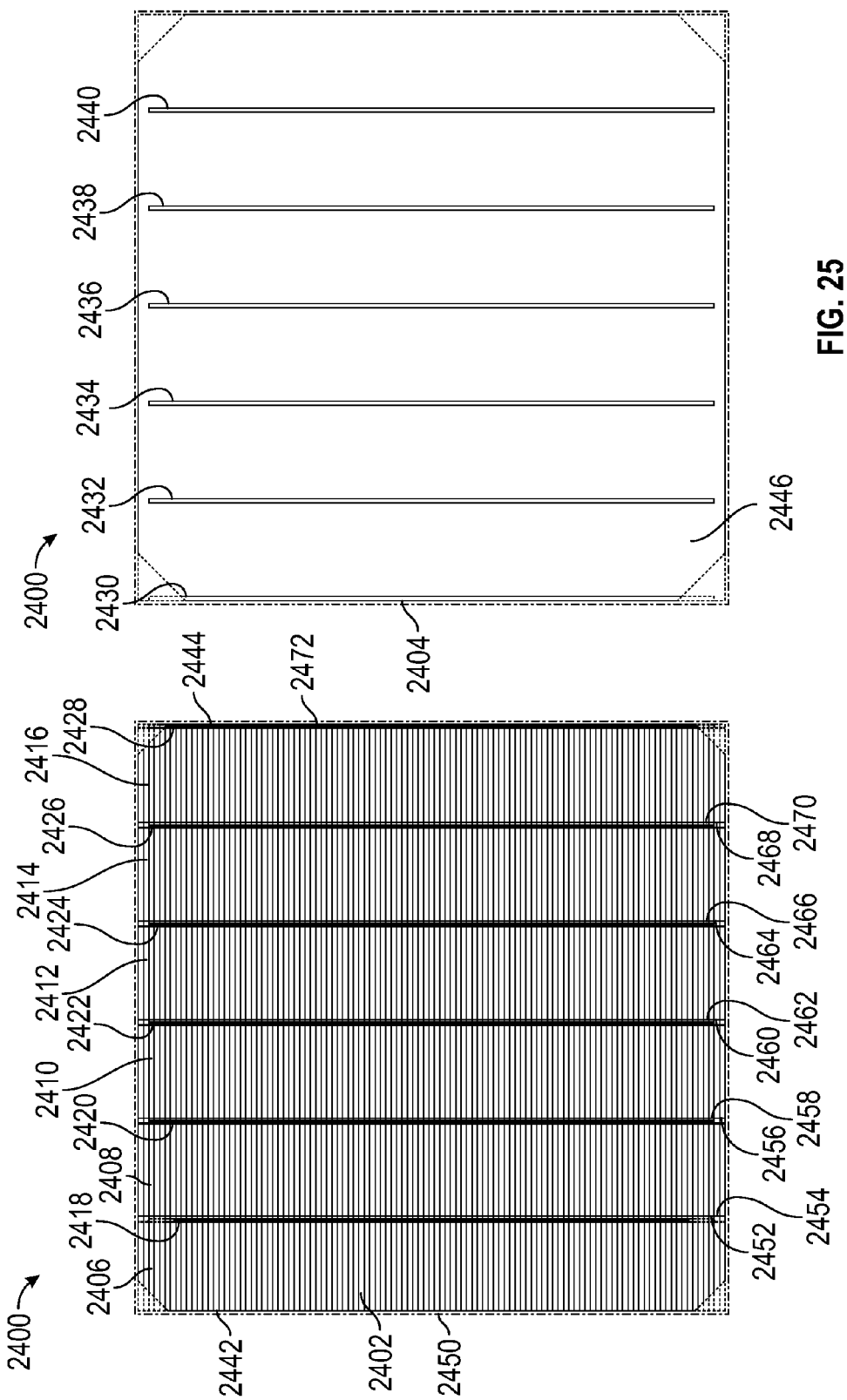

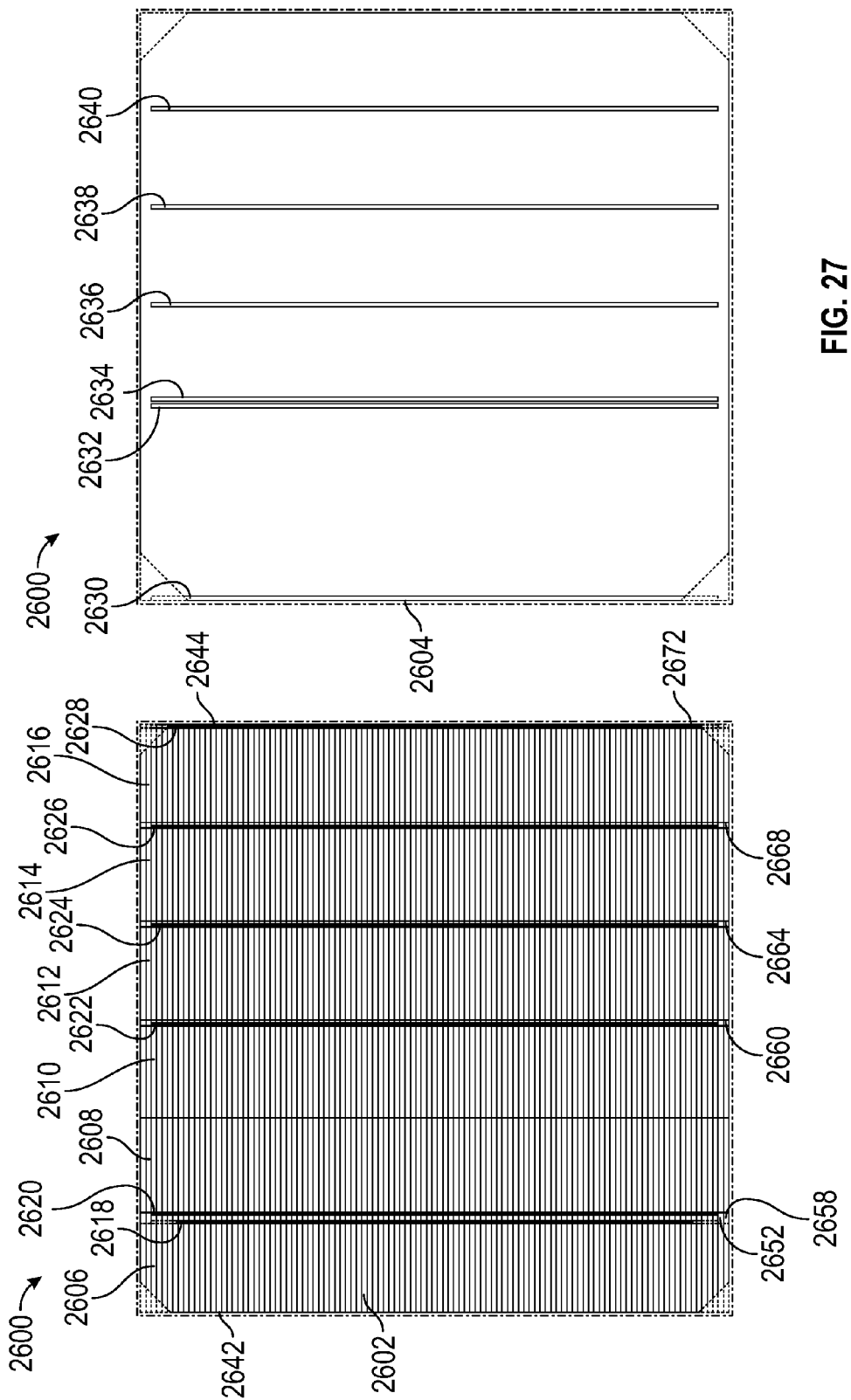

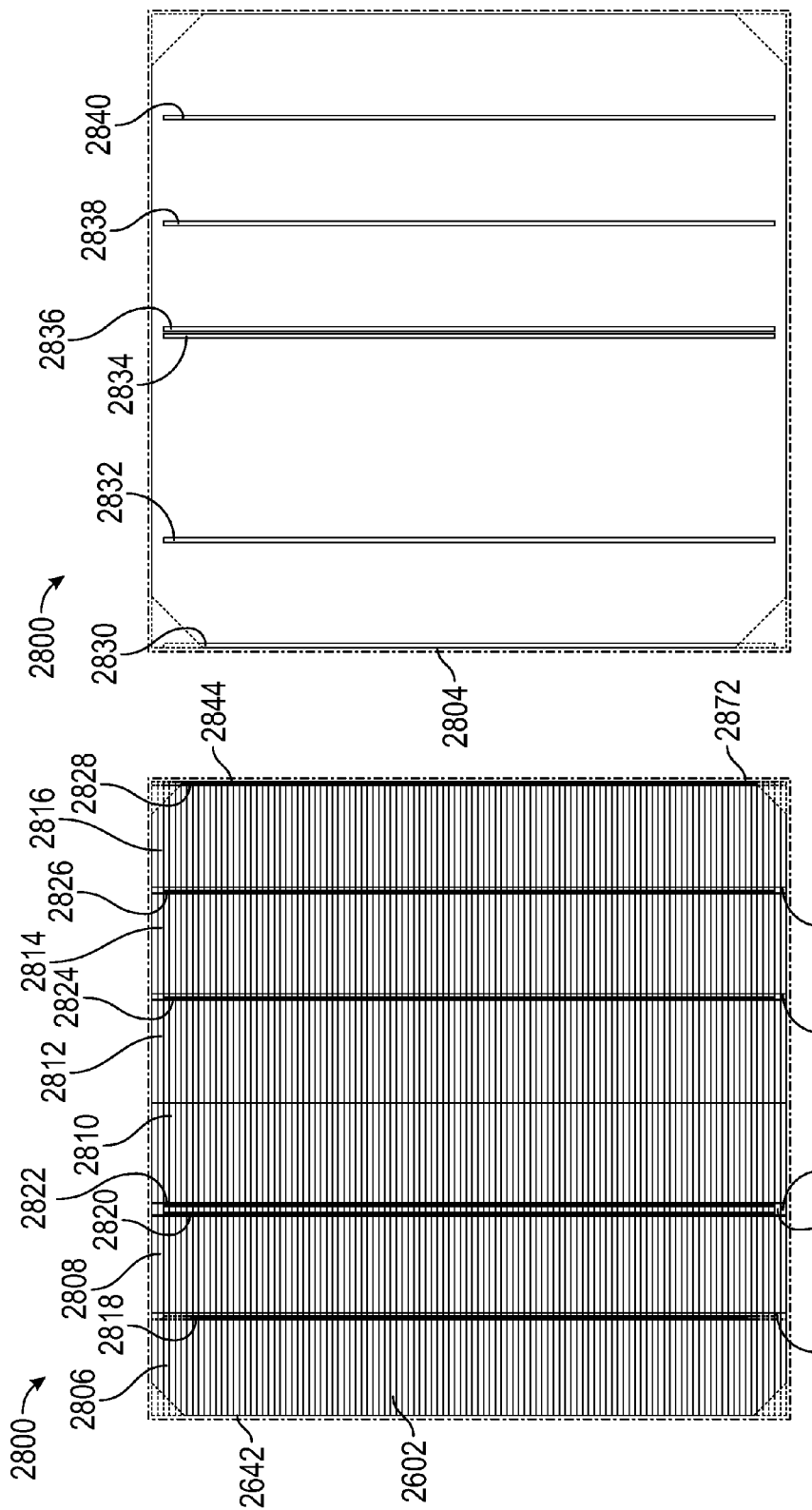

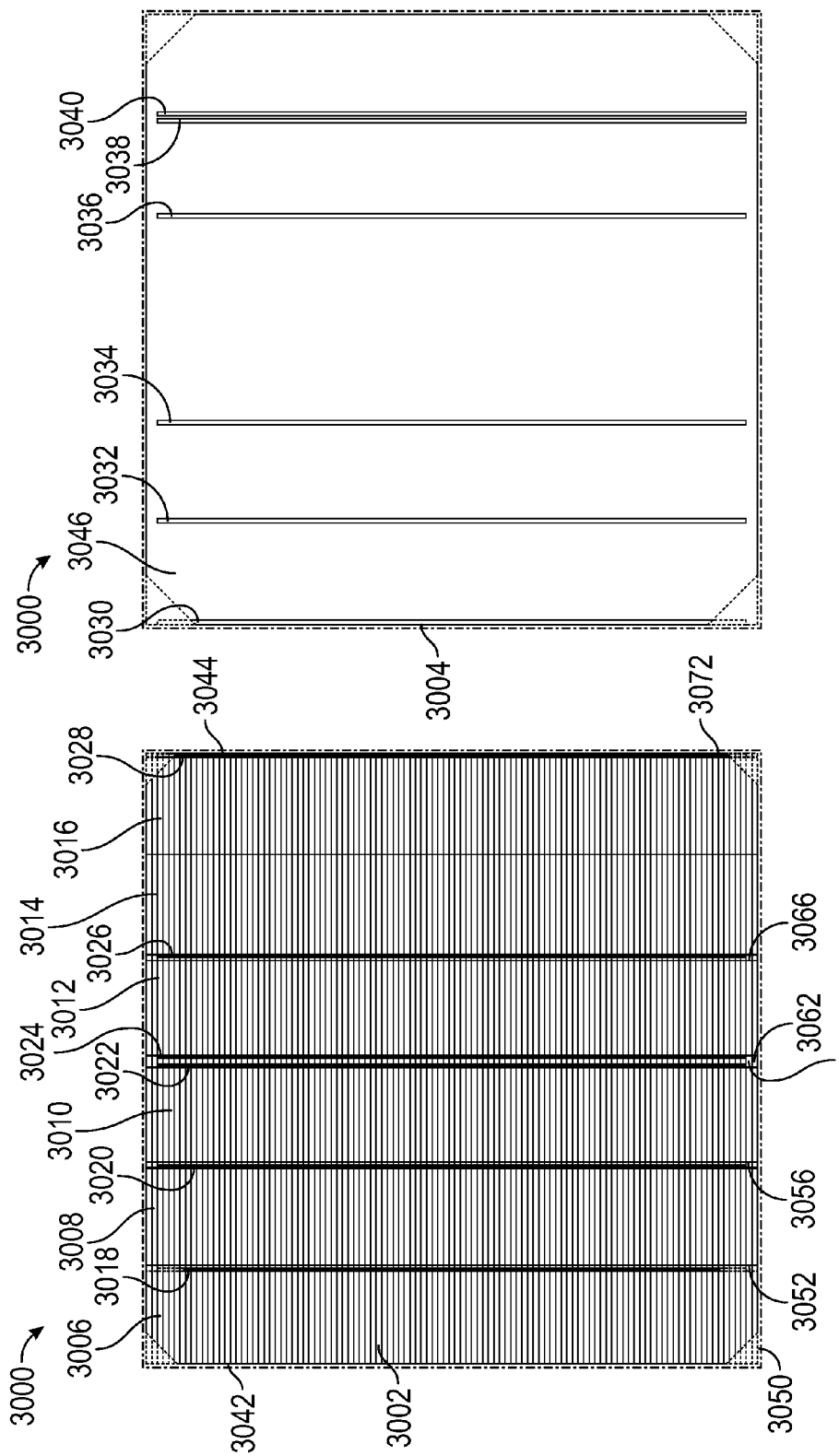

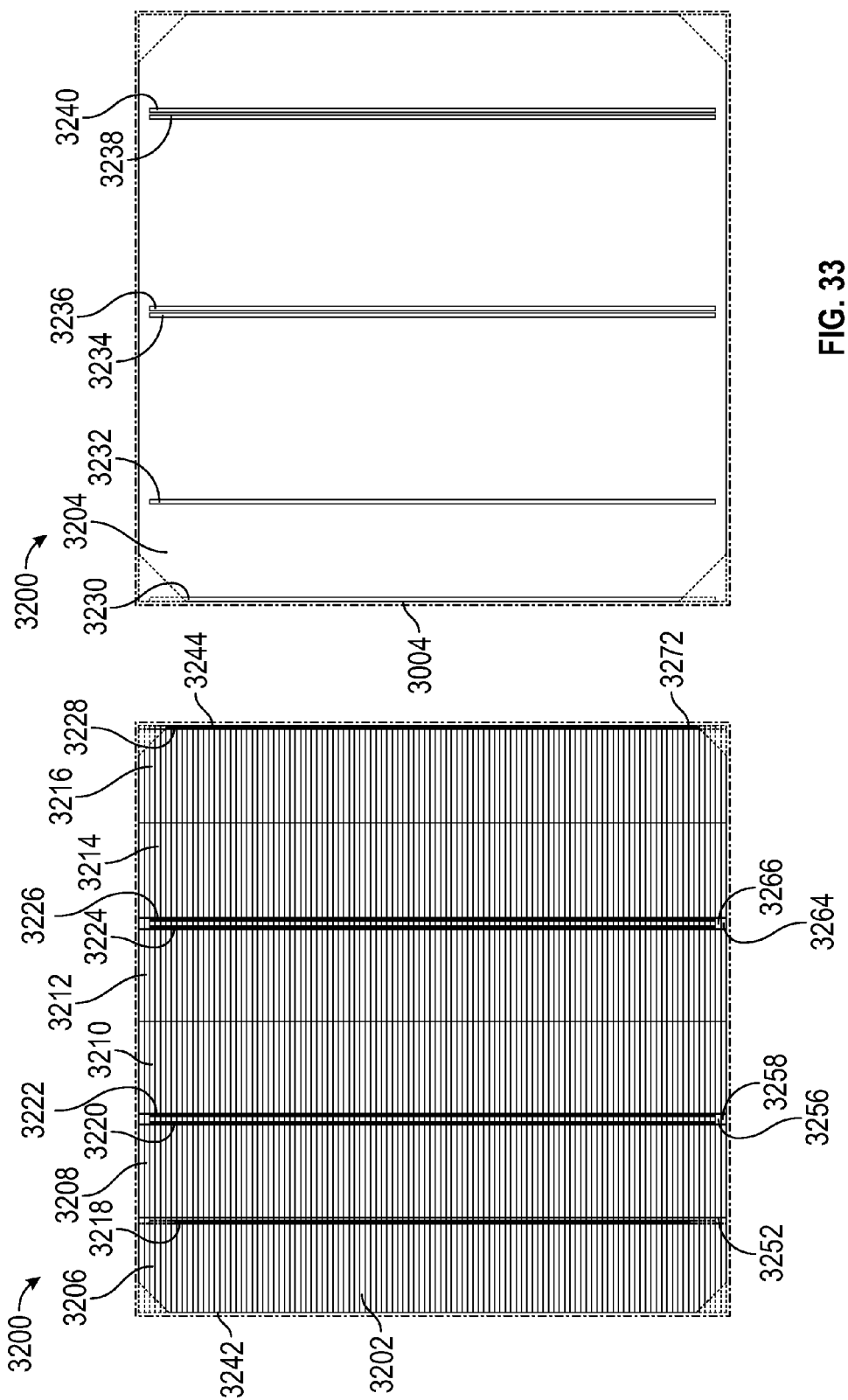

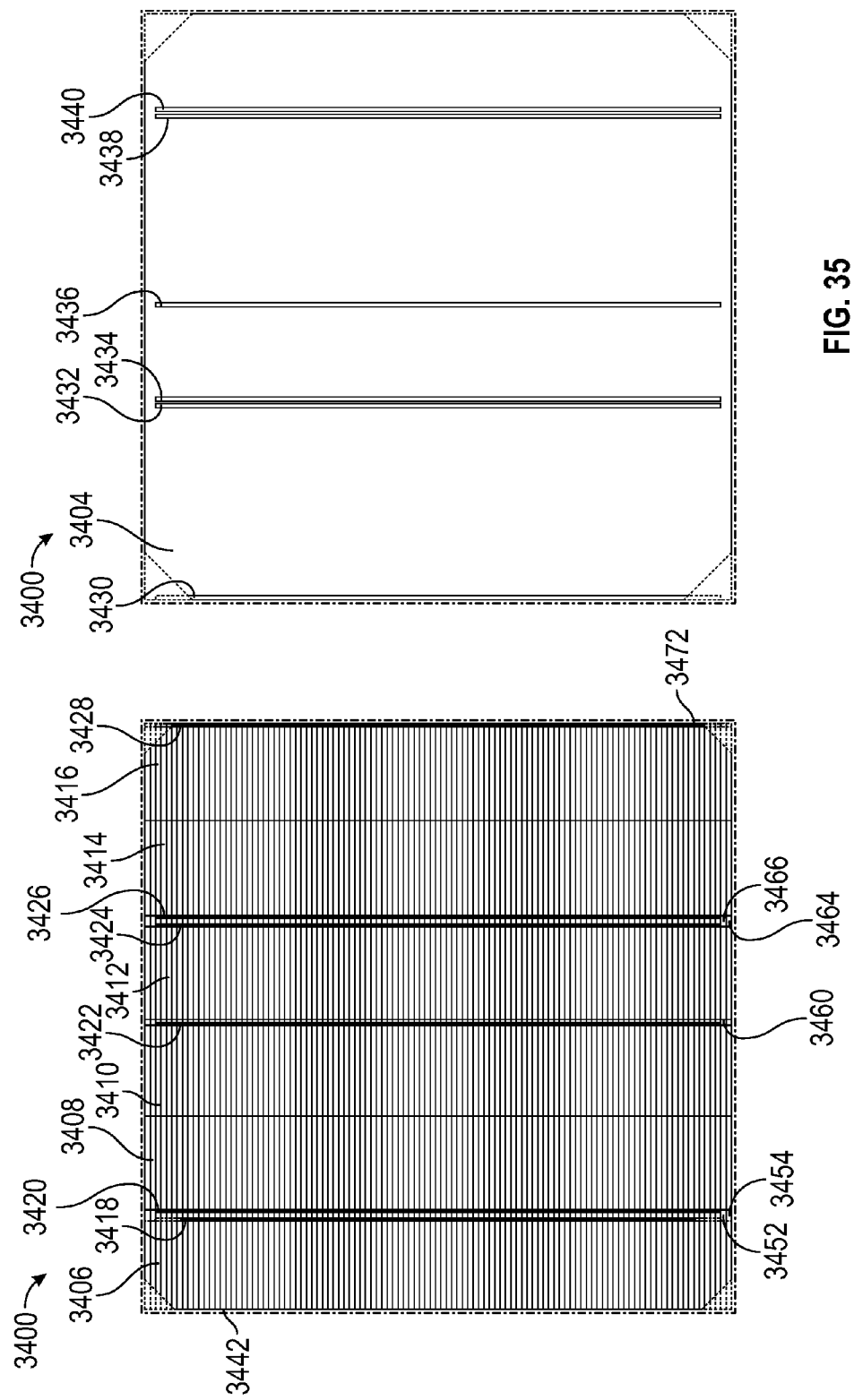

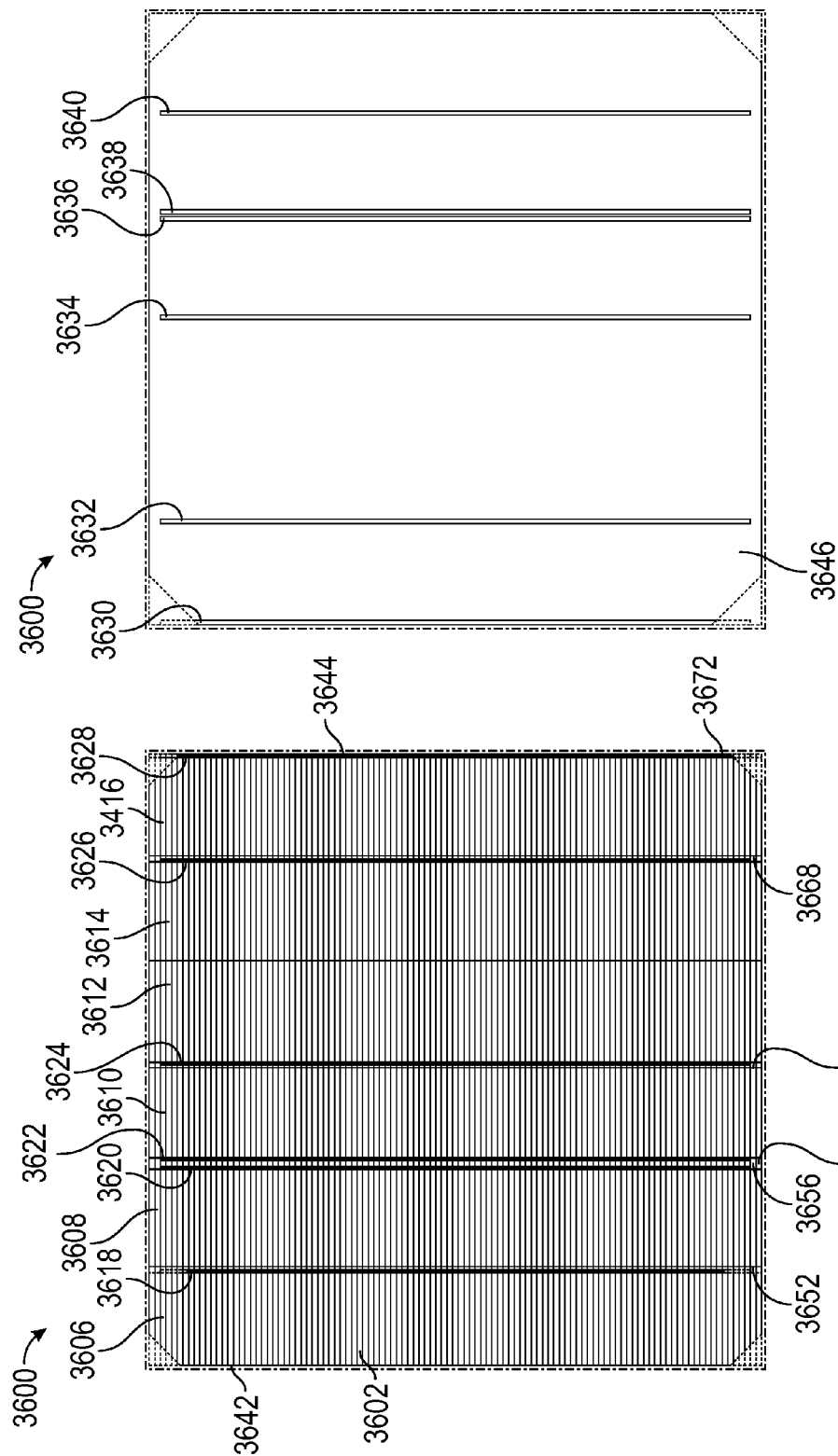

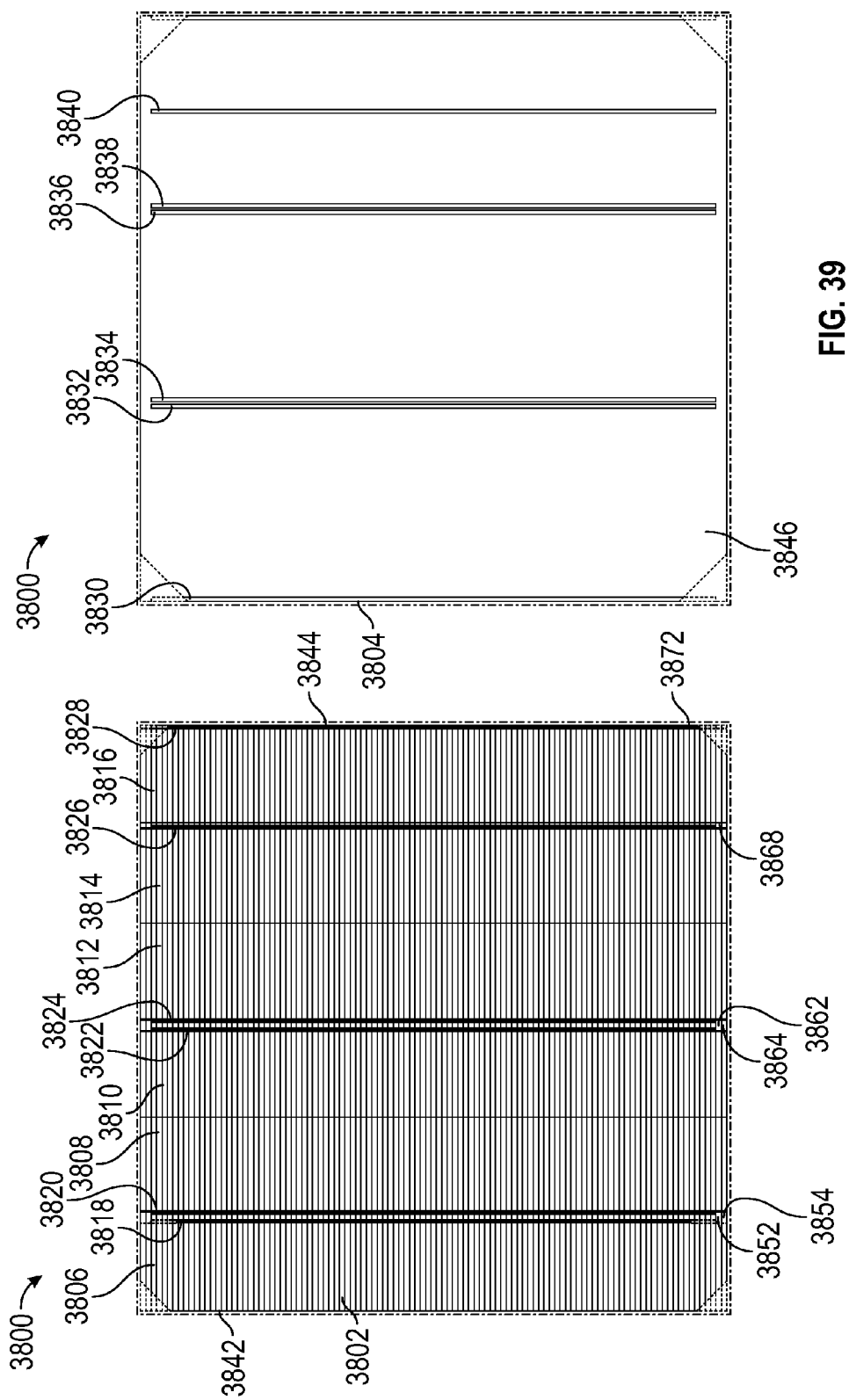

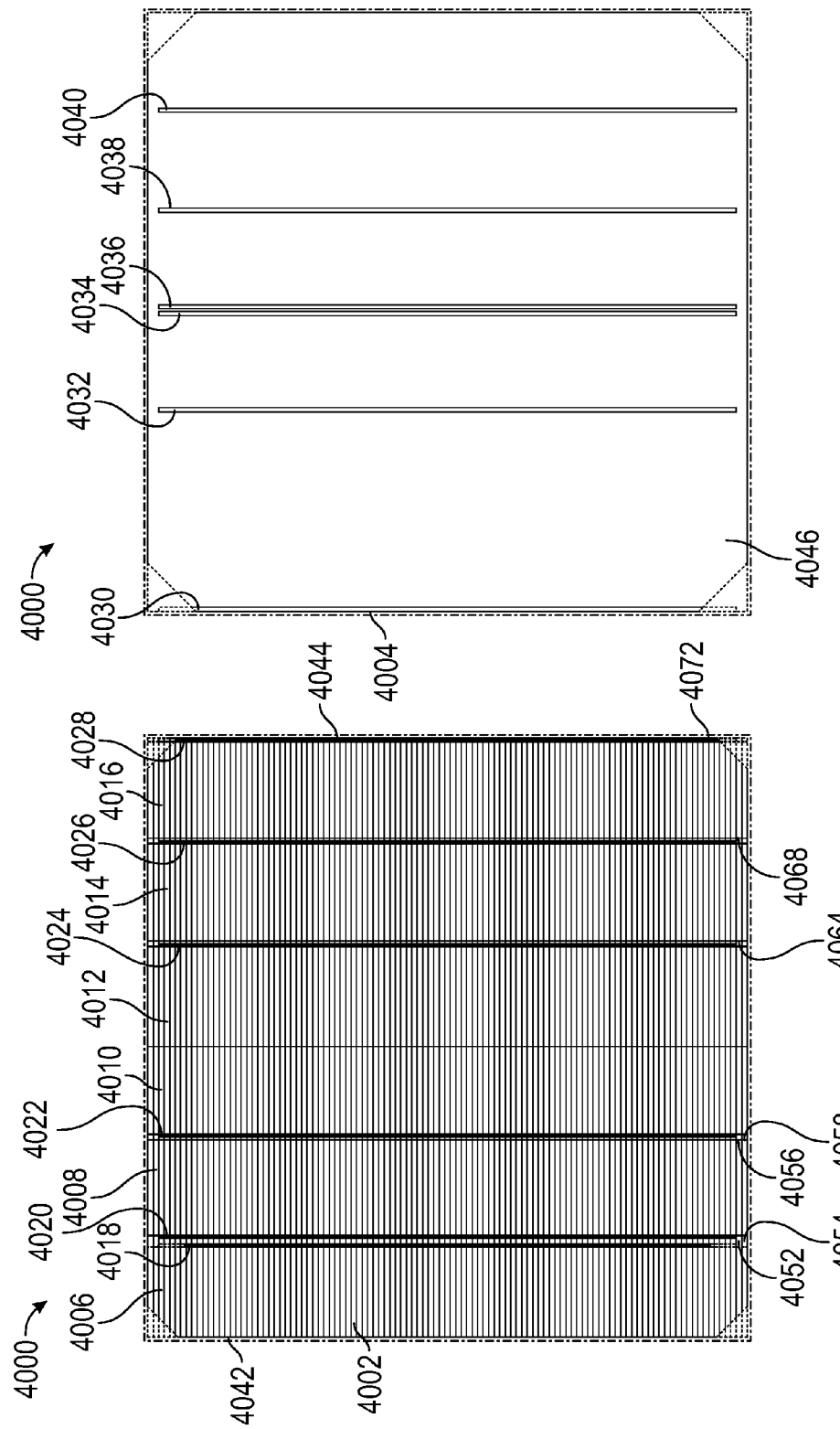

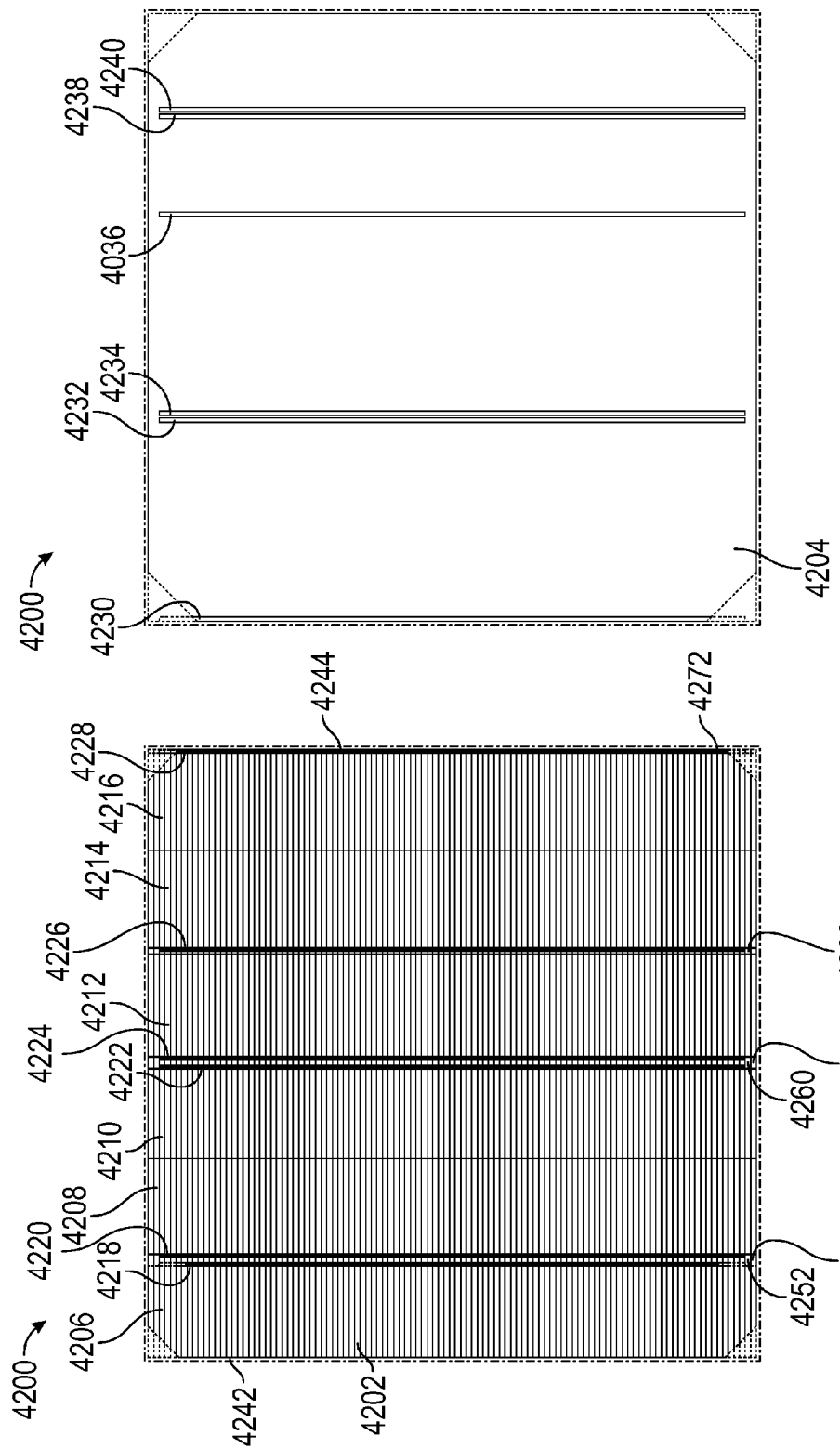

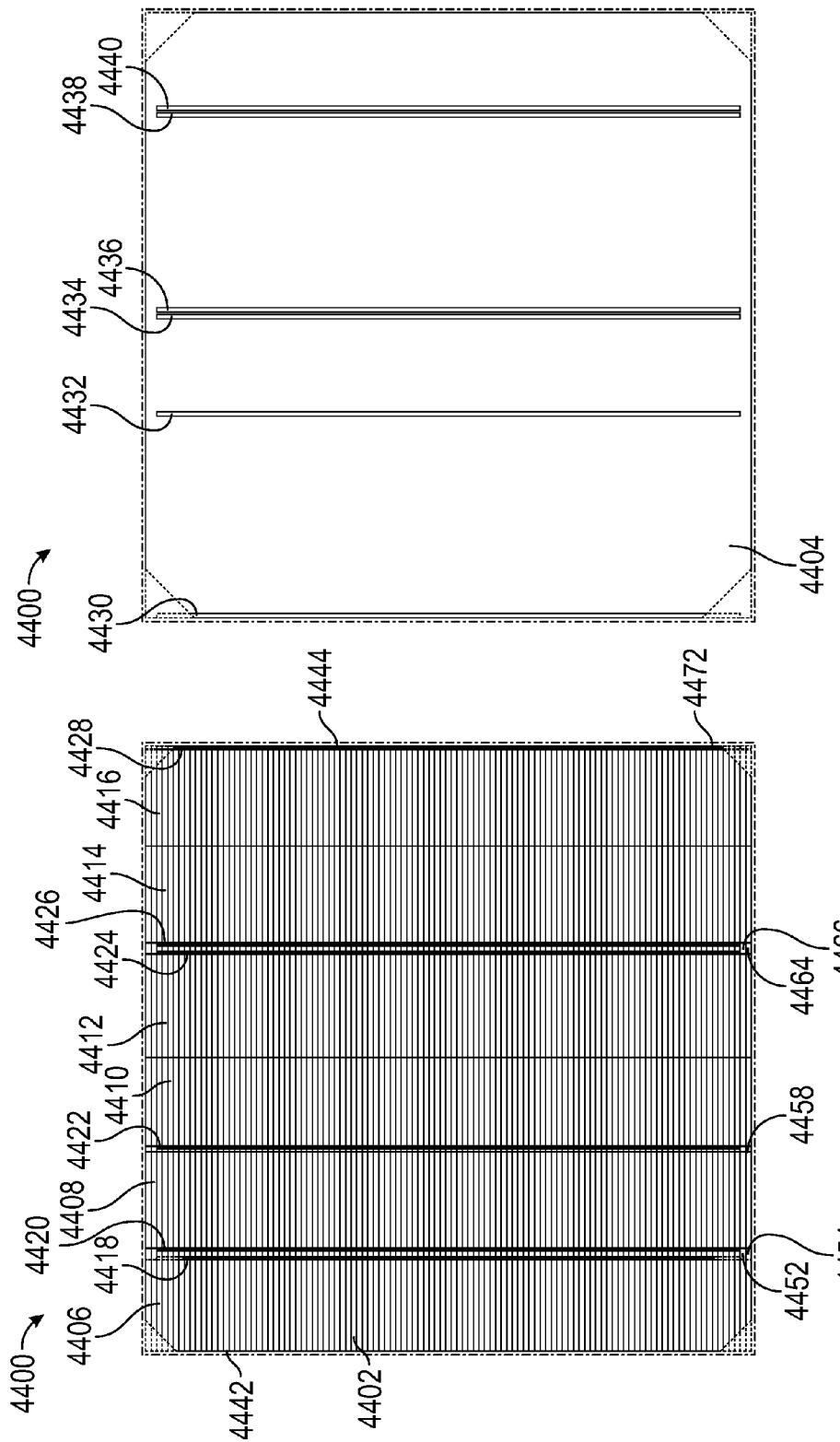

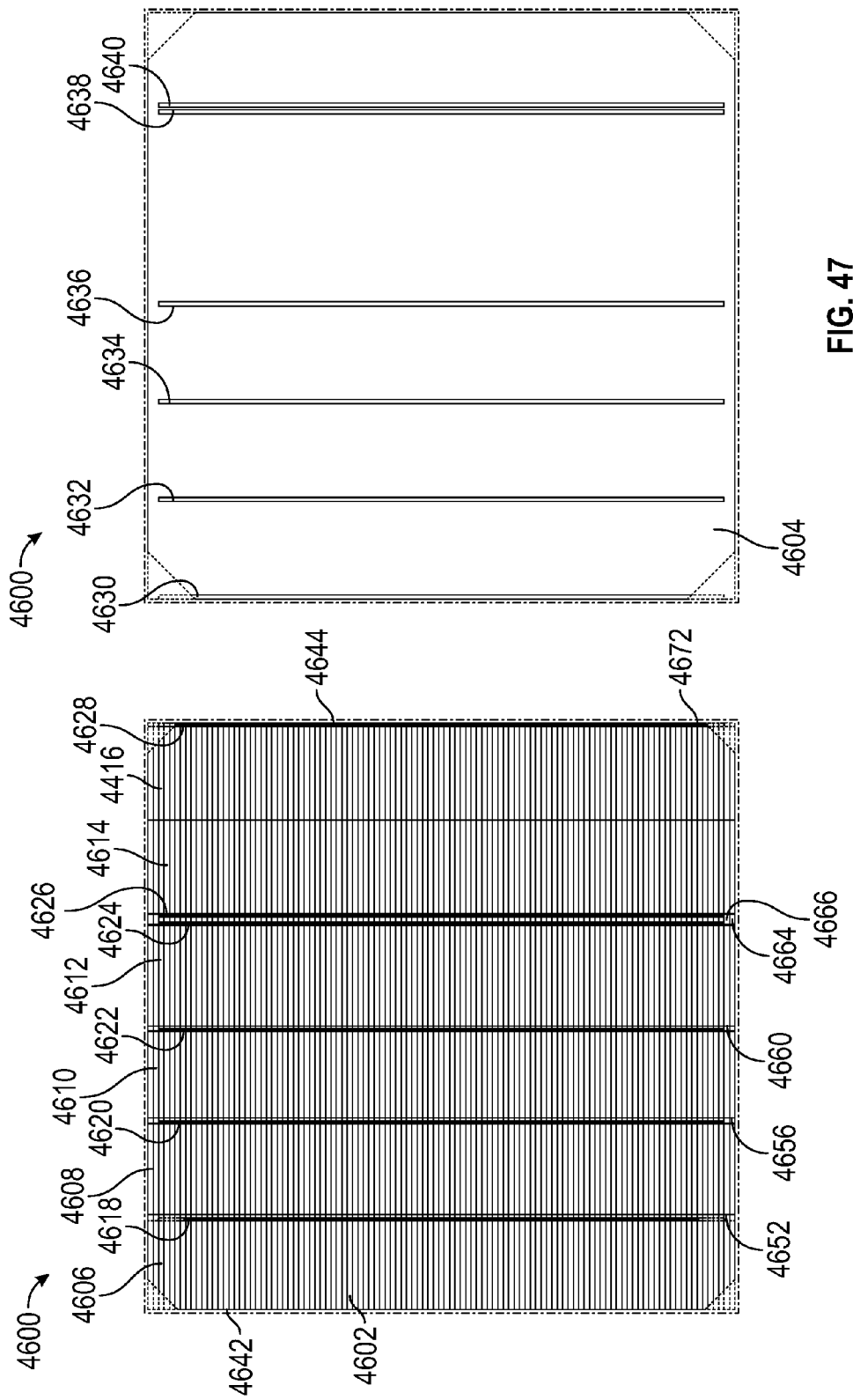

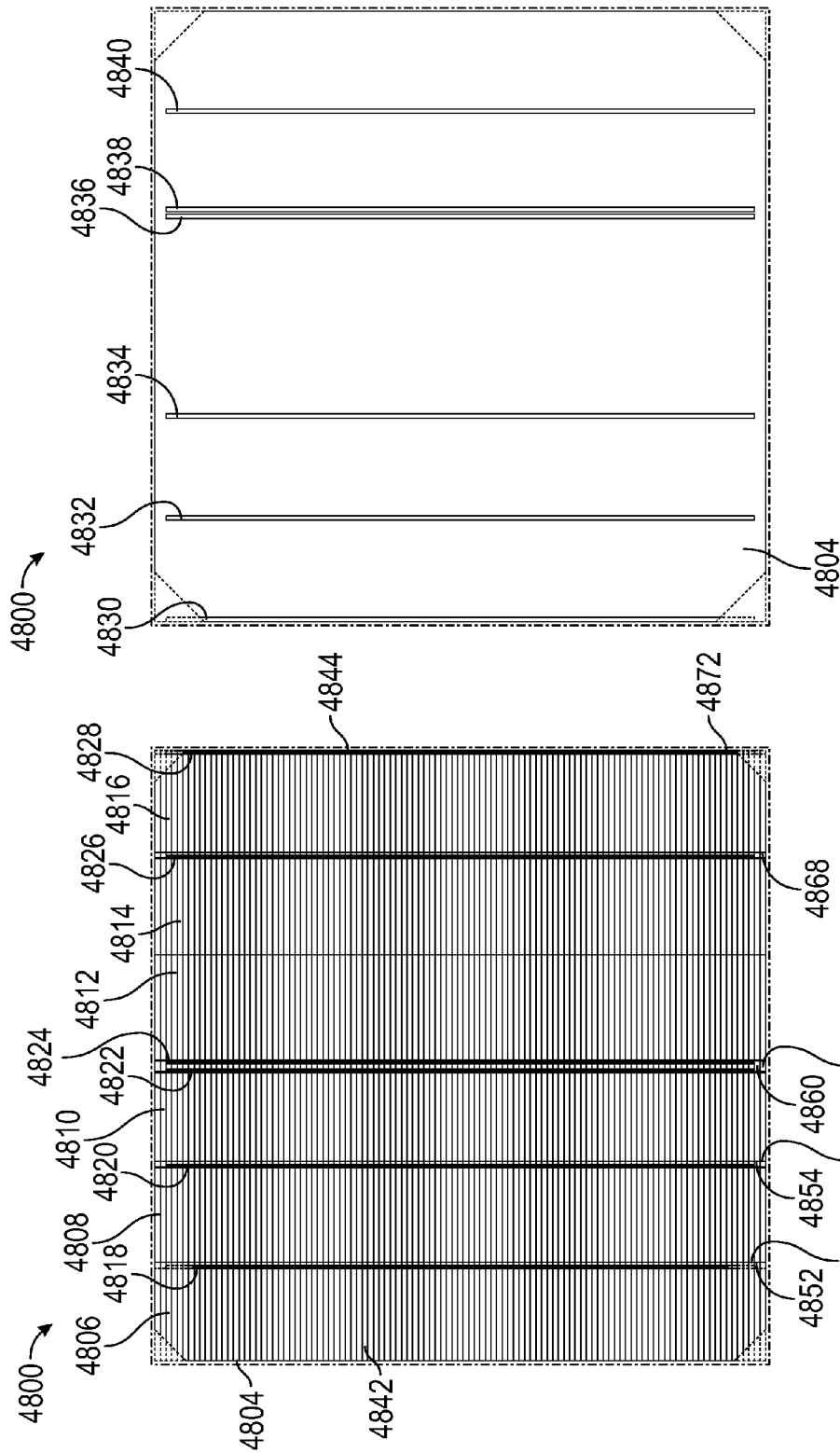

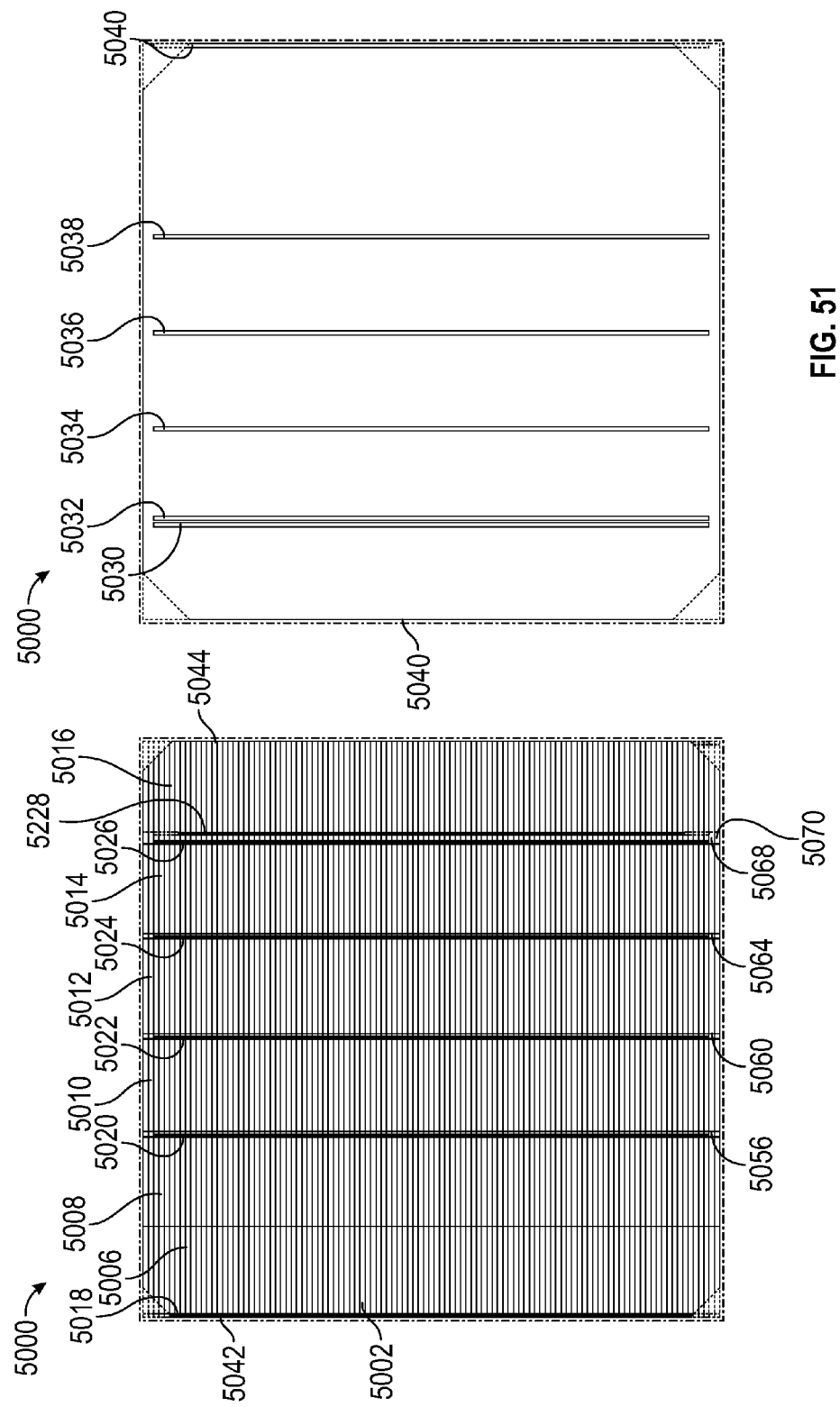

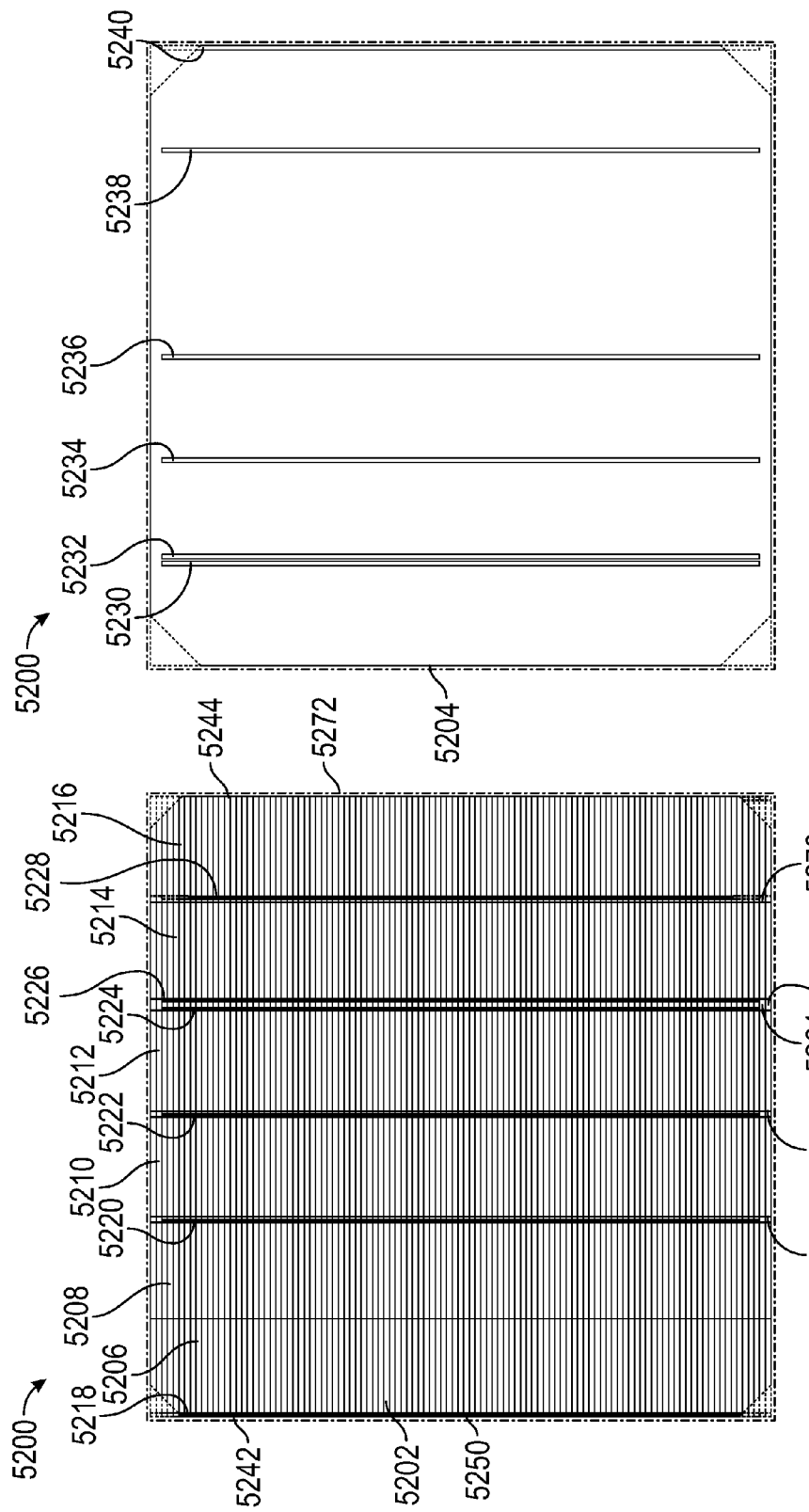

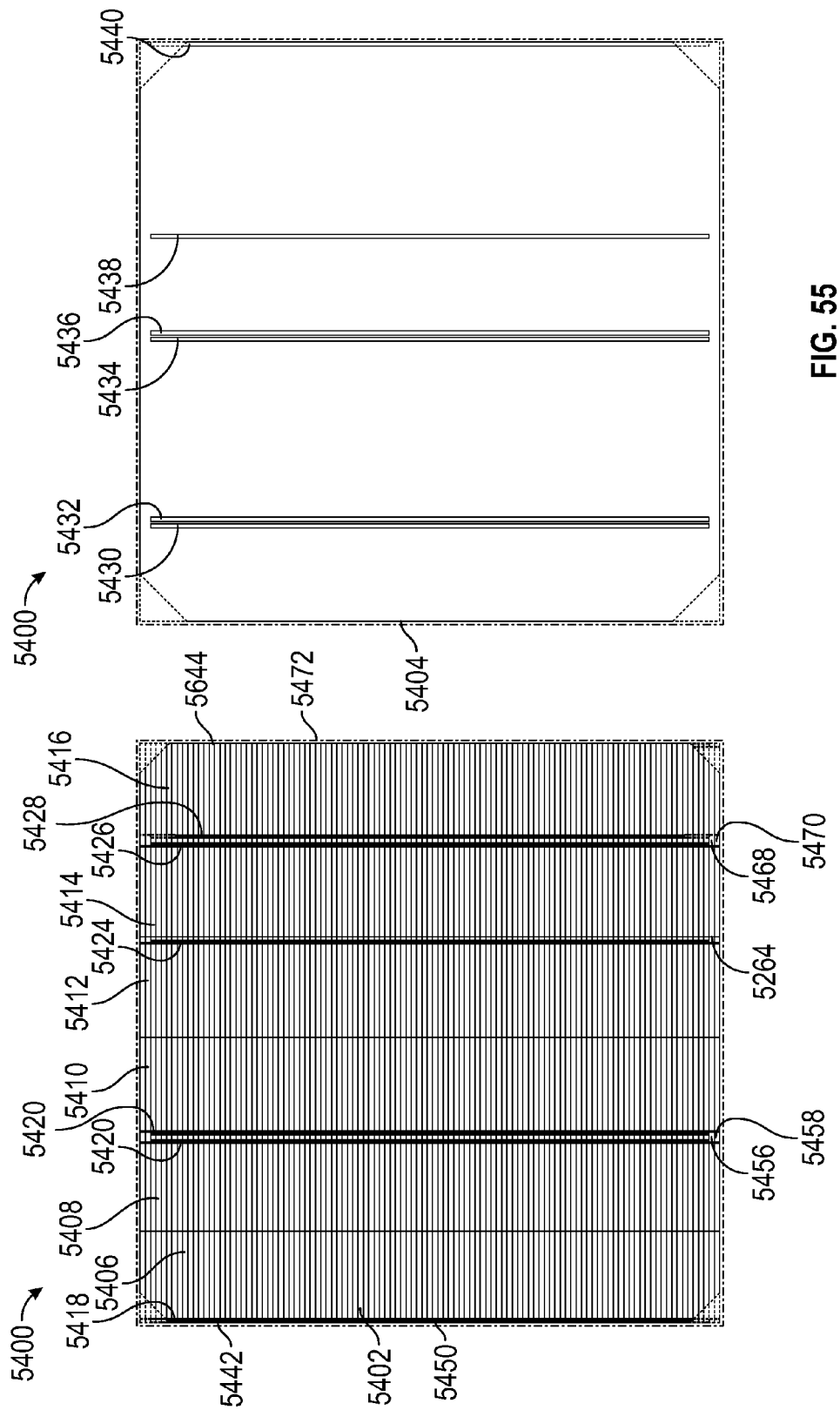

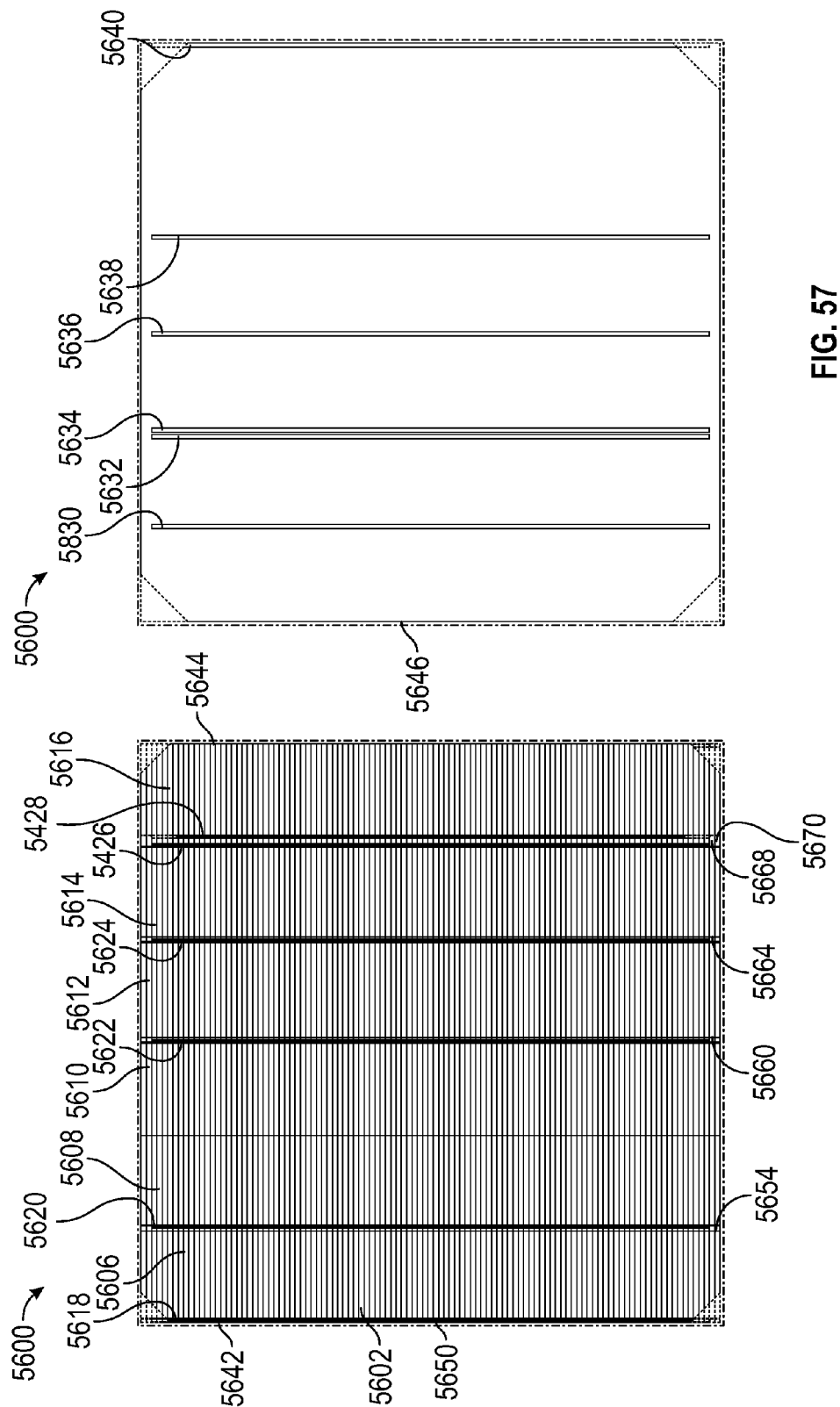

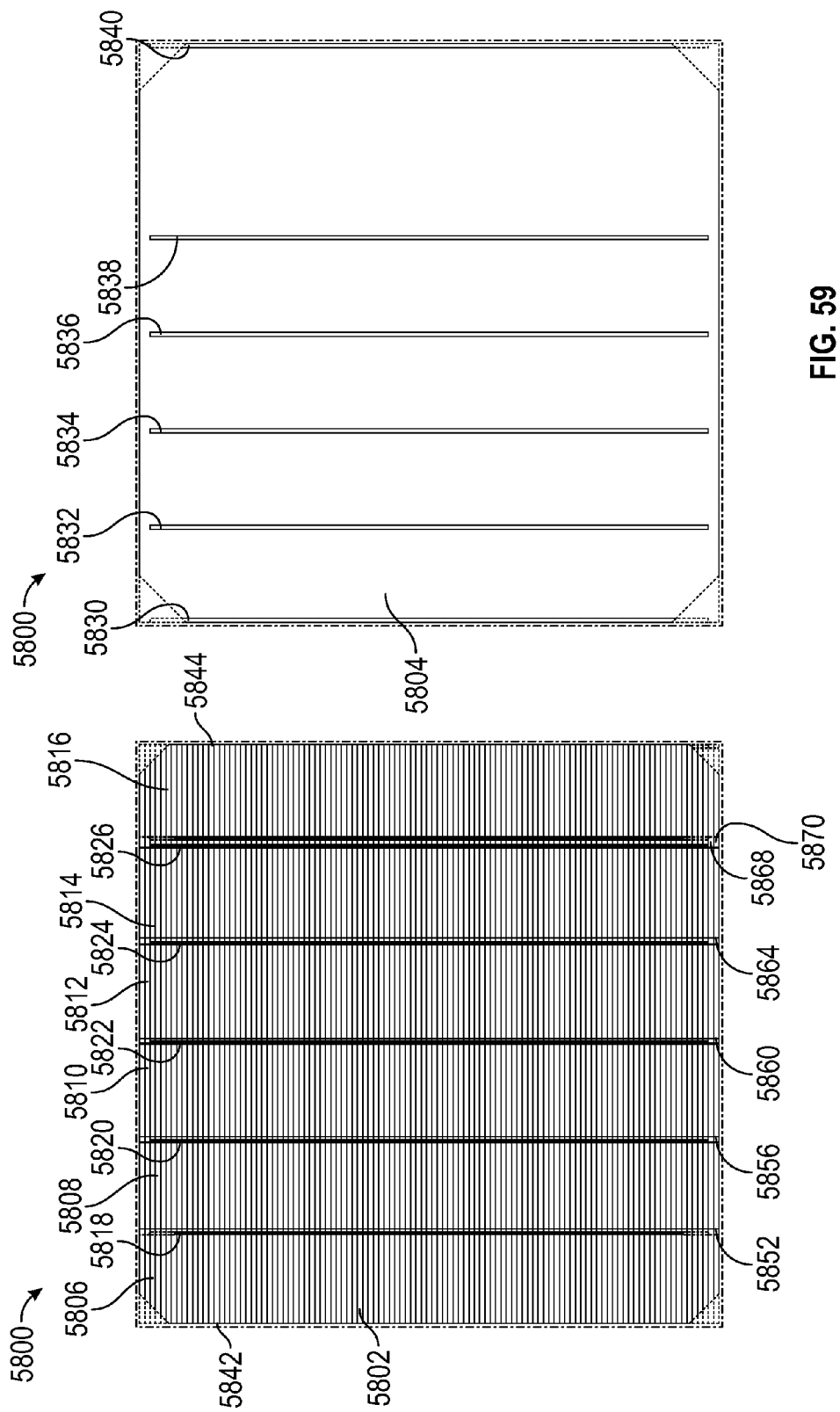

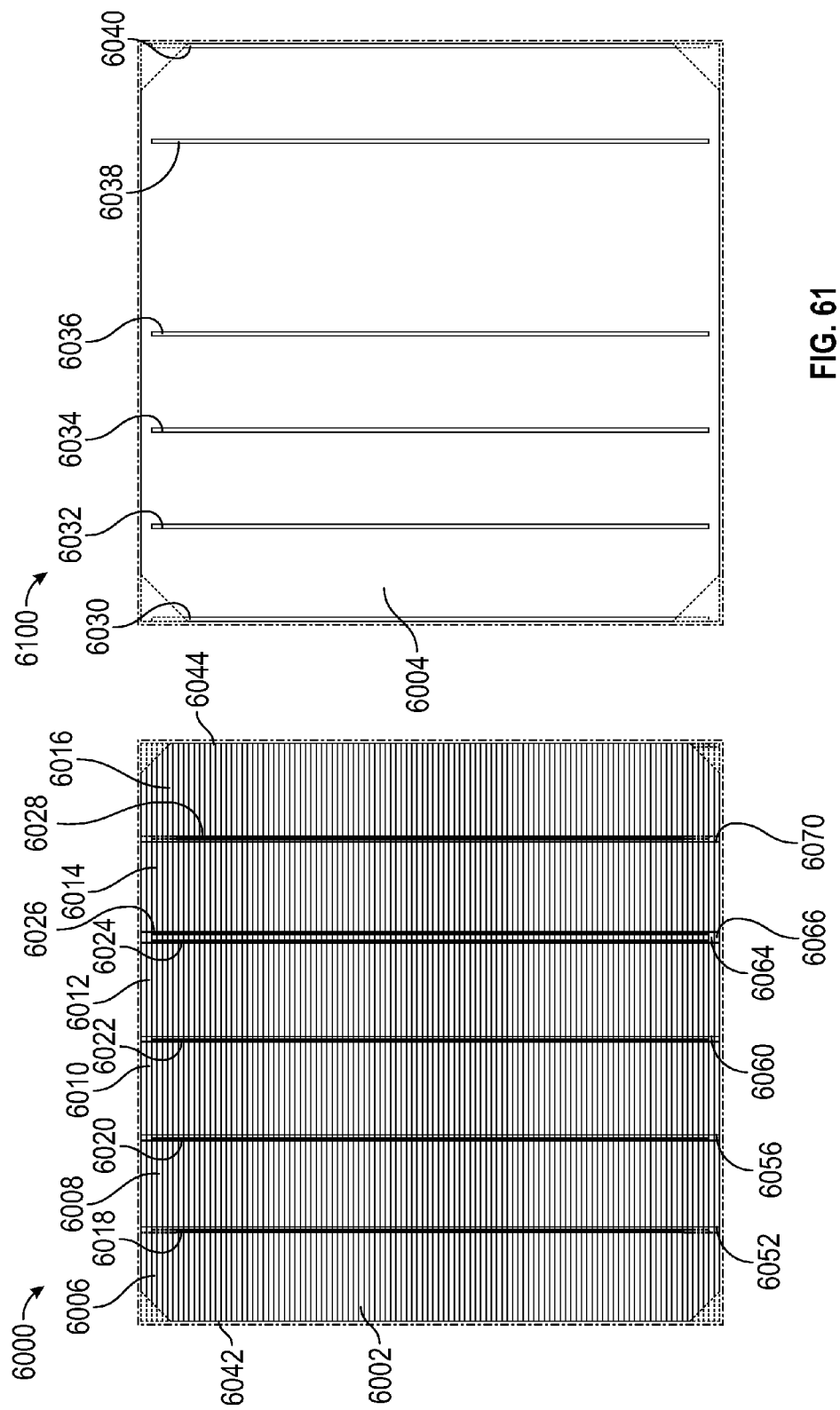

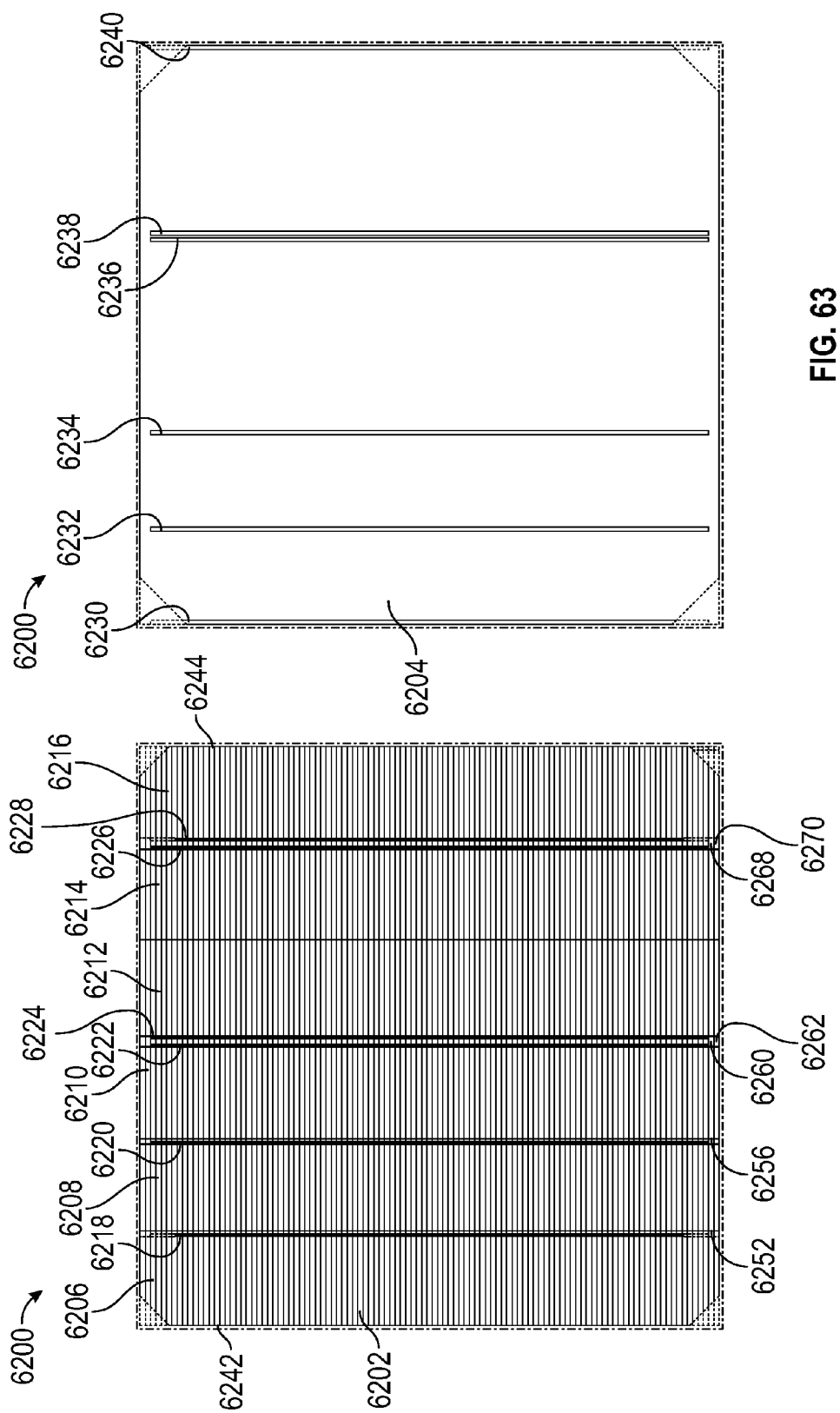

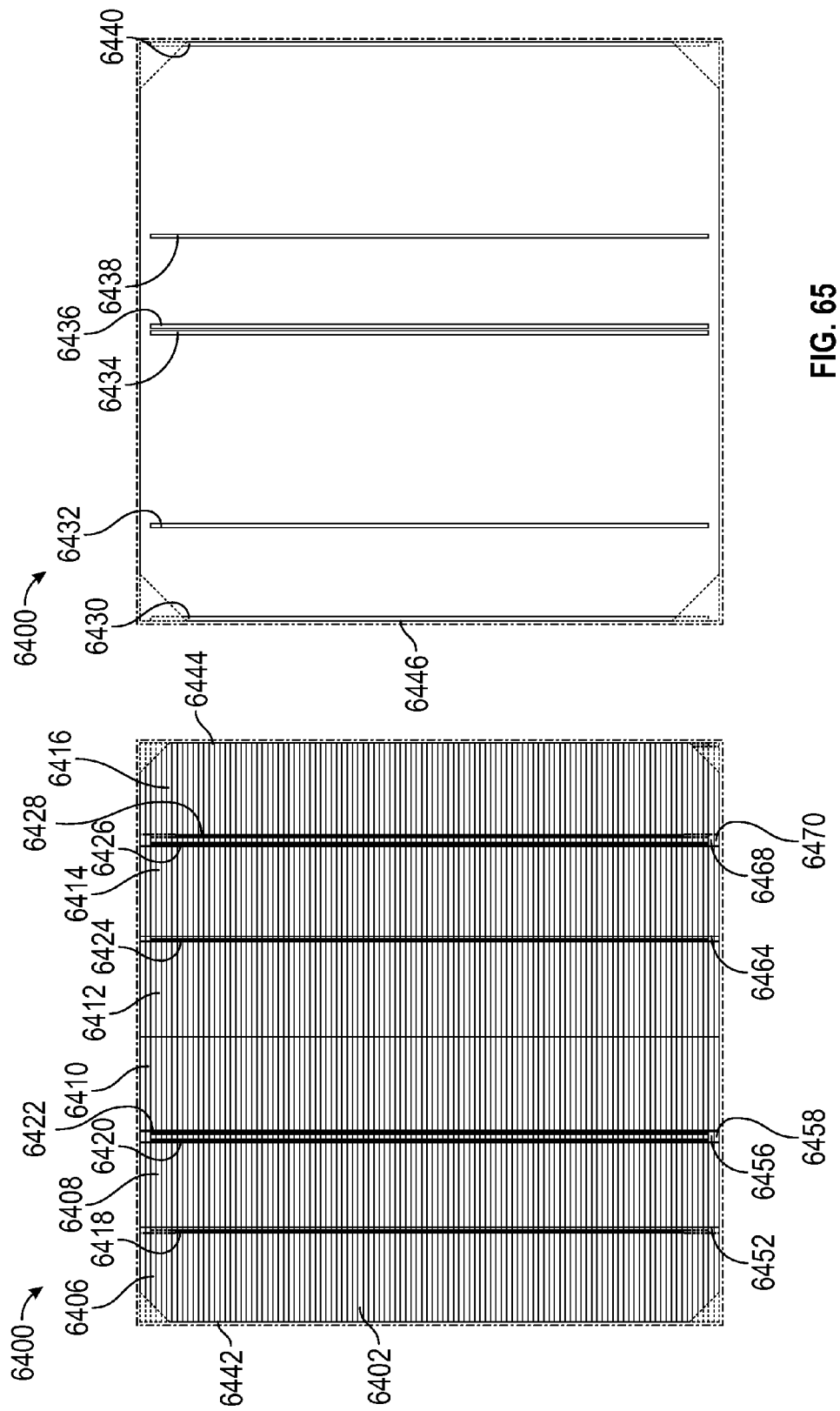

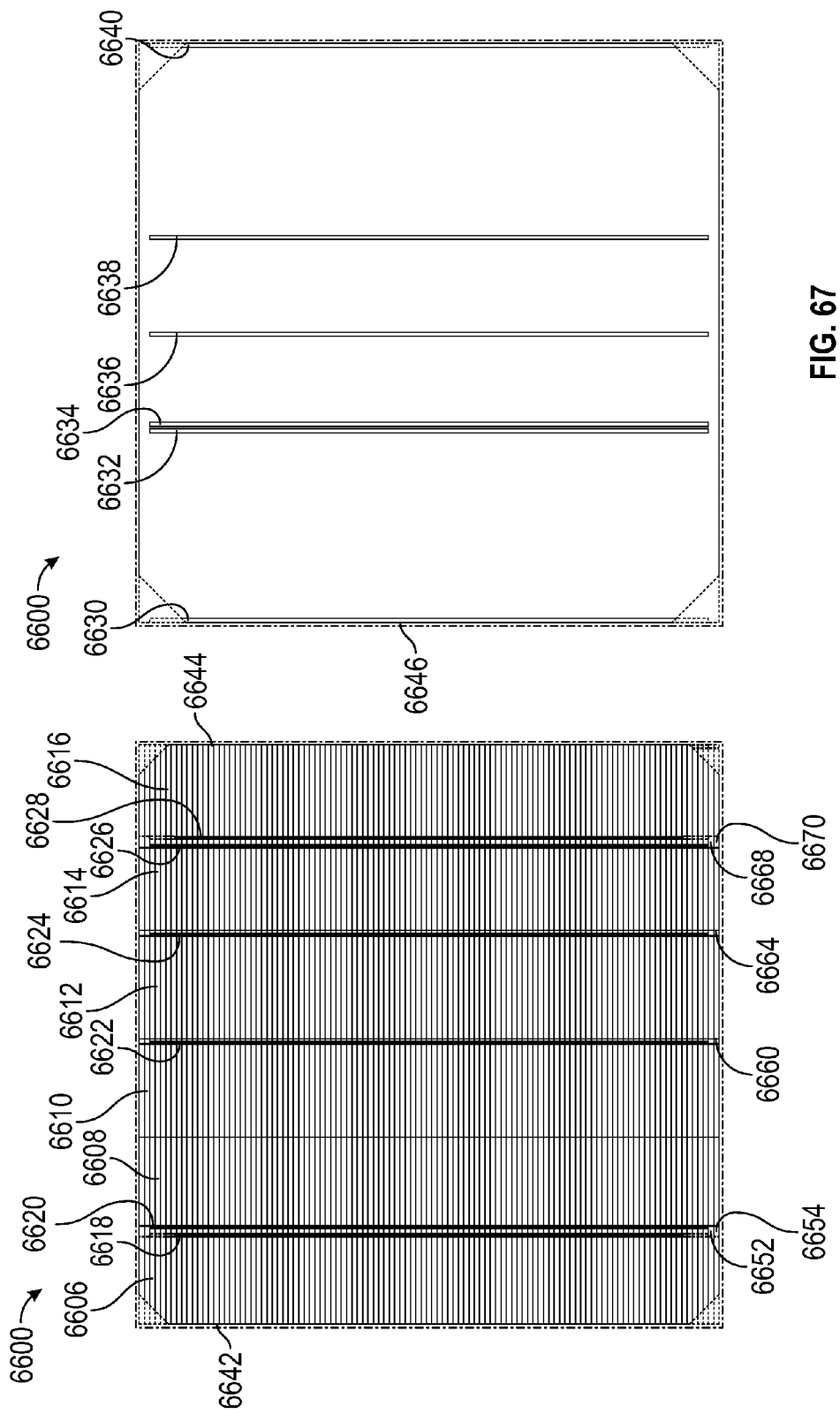

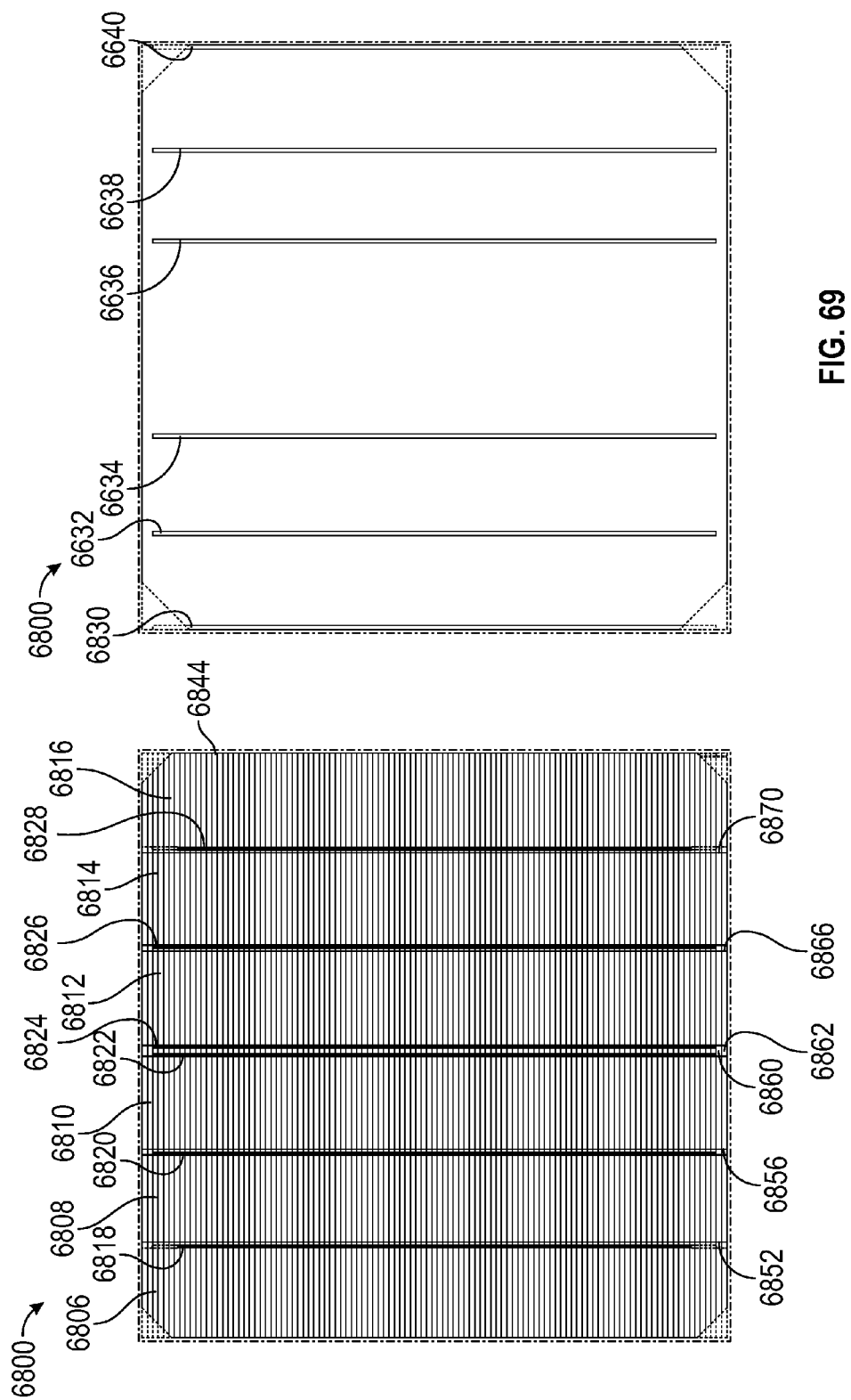

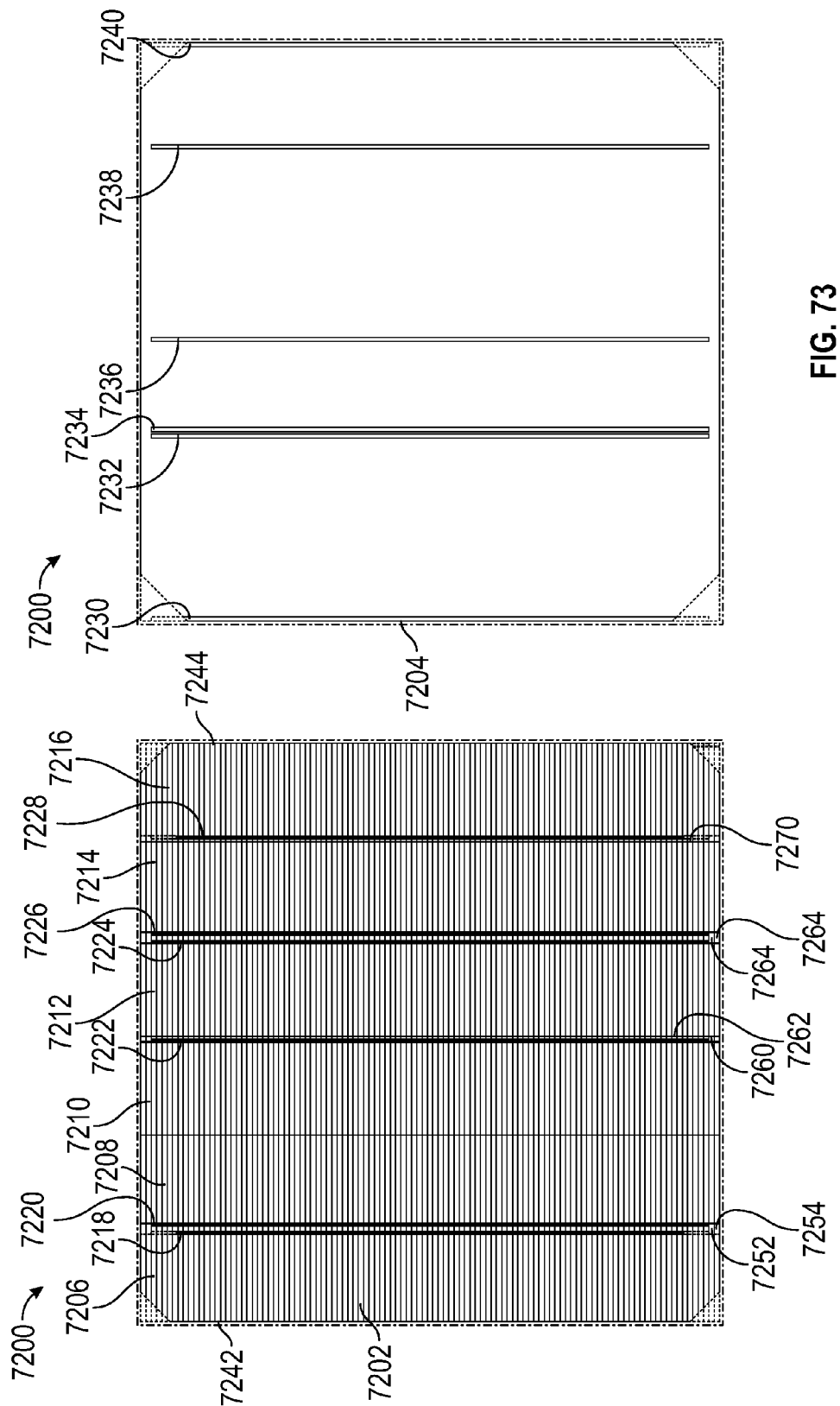

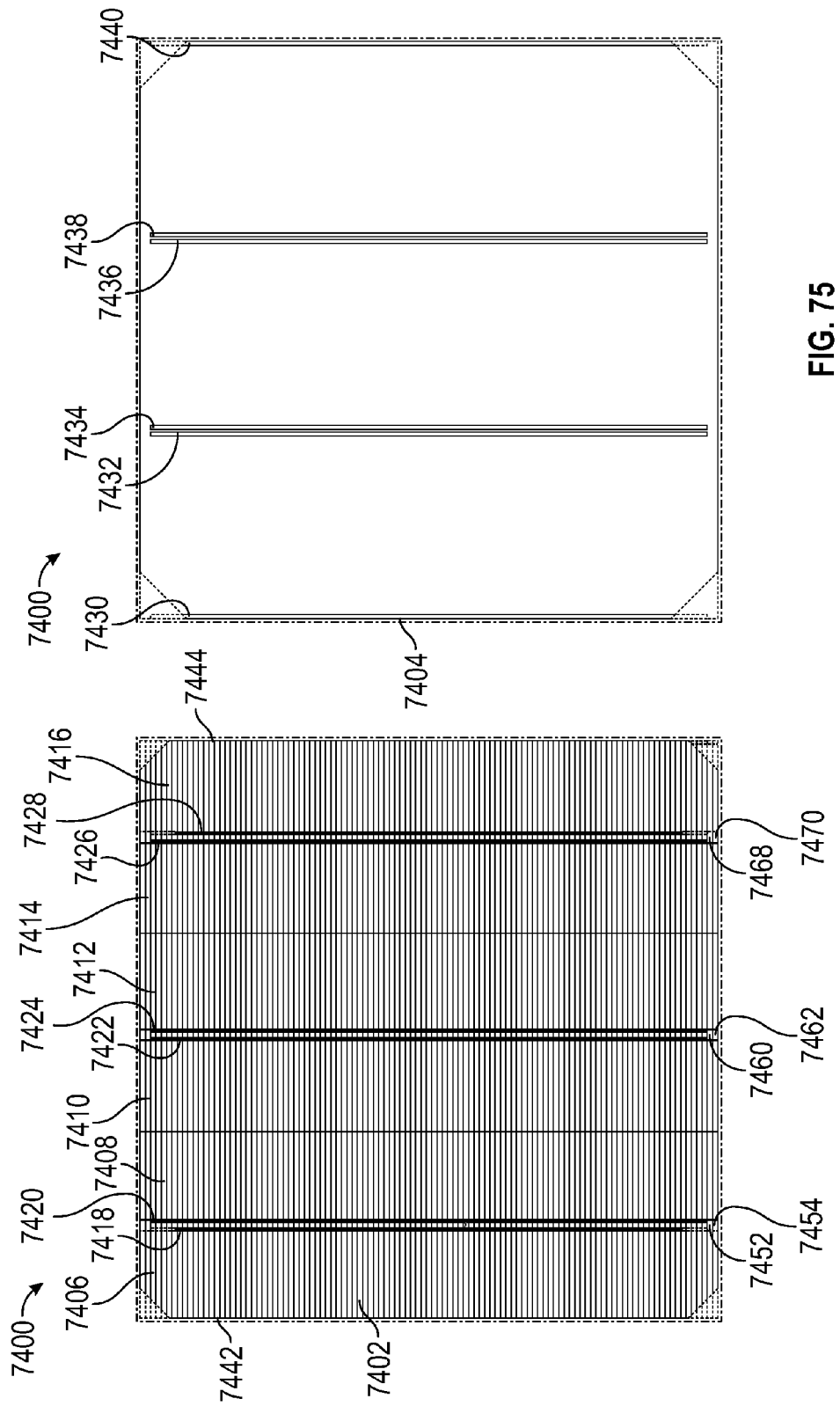

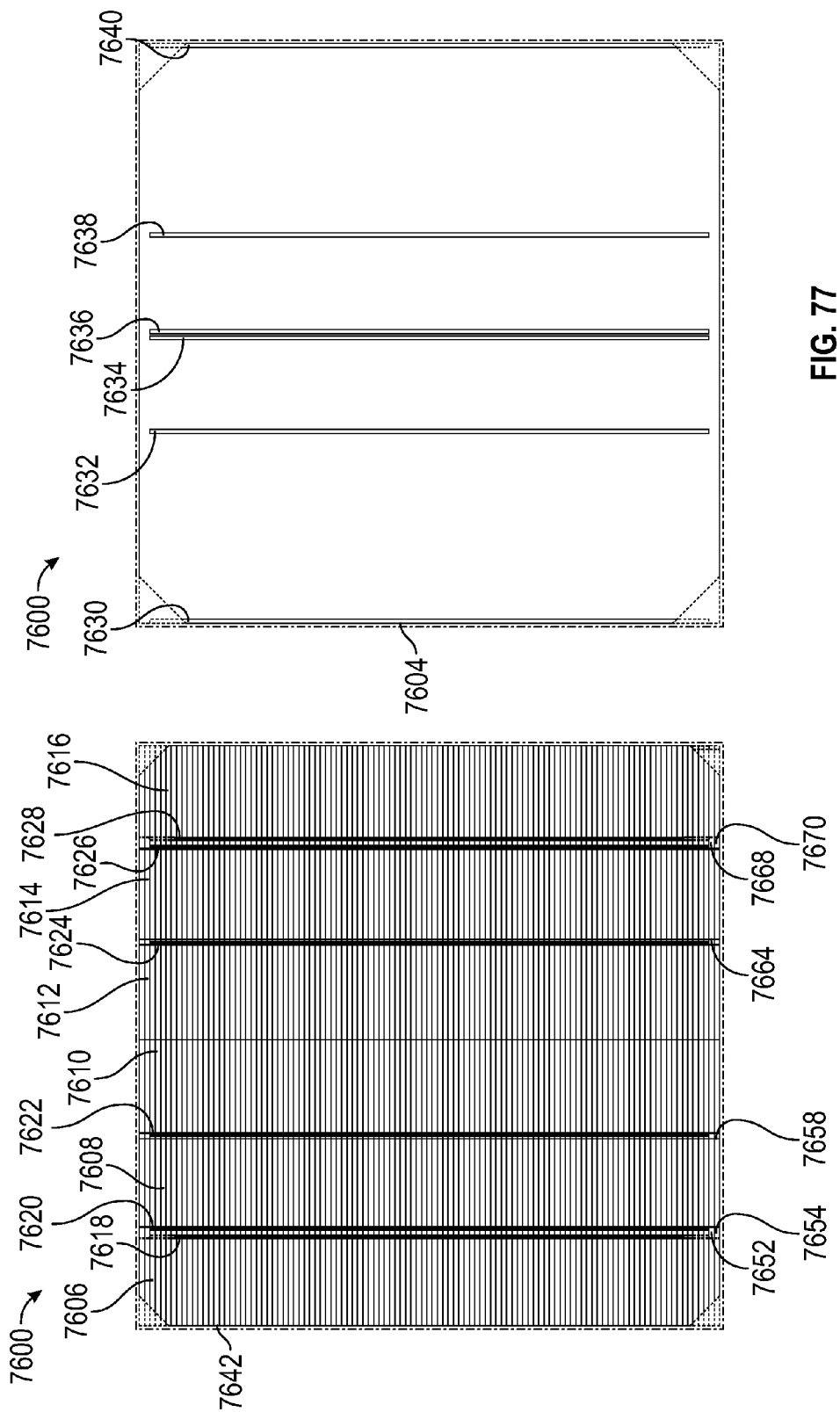

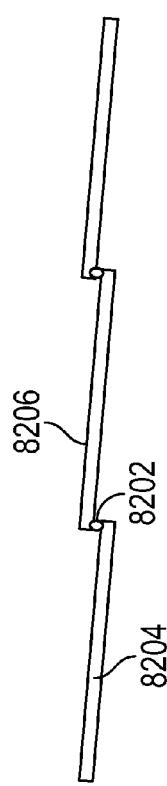
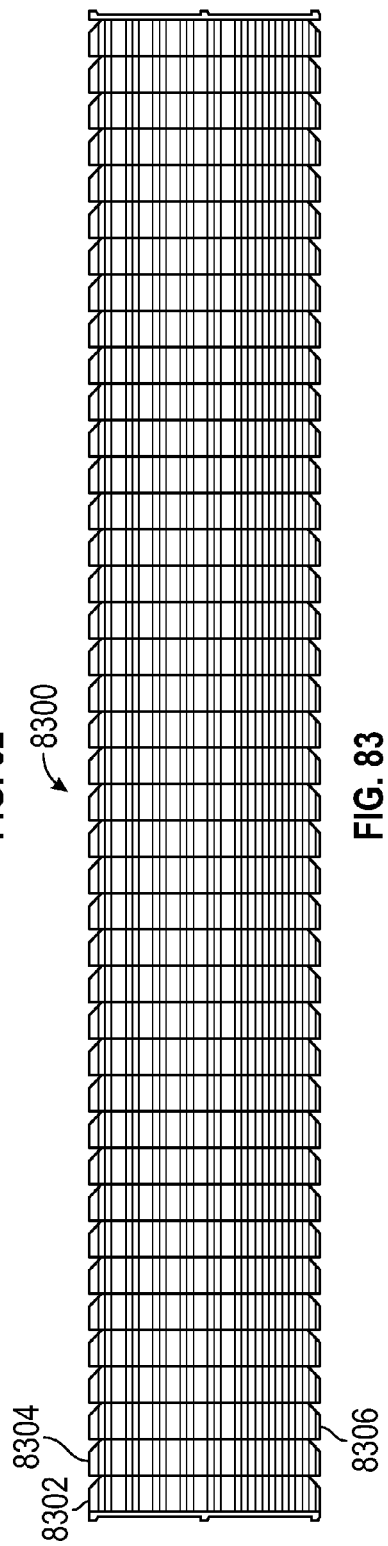
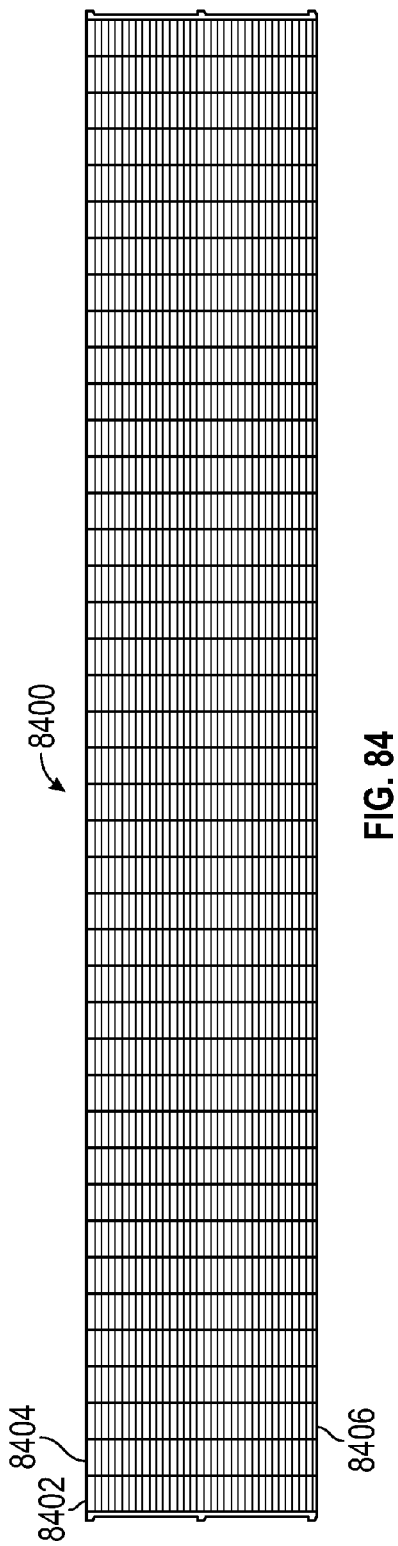

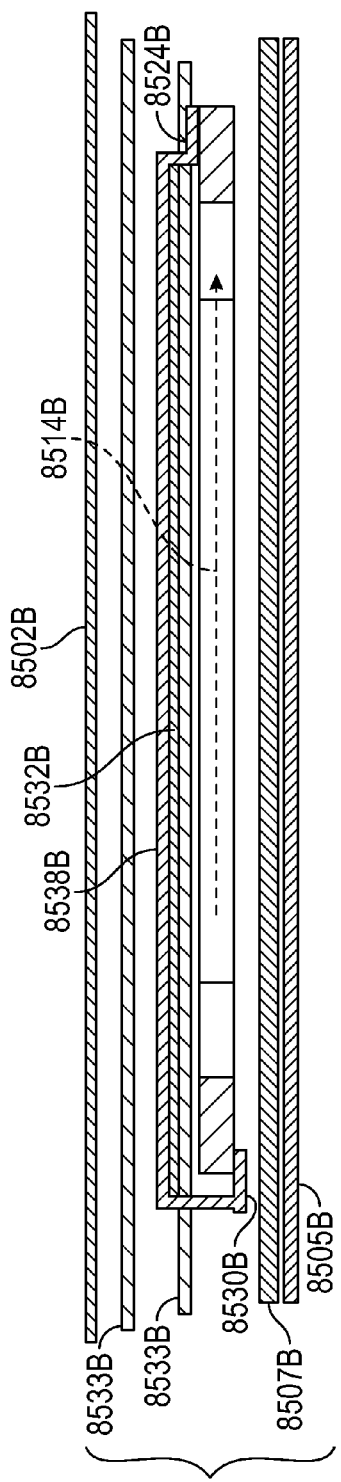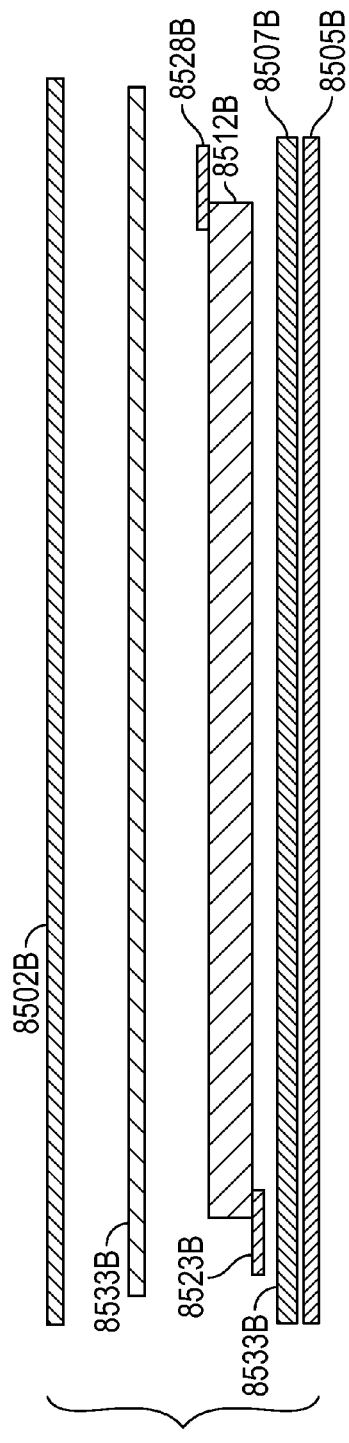
FIG. 96
FIG. 97

SHINGLED ARRAY SOLAR CELLS AND METHOD OF MANUFACTURING SOLAR MODULES INCLUDING THE SAME

TECHNICAL FIELD

The present disclosure relates to solar modules, and more particularly, to solar cells incorporated into shingled array module ("SAM"), which deliver a much higher module efficiency than conventional ribbon interconnected modules.

BACKGROUND

Over the past few years, the use of fossil fuels as an energy source has been trending downward. Many factors have contributed to this trend. For example, it has long been recognized that the use of fossil fuel-based energy options, such as oil, coal, and natural gas, produces gases and pollution may not be easily removed from the atmosphere. Additionally, as more fossil fuel-based energy is consumed, the more pollution is discharged into the atmosphere causing harmful effects on life close by. Despite these effects, fossil-fuel based energy options still are being depleted at a rapid pace, and as a result, the costs of some of these fossil fuel resources, such as oil, have risen. Further, as many of the fossil fuel reserves are located in politically unstable areas, the supply and costs of fossil fuels have been unpredictable.

Due in part to the many challenges presented by these traditional energy sources, the demand for alternative, clean energy sources has increased dramatically. To further encourage solar energy and other clean energy usage, some governments have provided incentives, in the form of monetary rebates or tax relief, consumers willing to switch from traditional energy sources to clean energy sources. In other instances, consumers have found that the long-term savings benefits of changing to clean energy sources have outweighed the relatively high upfront cost of implementing clean energy sources.

One form of clean energy, solar energy, has risen in popularity over the past few years. Advancements in semiconductor technology have allowed the designs of solar modules and solar panels to be more efficient and capable of greater output. Further, the materials for manufacturing solar modules and solar panels have become relatively inexpensive, which has contributed to the decrease in costs of solar energy. As solar energy has increasingly become an affordable clean energy option for individual consumers, solar module and panel manufacturers have made available products with aesthetic and utilitarian appeal for implementation on residential structures. As a result of these benefits, solar energy has gained widespread global popularity.

SUMMARY

Although solar module designs have made many advancements over the past few years, they may be improved. For example, solar cells from which the solar modules are manufactured are still using the symmetrical metallization patterns on front and rear surfaces per ribbon soldering interconnection requirements. Additionally, the manufacturing processes themselves can be optimized further to reduce optical and resistive losses.

The present disclosure addresses the aforementioned shortcomings. In an aspect of the present disclosure, a solar cell is provided that includes a substrate having a front side and a back side, a metallization pattern deposited on the front side of the substrate, the metallization pattern including a plurality of front side bus bars, each front side bus bar including fingers extending therefrom, and a plurality of back side bus bars deposited on the back side of the substrate. On the front side of the substrate, one front side bus bar of the plurality of front side bus bars is formed along an edge of the front side of the substrate, and a remainder of the front side bus bars of the plurality of front side bus bars are unequally spaced across the substrate. On the back side of the substrate, only one back side bus bar of the plurality of back side bus bars is formed along an edge of the back side of the substrate, and a remainder of the back side bus bars of the plurality of back side bus bars are unequally spaced across the substrate.

In another aspect of the present disclosure, the remainder of the front side bus bars of the plurality of front include two front side bus bars that are adjacent each other.

In another aspect of the present disclosure, each front side bus bar of the plurality of front side bus bars includes finger lines extending therefrom and two sets of the finger lines point towards each other. In still another aspect of the present disclosure, one of the two sets of finger lines extends from the one front side bus bar formed along the edge of the front side of the substrate. Alternatively, in an aspect of the present disclosure, neither of the two sets of finger lines extends from the one front side bus bar formed along the edge of the front side of the substrate.

In another aspect of the present disclosure, each front side bus bar of the plurality of front side bus bars includes finger lines extending therefrom, a first set of the finger lines point toward each other, and a second set of the finger lines point toward each other.

In another aspect of the present disclosure, the solar cell includes five discrete sections, each section including one front side bus bar and one back side bus bar.

In another aspect of the present disclosure, the solar cell includes six discrete sections, each section including one front side bus bar and one back side bus bar.

In another aspect of the present disclosure, the solar cell is dividable into a plurality of strips, each strip is of substantially equal width, and each strip has a front side bus bar on an edge opposite from an edge on which a back side bus bar is formed.

In another aspect of the present disclosure, the solar cell is dividable into a plurality of strips, each strip is of substantially equal area, and each strip has a front side bus bar on an edge opposite from an edge on which a back side bus bar is formed.

In accordance with another aspect of the present disclosure, a method is provided of forming a solar cell. The method includes depositing a metallization pattern on a front side of a substrate, the metallization pattern including a plurality of front side bus bars, each front side bus bar including fingers extending therefrom, and depositing a plurality of back side bus bars on a back side of the substrate. On the front side of the substrate, one front side bus bar of the plurality of front side bus bars is formed along an edge of the front side of the substrate, and a remainder of the front side bus bars of the plurality of front side bus bars are unequally spaced across the substrate. On the back side of the substrate, only one back side bus bar of the plurality of back side bus bars is formed along an edge of the back side of the substrate, and a remainder of the back side bus bars of the plurality of back side bus bars are unequally spaced across the substrate.

In another aspect of the present disclosure, the remainder of the front side bus bars of the plurality of front include two front side bus bars that are adjacent each other.

In another aspect of the present disclosure, each front side bus bar of the plurality of front side bus bars includes finger lines extending therefrom and two sets of the finger lines point towards each other. In still another aspect of the present disclosure, one of the two sets of finger lines extends from the one front side bus bar formed along the edge of the front side of the substrate. In still yet another aspect of the present disclosure, neither of the two sets of finger lines extends from the one front side bus bar formed along the edge of the front side of the substrate.

In another aspect of the present disclosure, each front side bus bar of the plurality of front side bus bars includes finger lines extending therefrom, a first set of the finger lines point toward each other, and a second set of the finger lines point toward each other.

In another aspect of the present disclosure, the method also includes forming scribe lines into the solar cell to define five discrete sections, each section including one front side bus bar and one back side bus bar.

In another aspect of the present disclosure, the method also includes forming scribe lines into the solar cell to define six discrete sections, each section including one front side bus bar and one back side bus bar.

In another aspect of the present disclosure, the solar cell is dividable into a plurality of strips, each strip is of substantially equal width, and each strip has a front side bus bar on an edge opposite from an edge on which a back side bus bar is formed.

In another aspect of the present disclosure, the solar cell is dividable into a plurality of strips, each strip is of substantially equal area, and each strip has a front side bus bar on an edge opposite from an edge on which a back side bus bar is formed.

According to still yet another aspect of the present disclosure, a solar cell is provided including a substrate having a front side and a back side, a metallization pattern deposited on the front side of the substrate, the metallization pattern including a plurality of front side bus bars, each front side bus bar including fingers extending therefrom, and a plurality of back side bus bars deposited on the back side of the substrate. On the front side of the substrate, no front side bus bar of the plurality of front side bus bars is formed along an edge of the front side of the substrate, and the plurality of front side bus bars are unequally spaced across the substrate. On the back side of the substrate, two back side bus bars of the plurality of back side bus bars are each formed along a corresponding edge of the back side of the substrate, and a remainder of the back side bus bars of the plurality of back side bus bars are unequally spaced across the substrate.

In another aspect of the present disclosure, the remainder of the front side bus bars of the plurality of front include two front side bus bars that are adjacent each other.

In another aspect of the present disclosure, each front side bus bar of the plurality of front side bus bars includes finger lines extending therefrom and two sets of the finger lines point towards each other. In still another aspect of the present disclosure, one of the two sets of finger lines extends from the one front side bus bar formed along the edge of the front side of the substrate. In still another aspect of the present disclosure, neither of the two sets of finger lines extends from the one front side bus bar formed along the edge of the front side of the substrate.

In another aspect of the present disclosure, each front side bus bar of the plurality of front side bus bars includes finger lines extending therefrom, a first set of the finger lines point toward each other, and a second set of the finger lines point toward each other.

In another aspect of the present disclosure, the solar cell includes five discrete sections, each section including one front side bus bar and one back side bus bar.

In another aspect of the present disclosure, the solar cell includes six discrete sections, each section including one front side bus bar and one back side bus bar.

In another aspect of the present disclosure, the solar cell is dividable into a plurality of strips, each strip is of substantially equal width, and each strip has a front side bus bar on an edge opposite from an edge on which a back side bus bar is formed.

In another aspect of the present disclosure, the solar cell is dividable into a plurality of strips, each strip is of substantially equal area, and each strip has a front side bus bar on an edge opposite from an edge on which a back side bus bar is formed.

According to still yet another aspect of the present disclosure, a method of forming a solar cell is provided. The method includes depositing a metallization pattern on the front side of the substrate, the metallization pattern including a plurality of front side bus bars, each front side bus bar including fingers extending therefrom, and depositing a plurality of back side bus bars on the back side of the substrate. On the front side of the substrate, no front side bus bar of the plurality of front side bus bars is formed along an edge of the front side of the substrate, and the plurality of front side bus bars are unevenly spaced apart from each other across the substrate. On the back side of the substrate, two back side bus bars of the plurality of back side bus bars are each formed along a corresponding edge of the back side of the substrate, and a remainder of the back side bus bars of the plurality of back side bus bars are unequally spaced across the substrate.

In another aspect of the present disclosure, the remainder of the front side bus bars of the plurality of front include two front side bus bars that are adjacent each other.

In another aspect of the present disclosure, each front side bus bar of the plurality of front side bus bars includes finger lines extending therefrom and two sets of the finger lines point towards each other. According to another aspect of the present disclosure, one of the two sets of finger lines extends from the one front side bus bar formed along the edge of the front side of the substrate. According to still another aspect of the present disclosure, neither of the two sets of finger lines extends from the one front side bus bar formed along the edge of the front side of the substrate.

In another aspect of the present disclosure, each front side bus bar of the plurality of front side bus bars includes finger lines extending therefrom, a first set of the finger lines point toward each other, and a second set of the finger lines point toward each other.

In another aspect of the present disclosure, the method also includes forming scribe lines into the solar cell to define five discrete sections, each section including one front side bus bar and one back side bus bar.

In another aspect of the present disclosure, the method also includes forming scribe lines into the solar cell to define six discrete sections, each section including one front side bus bar and one back side bus bar.

In another aspect of the present disclosure, upon cleaving the solar cell into a plurality of strips, each strip is of substantially equal width and each strip has a front side bus bar on an edge opposite from an edge on which a back side bus bar is formed.

In another aspect of the present disclosure, upon cleaving the solar cell into a plurality of strips, each strip is of substantially equal are and each strip has a front side bus bar on an edge opposite from an edge on which a back side bus bar is formed.

Further details and aspects of exemplary embodiments of the present disclosure are described in more detail below with reference to the appended figures.

BRIEF DESCRIPTION OF THE DRAWINGS

Various aspects of the present disclosure are described hereinbelow with reference to the drawings, which are incorporated in and constitute a part of this specification, wherein:

FIG. 1 is a front side plan view of a solar cell, according to an embodiment;

FIG. 2 is a back side plan view of the solar cell of FIG. 1, according to an embodiment;

FIGS. 4-23 are simplified front side and back side views of five strip solar cells, according to various embodiments;

FIGS. 24-77 are simplified front side and back side views of six strip solar cells, according to various embodiments;

FIG. 82 is a simplified schematic of a step of the method depicted in FIG. 78 during which strips of the solar cell are formed into a string, according to an embodiment;

FIG. 83 is a front side view of a string of solar cell strips having chamfered corners, according to an embodiment;

FIG. 84 is a front side view of a string of solar cell strips having non-chamfered corners including end connectors soldered or conductively connected to bus bars on the first and last strips of each string, according to an embodiment;

FIG. 96 is a cross section view of the solar module illustrated in FIG. 95 taken along line B-B; and FIG. 97 is a cross section view of the solar module illustrated in FIG. 95 taken along line C-C.

DETAILED DESCRIPTION

Unique solar cell designs are included that, when incorporated into solar modules, provide improved efficiency and energy output and reduce costs. The solar cell designs take advantage of special metallization patterns formed on the solar cells, which inherently allow lower leakage current to thereby boost cell performance and permit a manufacturer to set up solar cell testing equipment to measure the efficiency of shingled array solar cells more accurately. This testing setup can lead to reduced time and expense during manufacture. Additionally, methods are provided during which singulation of the solar cell into strips occurs substantially simultaneously to further reduce manufacturing times. Solar modules are provided that incorporate the strips of the solar cells.

Figure 3:
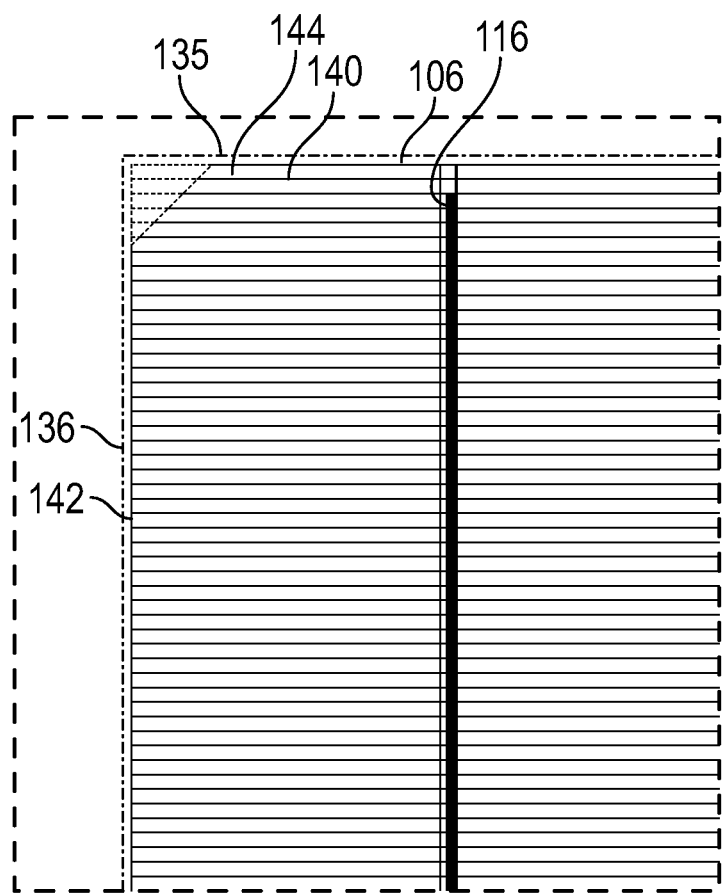
FIG. 3 is a close-up view of a portion of the solar cell of FIG. 1, according to an embodiment.

As alluded to briefly above, solar cells are used as the building block of solar modules. With reference to FIGS. 1-3, various views of a solar cell 100 are provided, according to an embodiment. The solar cell 100 is made up of a substrate 101 configured to be capable of producing energy by converting light energy into electricity. Examples of suitable photovoltaic material include, but are not limited to, those made from multicrystalline or monocrystalline silicon wafers. These wafers may be processed through the major solar cell processing steps, which include wet or dry texturization, junction diffusion, silicate glass layer removal and edge isolation, silicon nitride anti-reflection layer coating, front and back metallization including screen printing, and firing. The wafers may be further processed through advanced solar processing steps, including adding rear passivation coating and selective patterning to thereby obtain a passivated emitter rear contact (PERC) solar cell, which has a higher efficiency than solar cells formed using the standard process flow mentioned above. The solar cell 100 is a p-type monocrystalline cell, in an embodiment, but may be a p-type multicrystalline or an n-type monocrystalline cell in other embodiments. Similar to the diffused junction solar cells described as above, other high efficiency solar cells, including heterojunction solar cells, can utilize the same metallization patterns in order to be used for the manufacture of a shingled array module. The solar cell 100 may have a substantially square shape with chamfered corners (a pseudo-square) or a full square shape. As illustrated in the figures, these options are depicted with dashed lines showing the alternative configurations.

As illustrated in FIG. 1, the solar cell 100 has a metallization pattern 102 formed on a front side 104 of the substrate 101. The metallization pattern 102 generally includes a plurality of discrete sections 106, 108, 110, 112, 114, each of which has a front side bus bar 116, 118, 120, 122, 124 and lines 126, 128, 130, 132, 134. The discrete sections 106, 108, 110, 112, 114 are patterned such that, as will be described later, each discrete section 106, 108, 110, 112, 114 can be separated from the solar cell 100 to form a strip. As such, the sections 106, 108, 110, 112, 114 may be separated by a gap, which serves as a portion of the solar cell 100 at which a break may be made. The width of the gap, if included, is in a range of about 0.2 mm to about 2.0 mm. Here, five discrete sections 106, 108, 110, 112, 114 are included to thereby form five strips total. The front side bus bars 116, 118, 120, 122, 124 are substantially parallel to each other, and each extends along a length of the solar cell 100 without intersecting the top and bottom edges 135, 137 of the solar cell 100. With particular reference to FIG. 3, the lines 126, 128, 130, 132, 134 of each discrete section 106, 108, 110, 112, 114 include finger lines, for example, finger line 140, each extending between the front side bus bars 116, 118, 120, 122, 124 and boundary lines, for example, boundary line 142. Connection lines may be included to extend between adjacent finger lines 140 in an embodiment.

A back side 146 of the solar cell 100 likewise includes metallization, as illustrated in FIG. 2. In an embodiment, the back side 146 includes a plurality of back side bus bars 148, 150, 152, 154, 156, the total number of which is equal to the number of front side bus bars 116, 118, 120, 122, 124. Each back side bus bar 148, 150, 152, 154, 156 corresponds to a discrete section 106, 108, 110, 112, 114. In an embodiment, the location of each back side bus bar 148, 150, 152, 154, 156 depends on the location of a corresponding front side bus bar 116, 118, 120, 122, 124. Specifically, upon cleaving the solar cell 100 into a plurality of strips, each strip has a front side bus bar 116, 118, 120, 122, 124 on an edge opposite from an edge on which a back side bus bar 148, 150, 152, 154, 156 is formed. Further, each back side bus bar 148, 150, 152, 154, 156 is formed at location on the solar cell 100 that is not directly below a corresponding boundary line 142.

The particular locations of the front and back side bus bars are strategically selected. In particular, the front side bus bars are formed at locations that are away from one or both of the edges of the solar cell 100, which thereby reduces side leakage and improves shunt resistance. As a result, high yield and improved low irradiation performance are achieved. Furthermore, by grouping two of the front side bus bars together so that they are adjacent each other, three sets of probes may be employed, rather than the typical five or six sets of probes, to contact bus bars during flash testing. The fewer number of probes used also reduces the shadow impact of the probes during the testing to thereby improve the accuracy and consistency of cell efficiency test.

In this regard, in an embodiment shown in FIG. 1, the left-most discrete section 106 includes boundary line 142 formed along the left edge 136 of the solar cell 100, and hence, left edge 160 of discrete section 106, while front side bus bar 116 is formed along a right edge 162 of discrete section 106 towards an interior portion of the solar cell 100. At the right edge 138 of the solar cell 100, a boundary line 178 is formed along the right edge 164, and hence, front side bus bar 124 is formed towards the interior portion of the solar cell 100 along an opposite (or left) edge 176 of the right-most discrete section 114. The remainder of the front side bus bars 118, 120, 122 are formed along a right edge of corresponding discrete sections 108, 110, 112. As such, the front side bus bars 116, 118, 120, 122, 124 are unevenly spaced apart across the solar cell 100.

Similarly, the back side bus bars 148, 150, 152, 154, 156 are also unevenly spaced apart across the solar cell 100. Specifically, the back side bus bars 148, 150, 152, 154, 156 are formed at locations on the back side 146 of the solar cell 100 such that upon cleaving the solar cell 100 into a plurality of strips made up of each of the discrete sections 106, 108, 110, 112, 114, the front side bus bar 116, 118, 120, 122, 124 of the strip is on an edge opposite from an edge on which a back side bus bar 148, 150, 152, 154, 156 is formed. For example, turning to FIG. 2, back side bus bar 148 is formed along the left edge 136 of the solar cell 100 (and hence, left edge 160 of discrete section 106), while back side bus bar 156 is formed along the right edge 138 of the solar cell 100. Back side bus bars 150, 152, 154 are formed along a left edge of corresponding discrete sections 108, 110, 112.

FIGS. 4 and 5 are simplified front and back side views of a solar cell 400, according to another embodiment. The solar cell 400 has discrete sections 406, 408, 410, 412, 414 each patterned on the front side 404 of the solar cell 400 to include front side bus bars 416, 418, 420, 422, 424 and on the back side 446 of the solar cell 400 to include back side bus bar 448, 450, 452, 454, 456. Similar to solar cell 100, five discrete sections 406, 408, 410, 412, 414 are included to thereby form five strips total. Additionally, the front side bus bars 416, 418, 420, 422, 424 are substantially parallel to each other, and each extends along a length of the solar cell 400 without intersecting the edges 435, 437 of the solar cell 100. Each front side bus bar 416, 418, 420, 422, 424 has finger lines extending away therefrom. Also similar to solar cell 100, the left-most discrete section 406 includes a boundary line (not shown) formed along the left edge 436 of the solar cell 400 (left edge 460 of discrete section 406), while front side bus bar 416 is formed along the right edge 462 of discrete section 406. Also similar to solar cell 100, a boundary line 478 is formed along the right edge 438 of the solar cell 400, and hence, front side bus bar 424 is formed towards the interior portion of the solar cell 400 along an opposite (or left) edge 476 of the right-most discrete section 414. In contrast to solar cell 100, the remainder of the front side bus bars 418, 420, 422 of solar cell 400 are spaced differently; for example, the remainder of the front side bus bars 418, 420, 422 are unevenly spaced between the other front side bus bars 416, 424. In particular, front side bus bar 418 is formed along a left edge 464 of discrete section 408, wherein the left edge 464 is adjacent the right edge 462 of discrete section 406. Front side bus bar 420 is formed along a right edge 470 of discrete section 410. Additionally, front side bus bar 422 is formed along a right edge 474 of discrete sections 412, which is adjacent front side bus bar 424 at the left edge 476 of discrete section 414. As such, the front side bus bars 116, 118, 120, 122, 124 are unevenly spaced apart across the solar cell 100. Back side bus bars 448, 450, 452, 454, 456 are formed at corresponding opposite edge locations on the back side 446 of the solar cell 400, as shown in FIG. 5. It will be appreciated that one or more of the edges (for example, those referred to in FIGS. 4-76) may or may not be depicted as visible lines, in some embodiments.

FIGS. 6 and 7 are simplified front and back side views of a solar cell 600, according to another embodiment. The solar cell 600 has discrete sections 606, 608, 610, 612, 614 each patterned on the front side 604 of the solar cell 600 to include front side bus bars 616, 618, 620, 622, 624 and on the back side 646 of the solar cell 600 to include back side bus bar 648, 650, 652, 654, 656. Similar to solar cells 100 and 400, five discrete 606, 608, 610, 612, 614 are included to thereby form five strips total. Additionally, the front side bus bars 616, 618, 620, 622, 624 are substantially parallel to each other, and each extends along a length of the solar cell 600 without intersecting the edges 635 of the solar cell 600. Each front side bus bar 616, 618, 620, 622, 624 has finger lines extending away therefrom. Also similar to solar cells 100 and 400, the left-most discrete section 606 includes a boundary line formed along the left edge 636 of the solar cell 600 (left edge 660 of discrete section 606), while front side bus bar 616 is formed along the right edge 662 of discrete section 606. Also similar to solar cells 100 and 400, a boundary line is formed along the right edge 638 of the solar cell 600, and hence, front side bus bar 624 is formed towards the interior portion of the solar cell 600 along an opposite (or left) edge 676 of the right-most discrete section 614.

The remainder of the front side bus bars 618, 620, 622 are unevenly spaced between the other front side bus bars 616, 624. In particular, front side bus bar 618 is formed along a right edge 666 of discrete section 608, and adjacent right edge 666 is formed front side bus bar 620 along a left edge 668 of discrete section 610. Front side bus bar 622 is formed along a right edge 674 of discrete section 612. Accordingly, the front side bus bars 616, 618, 620, 622, 624 are unevenly spaced apart across the solar cell 600. Back side bus bars 648, 650, 652, 654, 656 are formed at corresponding opposite edge locations on the back side 646 of the solar cell 600, as shown in FIG. 7.

FIGS. 8 and 9 are simplified front and back side views of a solar cell 800, according to yet another embodiment. The solar cell 800 has discrete sections 806, 808, 810, 812, 814 each patterned on the front side 804 of the solar cell 800 to include front side bus bars 816, 818, 820, 822, 824 and on the back side 846 of the solar cell 800 to include back side bus bars 848, 850, 852, 854, 856. Similar to solar cells 100, 400, and 600, five discrete 806, 808, 810, 812, 814 are included to thereby form five strips total, and the front side bus bars 816, 818, 820, 822, 824 are substantially parallel to each other, and each extends along a length of the solar cell 800 without intersecting the edges 835 of the solar cell 800. Each front side bus bar 816, 818, 820, 822, 824 has finger lines extending away therefrom. Also similar to solar cells 100, 400, and 600, a boundary line (not shown) formed on left edge 836 of the solar cell 800, and front side bus bar 816 is formed also right edge 862 of discrete section 806, respectively, and front side bus bar 824 and a boundary line are formed along left edge 876 of discrete section 814 and right edge 838 of the solar cell 800, respectively.

The remainder of the front side bus bars 818, 820, 822 are also unevenly spaced between the other front side bus bars 816, 824. In particular, front side bus bar 818 is formed along a right edge 866 of discrete section 808, front side bus bar 820 is formed along a right edge 870 of discrete sections 810, and front side bus bar 822 is formed along the left edge 872 of discrete section 812. Back side bus 848, 850, 852, 854, 856 are formed at corresponding opposite edge locations on the back side 846 of the solar cell 800, as shown in FIG. 9.

In another embodiment, rather than having no bus bars formed along the edges of a solar cell, one bus bar is included. For example, as illustrated in FIGS. 10 and 11, The solar cell 1000 has discrete sections 1006, 1008, 1010, 1012, 1014 each patterned on the front side 1004 of the solar cell 1000 to include front side bus bars 1016, 1018, 1020, 1022, 1024 and on the back side 1046 of the solar cell 1000 to include back side bus bars 1048, 1050, 1052, 1054, 1056. Five discrete sections 1006, 1008, 1010, 1012, 1014 are included to thereby form five strips total, and the front side bus bars 1016, 1018, 1020, 1022, 1024 are substantially parallel to each other, and each extends along a length of the solar cell 1000 without intersecting the edges 1035, 1037, 1039 of the solar cell 1000. Each front side bus bar 1016, 1018, 1020, 1022, 1024 has finger lines extending away therefrom. A boundary line and front side bus bar 1016 are formed on left edge 1036 of the solar cell 1000 and right edge 1062 of discrete section 1006, respectively, while a boundary line and front side bus bar 1024 and are formed along left edge 1076 of discrete section 1014 and right edge 1038 of the solar cell 1000, respectively.

The remainder of the front side bus bars 1018, 1020, 1022 here are unevenly spaced between the other front side bus bars 1016, 1024 in a manner similar to front side bus bars 816, 818, 820, 822, 824 of the solar cell 800 shown and described in FIGS. 8 and 9. Back side bus 1048, 1050, 1052, 1054, 1056 are formed at corresponding opposite edge locations on the back side 1046 of the solar cell 1000, as shown in FIG. 11.

In another exemplary embodiment, as illustrated in FIGS. 12 and 13, the solar cell 1200 here has discrete sections 1206, 1208, 1210, 1212, 1214 each patterned on the front side 1204 of the solar cell 1200 to include front side bus bars 1216, 1218, 1220, 1222, 1224 and on the back side 1246 of the solar cell 1200 to include back side bus bars 1248, 1250, 1252, 1254, 1256. Front side bus bars 1216, 1224 are formed at locations on the solar cell 1100 similar to those of front side bus bars 1016, 1024, and the remainder of the front side bus bars 1218, 1220, 1222 here are unevenly spaced between the other front side bus bars 1216, 1224 in a manner similar to front side bus bars 618, 620, 622 of solar cell 600. Each front side bus bar 1216, 1218, 1220, 1222, 1224 has finger lines extending away therefrom. Back side bus 1248, 1250, 1252, 1254, 1256 are formed at corresponding opposite edge locations on the back side 1246 of the solar cell 1200, as shown in FIG. 13.

According to still another exemplary embodiment, as illustrated in FIGS. 14 and 15, the solar cell 1400 here has discrete sections 1406, 1408, 1410, 1412, 1414 each patterned on the front side 1404 of the solar cell 1400 to include front side bus bars 1416, 1418, 1420, 1422, 1424 and on the back side 1446 of the solar cell 1400 to include back side bus bars 1448, 1450, 1452, 1454, 1456. Front side bus bars 1416, 1424 are formed at locations on the solar cell 1400 similar to those of front side bus bars 1016, 1024 of solar cell 1000, and the remainder of the front side bus bars 1418, 1420, 1422 here are unevenly spaced between the other front side bus bars 1416, 1424 in a manner similar to front side bus bars 418, 420, 422 of solar cell 400. Back side bus 1448, 1450, 1452, 1454, 1456 are formed at corresponding opposite edge locations on the back side 1446 of the solar cell 1400, as shown in FIG. 15. Each front side bus bar 1416, 1418, 1420, 1422, 1424 has finger lines extending away therefrom.

According to still yet another exemplary embodiment, as illustrated in FIGS. 16 and 17, the solar cell 1600 here has discrete sections 1606, 1608, 1610, 1612, 1614 each patterned on the front side 1604 of the solar cell 1600 to include front side bus bars 1616, 1618, 1620, 1622, 1624 and on the back side 1646 of the solar cell 1600 to include back side bus bars 1648, 1650, 1652, 1654, 1656. Front side bus bars 1616, 1624 are formed at locations on the solar cell 1400 similar to those of front side bus bars 1016, 1024 of solar cell 1000. The remainder of the front side bus bars 1618, 1620, 1622 here are unevenly spaced between the other front side bus bars 1616, 1624. Specifically, front side bus bar 1618 is formed along a right edge 1666 of discrete section 1608, and front side bus bar 1620 extends along a left edge 1668 of discrete section 1610. Front side bus bar 1622 is formed along left edge 1672 of discrete section 1612. Each front side bus bar 1616, 1618, 1620, 1622, 1624 has finger lines extending away therefrom. Back side bus 1648, 1650, 1652, 1654, 1656 are formed at corresponding opposite edge locations on the back side 1646 of the solar cell 1600, as shown in FIG. 17.

In still yet another exemplary embodiment, as illustrated in FIGS. 18 and 19, the solar cell 1800 here has discrete sections 1806, 1808, 1810, 1812, 1814 each patterned on the front side 1804 of the solar cell 1800 to include front side bus bars 1816, 1818, 1820, 1822, 1824 and on the back side 1846 of the solar cell 1800 to include back side bus bars 1848, 1850, 1852, 1854, 1856. Front side bus bars 1816, 1824 are formed at locations on the solar cell 1800 similar to those of front side bus bars 1016, 1024 of solar cell 1000. The remainder of the front side bus bars 1818, 1820, 1822 here are unevenly spaced between the other front side bus bars 1816, 1824. In particular, front side bus bar 1818 is formed along left edge 1864 of discrete section 1808, front side bus bar 1820 is formed along right edge 1870 of discrete section 1810, and front side bus bar 1822 is formed along left edge 1872 of discrete section 1812. Each front side bus bar 1816, 1818, 1820, 1822, 1824 has finger lines extending away therefrom. Back side bus 1848, 1850, 1852, 1854, 1856 are formed at corresponding opposite edge locations on the back side 1846 of the solar cell 1800, as shown in FIG. 19.

In another exemplary embodiment, as illustrated in FIGS. 20 and 21, the solar cell 2000 here has discrete sections 2006, 2008, 2010, 2012, 2014 each patterned on the front side 2004 of the solar cell 2000 to include front side bus bars 2016, 2018, 2020, 2022, 2024 and on the back side 2046 of the solar cell 2000 to include back side bus bars 2048, 2050, 2052, 2054, 2056. Front side bus bars 2016, 2024 are formed at locations on the solar cell 2000 similar to those of front side bus bars 1016, 1024 of solar cell 1000. The remainder of the front side bus bars 2018, 2020, 2022 here are unevenly spaced between the other front side bus bars 2016, 2024. In particular, front side bus bar 2018 is formed along left edge 2064 of discrete section 2008, front side bus bar 2020 is formed along left edge 2068 of discrete section 2010, and front side bus bar 2022 is formed along right edge 2074 of discrete section 2012. Each front side bus bar 2016, 2018, 2020, 2022, 2024 has finger lines extending away therefrom. Back side bus 2048, 2050, 2052, 2054, 2056 are formed at corresponding opposite edge locations on the back side 2046 of the solar cell 2000, as shown in FIG. 21.

In still another exemplary embodiment, as illustrated in FIGS. 22 and 23, the solar cell 2200 here has discrete sections 2206, 2208, 2210, 2212, 2214 each patterned on the front side 2204 of the solar cell 2200 to include front side bus bars 2216, 2218, 2220, 2222, 2224 and on the back side 2246 of the solar cell 2200 to include back side bus bars 2248, 2250, 2252, 2254, 2256. Front side bus bars 2216, 2224 are formed at locations on the solar cell 2200 similar to those of front side bus bars 1016, 1024 of solar cell 1000. The remainder of the front side bus bars 2218, 2220, 2222 are evenly spaced between the other front side bus bars 2216, 2024. Front side bus bar 2218 is formed along left edge 2264 of discrete section 2208, front side bus bar 2220 is formed along left edge 2268 of discrete section 2210, and front side bus bar 2222 is formed along left edge 2272 of discrete section 2212. Each front side bus bar 2216, 2218, 2220, 2222, 2224 has finger lines extending away therefrom. Back side bus 2248, 2250, 2252, 2254, 2256 are formed at corresponding opposite edge locations on the back side 2246 of the solar cell 2200, as shown in FIG. 23.

Although the embodiments of the solar cells described above include five discrete sections to be cleaved into five strips, other embodiments include solar cells having six discrete sections to be cleaved into six strips. Similar to the embodiments above, one or none of the front side bus bars is formed along an edge of the solar cell.

Turning now to FIGS. 24 and 25, a solar cell 2400 having six discrete sections 2406, 2408, 2410, 2412, 2414, 2416 is illustrated. The discrete sections 2406, 2408, 2410, 2412, 2414, 2416 are each patterned on the front side 2402 of the solar cell 2400 to include front side bus bars 2418, 2420, 2422, 2424, 2426, 2428, and on the back side 2404 of the solar cell 2400 to include back side bus bars 2430, 2432, 2434, 2436, 2438, 2440. Front side bus bar 2418 is formed at a location on the solar cell 2400 that is away from its left edge 2442, and in particular, along a right edge 2452 of discrete section 2406. Front side bus bar 2428 is formed along the right edge 2444 of the solar cell 2400, which is also along the right edge 2472 of discrete section 2416. The remainder of the front side bus bars, 2420, 2422, 2424, 2426 are evenly spaced between the other front side bus bars 2416, 2424. Specifically, front side bus bar 2420 is formed along right edge 2456 of discrete section 2408, front side bus bar 2422 is formed along right edge 2460 of discrete section 2410, front side bus bar 2424 is formed along right edge 2464 of discrete section 2412, and front side bus bar 2426 is formed along right edge 2468 of discrete section 2414. Each front side bus bar 2418, 2420, 2422, 2424, 2426, 2428 has finger lines extending away therefrom. Back side bus 2430, 2432, 2434, 2436, 2438, 2440 are formed at corresponding opposite edge locations on the back side 2404 of the solar cell 2400, as shown in FIG. 25.

FIGS. 26 and 27 illustrate another embodiment of, a solar cell 2600 having six discrete sections 2606, 2608, 2610, 2612, 2614, 2616. The discrete sections 2606, 2608, 2610, 2612, 2614, 2616 are each patterned on the front side 2602 of the solar cell 2600 to include front side bus bars 2618, 2620, 2622, 2624, 2626, 2628, and on the back side 2604 of the solar cell 2600 to include back side bus bars 2630, 2632, 2634, 2636, 2638, 2640. Front side bus bar 2618 is formed at a location on the solar cell 2600 that is away from its left edge 2642, and in particular, along a right edge 2652 of discrete section 2606. Front side bus bar 2628 is formed along the right edge 2644 of the solar cell 2600, which is also along the right edge 2672 of discrete section 2616. The remainder of the front side bus bars, 2620, 2622, 2624, 2626 are unevenly spaced between the other front side bus bars 2616. Specifically, front side bus bar 2620 is formed along left edge 2654 of discrete section 2608, front side bus bar 2622 is formed along right edge 2660 of discrete section 2610, front side bus bar 2624 is formed along right edge 2664 of discrete section 2612, and front side bus bar 2624 is formed along right edge 2668 of discrete section 2614. Each front side bus bar 2618, 2620, 2622, 2624, 2626, 2628 has finger lines extending away therefrom. Back side bus bars 2630, 2632, 2634, 2636, 2638, 2640 are formed at corresponding opposite edge locations on the back side 2604 of the solar cell 2600, as shown in FIG. 27.

In another embodiment, a solar cell 2800 having six discrete sections 2806, 2808, 2810, 2812, 2814, 2816 is illustrated in FIGS. 28 and 29. The discrete sections 2806, 2808, 2810, 2612, 2614, 2616 are each patterned on the front side 2802 of the solar cell 2800 to include front side bus bars 2818, 2820, 2822, 2824, 2826, 2828, and on the back side 2804 of the solar cell 2800 to include back side bus bars 2830, 2832, 2834, 2836, 2838, 2840. Front side bus bar 2818 is formed away from a left edge 2842, and in particular, along a right edge 2852 of discrete section 2806. Front side bus bar 2828 is formed along the right edge 2844 of the solar cell 2600, which is also along the right edge 2872 of discrete section 2816. The remainder of the front side bus bars 2820, 2822, 2824, 2826 are unevenly spaced between the other front side bus bars 2818, 2828. Specifically, front side bus bar 2820 is formed along right edge 2856 of discrete section 2808, front side bus bar 2822 is formed along left edge 2858 of discrete section 2810, front side bus bar 2824 is formed along right edge 2864 of discrete section 2812, and front side bus bar 2826 is formed along right edge 2868 of discrete section 2614. Each front side bus bar 2818, 2820, 2822, 2824, 2826, 2828 has finger lines extending away therefrom.

Back side bus 2830, 2832, 2834, 2836, 2838, 2840 are formed at corresponding opposite edge locations on the back side 2804 of the solar cell 2800, as shown in FIG. 29.

In still another embodiment, a solar cell 3000 having six discrete sections 3006, 3008, 3010, 3012, 3014, 3016 is illustrated in FIGS. 30 and 31. The discrete sections 3006, 3008, 3010, 3012, 3014, 3016 are each patterned on the front side 3002 of the solar cell 3000 to include front side bus bars 3018, 3020, 3022, 3024, 3026, 3028, and on the back side 3004 of the solar cell 3000 to include back side bus bars 3030, 3032, 3034, 3036, 3038, 3040. Front side bus bar 3018 is formed at locations on the solar cell 3000 that is away from its left edge 3042, and in particular, along a right edge 3052 of discrete section 3006. Front side bus bar 3028 is formed along the right edge 3044 of the solar cell 3000, which is also along the right edge 3072 of discrete section 3016. The remainder of the front side bus bars 3020, 3022, 3024, and 3026 are unevenly spaced between the other front side bus bars 3018, 3028. Specifically, front side bus bar 3020 is formed along right edge 3056 of discrete section 3008, front side bus bar 3022 is formed along right edge 3060 of discrete section 3010, and front side bus bar 3024 is formed along left edge 3066 of discrete section 3014. Each front side bus bars 3018, 3020, 3022, 3024, 3026, and 3028 has finger lines extending away therefrom. Back side bus bars 3030, 3032, 3034, 3036, 3038, and 3040 are formed corresponding on the back side 3004 of the solar cell 3000, as shown in FIG. 31.

In still yet another embodiment, a solar cell 3200 having six discrete sections 3206, 3208, 3210, 3212, 3214, 3216 is illustrated in FIGS. 32 and 33. The discrete sections 3206, 3208, 3210, 3212, 3214, 3216 are each patterned on the front side 3202 of the solar cell 3200 to include front side bus bars 3218, 3220, 3222, 3224, 3232, and 3228, and on the back side 3204 of the solar cell 3200 to include back side bus bars 3230, 3232, 3234, 3236, 3238, and 3240. Front side bus bar 3218 is formed at locations on the solar cell 3200 that is away from its left edge 3242, and in particular, along a right edge 3252 of discrete section 3206. Front side bus bar 3228 is formed along the right edge 3244 of the solar cell 3200, which is also along the right edge 3272 of discrete section 3216. The remainder of the front side bus bars 3220, 3222, 3234, and 3236 are unevenly spaced between the other front side bus bars 3218, 3228. Specifically, front side bus bar 3220 is formed along right edge 3256 of discrete section 3208, front side bus bar 3222 is formed along left edge 3258 of discrete section 3210, front side bus bar 3224 is formed along right edge 3268 of discrete section 3214, and front side bus bar 3226 is formed along left edge 3266 of discrete section 3214. Each front side bus bar 3218, 3220, 3222, 3224, 3226, and 3228 has finger lines extending away therefrom. Back side bus 3230, 3232, 3234, 3236, 3238, and 3240 are formed at corresponding opposite edge locations on the back side 3204 of the solar cell 3200, as shown in FIG. 33.

Even still another embodiment, a solar cell 3400 having six discrete sections 3406, 3408, 3410, 3412, 3414, and 3416 is illustrated in FIGS. 34 and 35. The discrete sections 3406, 3408, 3410, 3412, 3414, and 3416 are each patterned on the front side 3402 of the solar cell 3400 to include front side bus bars 3418, 3420, 3422, 3424, 3426, and 3428, and on the back side 3404 of the solar cell 3400 to include back side bus bars 3430, 3432, 3434, 3436, 3438, and 3440. Front side bus bar 3418 is formed at locations on the solar cell 3400 that is away from its left edge 3442, and in particular, along a right edge 3452 of discrete section 3406. Front side bus bar 3428 is formed along the right edge 3444 of the solar cell 3400, which is also along the right edge 3472 of discrete section 3416. The remainder of the front side bus bars 3420, 3422, and 3426 are unevenly spaced between the other front side bus bars 3418, 3428. Specifically, front side bus bar 3420 is formed along left edge 3454 of discrete section 3408, front side bus bar 3422 is formed along right edge 3460 of discrete section 3410, front side bus bar 3424 is formed along right edge 3464 of discrete section 3412, and front side bus bar 3426 is formed along left edge 3468 of discrete section 3414. Each front side bus bar 3418, 3420, 3422, 3424, 3426, and 3428 has finger lines extending away therefrom. Back side bus 3430, 3432, 3434, 3436, 3438, and 3440 are formed at corresponding opposite edge locations on the back side 3404 of the solar cell 3400, as shown in FIG. 35.

Another embodiment shown in FIGS. 36 and 37 includes a solar cell 3600 having six discrete sections 3606, 3608, 3610, 3612, 3614, and 3616. The discrete sections 3606, 3608, 3610, 3612, 3614, and 3616 are each patterned on the front side 3602 of the solar cell 3600 to include front side bus bars 3618, 3620, 3622, 3624, 3636, and 3628, and on the back side 3604 of the solar cell 3600 to include back side bus bars 3630, 3632, 3634, 3636, 3638, and 3640. Front side bus bar 3618 is formed at locations on the solar cell 3600 that is away from its left edge 3642, and in particular, along a right edge 3652 of discrete section 3606. Front side bus bar 3628 is formed along the right edge 3644 of the solar cell 3600, which is also along the right edge 3672 of discrete section 3616. The remainder of the front side bus bars 3620, 3622, and 3626 are unevenly spaced between the other front side bus bars 3618, 3628. Specifically, front side bus bar 3620 is formed along right edge 3656 of discrete section 3608, front side bus bar 3622 is formed along left edge 3658 of discrete section 3610, front side bus bar 3624 is formed along left edge 3662 of discrete section 3612, and front side bus bar 3626 is formed along right edge 3668 of discrete section 3614. Each front side bus bar 3618, 3620, 3622, 3624, 3626, and 3628 has finger lines extending away therefrom. Back side bus 3630, 3632, 3634, 3636, 3638, and 3640 are formed at corresponding opposite edge locations on the back side 3604 of the solar cell 3600, as shown in FIG. 37.

Even still another embodiment, a solar cell 3800 having six discrete sections 3806, 3808, 3810, 3812, 3814, and 3816 is illustrated in FIGS. 38 and 39. The discrete sections 3806, 3808, 3810, 3812, 3814, and 3816 are each patterned on the front side 3802 of the solar cell 3800 to include front side bus bars 3818, 3820, 3822, 3824, 3838, and 3828, and on the back side 3804 of the solar cell 3800 to include back side bus bars 3830, 3832, 3834, 3836, 3838, and 3840. Front side bus bar 3818 is formed at locations on the solar cell 3800 that is away from its left edge 3842, and in particular, along a right edge 3852 of discrete section 3806. Front side bus bar 3828 is formed along the right edge 3844 of the solar cell 3800, which is also along the right edge 3872 of discrete section 3816. The remainder of the front side bus bars 3820, 3822, 3824, and 38256 are unevenly spaced between the other front side bus bars 3818, 3828. Specifically, front side bus bar 3820 is formed along left edge 3854 of discrete section 3808, front side bus bar 3822 is formed along right edge 3864 of discrete section 3810, front side bus bar 3824 is formed along left edge 3866 of discrete section 3812, and front side bus bar 3826 is formed along right edge 3868 of discrete section 3814. Each front side bus bar 3818, 3820, 3822, 3824, 3838, and 3828 has finger lines extending away therefrom. Back side bus 3830, 3832, 3834, 3836, 3838, and 3840 are formed at corresponding opposite edge locations on the back side 3804 of the solar cell 3800, as shown in FIG. 39.

In another embodiment, a solar cell 4000 having six discrete sections 4006, 4008, 4010, 4012, 4014, 4016 is illustrated in FIGS. 40 and 41. The discrete sections 4006, 4008, 4010, 4012, 4014, 4016 are each patterned on the front side 4002 of the solar cell 4000 to include front side bus bars 4018, 4020, 4022, 4024, 4026, 4028, and on the back side 4004 of the solar cell 4000 to include back side bus bars 4030, 4032, 4034, 4036, 4038, 4040. Front side bus bar 4018 is formed at locations on the solar cell 4000 that is away from its left edge 4042, and in particular, along a right edge 4052 of discrete section 4006. Front side bus bar 4028 is formed along the right edge 4044 of the solar cell 4000, which is also along the right edge 4072 of discrete section 4016. The remainder of the front side bus bars 4018, 4020, 4022, and 4026 are unevenly spaced between the other front side bus bars 4016, 4028. Specifically, front side bus bar 4020 is formed along left edge 4054 of discrete section 4008, front side bus bar 4022 is formed along left edge 4058 of discrete section 4010, front side bus bar 4024 is formed along right edge 4064 of discrete section 4014, and front side bus bar 4026 is formed along right edge 4068 of discrete section 4014. Each front side bus bar 4020, 4022, 4024, and 4026 has finger lines extending away therefrom. Back side bus 4030, 4032, 4034, 4036, 4038, 4040 are formed at corresponding opposite edge locations on the back side 4004 of the solar cell 4000, as shown in FIG. 41.

In still another embodiment, a solar cell 4200 having six discrete sections 4206, 4208, 4210, 4212, 4214, and 4216 is illustrated in FIGS. 42 and 43. The discrete sections 4206, 4208, 4210, 4212, 4214, and 4216 are each patterned on the front side 4202 of the solar cell 4200 to include front side bus bars 4218, 4220, 4222, 4224, 4226, and 4228, and on the back side 4204 of the solar cell 4200 to include back side bus bars 4230, 4232, 4234, 4236, 4238, 4240. Front side bus bar 4218 is formed at locations on the solar cell 4200 that is away from its left edge 4242, and in particular, along a right edge 4252 of discrete section 4206. Front side bus bar 4228 is formed along the right edge 4244 of the solar cell 4200, which is also along the right edge 4272 of discrete section 4216. The remainder of the front side bus bars 4220, 4222, 4224, and 426 are unevenly spaced between the other front side bus bars 4218, 4228. Specifically, front side bus bar 4220 is formed along left edge 4254 of discrete section 4208, front side bus bar 4222 is formed along right edge 4260 of discrete section 4210, front side bus bar 4224 is formed along left edge 4262 of discrete section 4212, and front side bus bar 4226 is formed along left edge 4266 of discrete section 4214. Each front side bus bar 4218, 4220, 4222, 4224, 4226, and 4228 has finger lines extending away therefrom. Back side bus 4230, 4232, 4234, 4236, 4238, 4240 are formed at corresponding opposite edge locations on the back side 4204 of the solar cell 4200, as shown in FIG. 43.

According to another embodiment, a solar cell 4400 having six discrete sections 4406, 4408, 4410, 4412, 4414, and 4416 is illustrated in FIGS. 44 and 45. The discrete sections 4406, 4408, 4410, 4412, 4414, and 4416 are each patterned on the front side 4402 of the solar cell 4400 to include front side bus bars 4418, 4420, 4422, 4424, 4426, and 4428, and on the back side 4404 of the solar cell 4400 to include back side bus bars 4430, 4432, 4434, 4436, 4438, and 4440. Front side bus bar 4418 is formed at locations on the solar cell 4400 that is away from its left edge 4442, and in particular, along a right edge 4452 of discrete section 4406. Front side bus bar 4428 is formed along the right edge 4444 of the solar cell 4400, which is also along the right edge 4472 of discrete section 4416. The remainder of the front side bus bars 4420, 4422, 4424, and 4426 are unevenly spaced between the other front side bus bars 4418, 4428. Specifically, front side bus bar 4420 is formed along left edge 4454 of discrete section 4408, front side bus bar 4422 is formed along left edge 4458 of discrete section 4410, front side bus bar 4424 is formed along right edge 4464 of discrete section 4412, and front side bus bar 4426 is formed along left edge 4426 of discrete section 4414. Each front side bus bar 4418, 4420, 4422, 4424, 4426, and 4428 has finger lines extending away therefrom. Back side bus 4430, 4432, 4434, 4436, 4438, 4440 are formed at corresponding opposite edge locations on the back side 4404 of the solar cell 4400, as shown in FIG. 45.

In still another embodiment, a solar cell 4600 having six discrete sections 4606, 4608, 4610, 4612, 4614, and 4616 is illustrated in FIGS. 46 and 47. The discrete sections 4606, 4608, 4610, 4412, 4414, and 4416 are each patterned on the front side 4602 of the solar cell 4600 to include front side bus bars 4618, 4620, 4622, 4624, 4644, 4628, and on the back side 4604 of the solar cell 4600 to include back side bus bars 4630, 4632, 4634, 4636, 4638, 4640. Front side bus bar 4618 is formed at locations on the solar cell 4600 that is away from its left edge 4642, and in particular, along a right edge 4652 of discrete section 4606. Front side bus bar 4628 is formed along the right edge 4644 of the solar cell 4600, which is also along the right edge 4672 of discrete section 4616. The remainder of the front side bus bars 4620, 4622, 4624, and 4626 are unevenly spaced between the other front side bus bars 4618, 4628. Specifically, front side bus bar 4620 is formed along right edge 4656 of discrete section 4608, front side bus bar 4622 is formed along right edge 4660 of discrete section 4610, front side bus bar 4624 is formed along right edge 4664 of discrete section 4612, and front side bus bar 4626 is formed along left edge 4666 of discrete section 4614. Each front side bus bar 4618, 4620, 4622, 4624, 4626, and 4628 has finger lines extending away therefrom. Back side bus 4630, 4632, 4634, 4636, 4638, and 4640 are formed at corresponding opposite edge locations on the back side 4604 of the solar cell 4600, as shown in FIG. 47.

In still yet another embodiment, a solar cell 4800 having six discrete sections 4806, 4808, 4810, 4812, 4814, and 4816 is illustrated in FIGS. 48 and 49. The discrete sections 4806, 4808, 4810, 4812, 4814, and 4816 are each patterned on the front side 4802 of the solar cell 4800 to include front side bus bars 4818, 4820, 4822, 4824, 4826, 4828, and on the back side 4804 of the solar cell 4800 to include back side bus bars 4830, 4832, 4834, 4836, 4838, and 4840. Front side bus bar 4818 is formed at locations on the solar cell 4800 that is away from its left edge 4842, and in particular, along a right edge 4852 of discrete section 4806. Front side bus bar 4828 is formed along the right edge 4844 of the solar cell 4800, which is also along the right edge 4872 of discrete section 4816. The remainder of the front side bus bars 4820, 4822, 4824, and 4826 are unevenly spaced between the other front side bus bars 4818, 4828. Specifically, front side bus bar 4820 is formed along left edge 4854 of discrete section 4808, front side bus bar 4822 is formed along right edge 4860 of discrete section 4810, front side bus bar 4822 is formed along right edge 4860 of discrete section 4810, front side bus bar 4824 is formed along left edge 4862 of discrete section 4812, and front side bus bar 4826 is formed along right edge 4868 of discrete section 4814. Each front side bus bar 4818, 4820, 4822, 4824, 4826, and 4828 has finger lines extending away therefrom. Back side bus 4830, 4832, 4834, 4836, 4838, and 4840 are formed at corresponding opposite edge locations on the back side 4804 of the solar cell 4800, as shown in FIG. 49.

A solar cell 5000 having six discrete sections 5006, 5008, 5010, 5012, 5014, and 5016 is illustrated in FIGS. 50 and 51. The discrete sections 5006, 5008, 5010, 5012, 5014, and 5016 are each patterned on the front side 5002 of the solar cell 5000 to include front side bus bars 5018, 5020, 5022, 5024, 5026, and 5028, and on the back side 5004 of the solar cell 5000 to include back side bus bars 5030, 5032, 5034, 5036, 5038, and 5040. Front side bus bar 5018 is formed at locations on the solar cell 5000 that is away from its left edge 5042, and in particular, along a left edge 5042 of discrete section 5006. Front side bus bar 5028 is formed along the left edge 5044 of the solar cell 5000, which is also along the left edge 5070 of discrete section 5016. The remainder of the front side bus bars 5020, 5022, 5024 and 5026 are unevenly spaced between the other front side bus bars 5018, 5028. Specifically, front side bus bar 5020 is formed along right edge 5056 of discrete section 5008, front side bus bar 5022 is formed along right edge 5060 of discrete section 5010, front side bus bar 5024 is formed along right edge 5064 of discrete section 5012, and front side bus bar 5026 is formed along right edge 5068 of discrete section 5014. Each front side bus bar 5018, 5020, 5022, 5024, 5050, and 5028 has finger lines extending away therefrom. Back side bus 5030, 5032, 5034, 5036, 5038, and 5040 are formed at corresponding opposite edge locations on the back side 5004 of the solar cell 5000, as shown in FIG. 51.

In another embodiment, a solar cell 5200 having six discrete sections 5206, 5208, 5210, 5212, 5214, 5216 is illustrated. Generally in these solar cells 5200 having six discrete sections, the front side bus bars are not both formed along an edge so as to avoid edge leakage and improve the shunt resistance, resulting in higher yield and better low irradiation performance (for example, in cells having a p-n junction thickness of about 0.4 um, and a base thickness of about 190 um). Further, in some embodiments of the solar cell in which a symmetrical pattern design is included on both the front and back sides of the solar cell, such a pattern may provide a consistent conductive distance between a front side pole and back side pole. In particular, the symmetrical pattern has been found to improve the consistency and accuracy in cell efficiency testing due to the uniform resistance loss between strips. Further, for those solar cells having symmetrical pattern designs, better finger and busbar resolution result, which allows the screen print to last longer due to the uniform mechanical pressure used in their formation.

Returning to FIG. 52, the discrete sections 5206, 5208, 5210, 5212, 5214, and 5216 are each patterned on the front side 5202 of the solar cell 5200 to include front side bus bars 5218, 5220, 5222, 5252, 5226, and 5228, and on the back side 5204 of the solar cell 5200 to include back side bus bars 5230, 5232, 5234, 5236, 5238, 5240. Front side bus bar 5218 is formed at locations on the solar cell 5200 that is along its left edge 5242, and in particular, along a left edge 5050 of discrete section 5206. Front side bus bar 5228 is formed away the left edge 5244 of the solar cell 5200, which is also along the left edge 5270 of discrete section 5216. The remainder of the front side bus bars 5220, 5222, 5224, and 5226 are evenly spaced between the other front side bus bars 5218, 5228. Specifically, front side bus bar 5220 is formed along right edge 5256 of discrete section 5208, front side bus bar 5222 is formed along right edge 5260 of discrete section 5210, front side bus bar 5224 is formed along right edge 5264 of discrete section 5212, and front side bus bar 5226 is formed along left edge 5266 of discrete section 5214. Each front side bus bar 5218, 5220, 5222, 5252, 5226, and 5228 has finger lines extending away therefrom. Back side bus 5230, 5232, 5234, 5236, 5238, and 5240 are formed at corresponding opposite edge locations on the back side 5204 of the solar cell 5200, as shown in FIG. 53.

In another embodiment, a solar cell 5400 having six discrete sections 5406, 5408, 5410, 5412, 5414, and 5416 is illustrated in FIGS. 54 and 55. The discrete sections 5406, 5408, 5410, 5412, 5414, and 5416 are each patterned on the front side 5402 of the solar cell 5400 to include front side bus bars 5418, 5420, 5422, 5424, 5454, and 5428, and on the back side 5404 of the solar cell 5400 to include back side bus bars 5430, 5432, 5434, 5436, 5438, and 5440. Front side bus bar 5418 is formed at locations on the solar cell 5400 that is along its left edge 5442, and in particular, along a left edge 5450 of discrete section 5406. Front side bus bar 5428 is formed away from the edge 5472 of the solar cell 5400, which is also along the left edge 5470 of discrete section 5416. The remainder of the front side bus bars 5420, 5422, 5424, and 5426 are unevenly spaced between the other front side bus bars 5418, 5428. Specifically, front side bus bar 5420 is formed along right edge 5456 of discrete section 5408, front side bus bar 5422 is formed along left edge 5458 of discrete section 5410, front side bus bar 5424 is formed along right edge 5464 of discrete section 5412, and front side bus bar 5426 is formed along right edge 5468 of discrete section 5414. Each front side bus bar 5418, 5420, 5422, 5424, 5426, and 5428 has finger lines extending away therefrom. Back side bus 5430, 5432, 5434, 5436, 5438, and 5440 are formed at corresponding opposite edge locations on the back side 5404 of the solar cell 5400, as shown in FIG. 55.

In still another embodiment, a solar cell 5600 having six discrete sections 5606, 5608, 5610, 5612, 5614, and 5616 is illustrated in FIGS. 56 and 57. The discrete sections 5606, 5608, 5610, 5612, 5614, and 5616 are each patterned on the front side 5602 of the solar cell 5600 to include front side bus bars 5618, 5620, 5622, 5624, 5626, and 5628, and on the back side 5604 of the solar cell 5600 to include back side bus bars 5630, 5632, 5634, 5636, 5638, and 5640. Front side bus bar 5618 is formed at locations on the solar cell 5600 that is along its left edge 5642, and in particular, along a left edge 5650 of discrete section 5606. Front side bus bar 5628 is formed along the away from edge 5644 of the solar cell 5600, which is also along the left edge 5670 of discrete section 5616. The remainder of the front side bus bars 5620, 5622, 5624, and 5626 are unevenly spaced between the other front side bus bars 5618, 5628. Specifically, front side bus bar 5620 is formed along left edge 5654 of discrete section 5608, front side bus bar 5622 is formed along right edge 5660 of discrete section 5610, front side bus bar 5624 is formed along right edge 5664 of discrete section 5612, and front side bus bar 5626 is formed along right edge 5668 of discrete section 5614. Each front side bus bar 5618, 5620, 5622, 5624, 5626, and 5628 has finger lines extending away therefrom. Back side bus 5630, 5632, 5634, 5636, 5638, and 5640 are formed at corresponding opposite edge locations on the back side 5604 of the solar cell 5600, as shown in FIG. 57.

In yet another embodiment, a solar cell 5800 having six discrete sections 5806, 5808, 5810, 5812, 5814, and 5816 is illustrated in FIGS. 58 and 59. The discrete sections 5806, 5808, 5810, 5812, 5814, and 5816 are each patterned on the front side 5802 of the solar cell 5800 to include front side bus bars 5818, 5820, 5822, 5824, 5858, and 5858, and on the back side 5804 of the solar cell 5800 to include back side bus bars 5830, 5832, 5834, 5836, 5838, and 5840. Front side bus bar 5818 is formed at locations on the solar cell 5800 that are away from its left edge 5842, and in particular, along a right edge 5852 of discrete section 5806. Front side bus bar 5828 is formed away from the right edge 5844 of the solar cell 5800, which is also along the left edge 5870 of discrete section 5816. The remainder of the front side bus bars 5820, 5822, 5824, and 5826 are unevenly spaced between the other front side bus bars 5818, 5828. Specifically, front side bus bar 5820 is formed along right edge 5856 of discrete section 5808, front side bus bar 5822 is formed along right edge 5860 of discrete section 5810, front side bus bar 5824 is formed along right edge 5864 of discrete section 5812, and front side bus bar 5826 is formed along right edge 5868 of discrete section 5814. Each front side bus bar 5818, 5820, 5822, 5824, 5826, and 5828 has finger lines extending away therefrom. Back side bus 5830, 5832, 5834, 5836, 5838, and 5840 are formed at corresponding opposite edge locations on the back side 5804 of the solar cell 5800, as shown in FIG. 59.

In another embodiment, a solar cell 6000 having six discrete sections 6006, 6008, 6010, 6012, 6014, and 6016 is illustrated in FIGS. 60 and 61. The discrete sections 6006, 6008, 6010, 6012, 6014, and 6016 are each patterned on the front side 6002 of the solar cell 6000 to include front side bus bars 6018, 6020, 6022, 6024, 6026, 6028, and on the back side 6004 of the solar cell 6000 to include back side bus bars 6030, 6032, 6034, 6036, 6038, 6040. Front side bus bar 6018 is formed at locations on the solar cell 6000 that is away from its left edge 6042, and in particular, along a right edge 6052 of discrete section 6006. Front side bus bar 6028 is formed away from the right edge 6044 of the solar cell 6000, which is also along the left edge 6070 of discrete section 6016. The remainder of the front side bus bars 6020, 6022, 6024, and 6026 are unevenly spaced between the other front side bus bars 6018, 6028. Specifically, front side bus bar 6020 is formed along right edge 6056 of discrete section 6008, front side bus bar 6022 is formed along right edge 6060 of discrete section 6010, front side bus bar 6024 is formed along right edge 6064 of discrete section 6012, and front side bus bar 6026 is formed along left edge 6066 of discrete section 6014. Each front side bus bar 6018, 6020, 6022, 6024, 6026, and 6028 has finger lines extending away therefrom. Back side bus 6030, 6032, 6034, 6036, 6038, and 6040 are formed at corresponding opposite edge locations on the back side 6004 of the solar cell 6000, as shown in FIG. 61.

In yet another embodiment, a solar cell 6200 having six discrete sections 6206, 6208, 6210, 6212, 6214, and 6216 is illustrated in FIGS. 62 and 63. The discrete sections 6206, 6208, 6210, 6212, 6214, and 6216 are each patterned on the front side 6202 of the solar cell 6200 to include front side bus bars 6218, 6220, 6222, 6224, 6226, and 6228, and on the back side 6204 of the solar cell 6200 to include back side bus bars 6230, 6232, 6234, 6236, 6238, and 6240. Front side bus bar 6220 is formed at locations on the solar cell 6200 that is away from its left edge 6242, and in particular, along a right edge 6252 of discrete section 6206. Front side bus bar 6228 is formed away from the right edge 6244 of the solar cell 6200, which is also along the left edge 6270 of discrete section 6216. The remainder of the front side bus bars 6220, 6222, 6224, and 6226 are unevenly spaced between the other front side bus bars 6218, 6228. Specifically, front side bus bar 6220 is formed along right edge 6256 of discrete section 6208, front side bus bar 6222 is formed along right edge 6260 of discrete section 6210, front side bus bar 6224 is formed along left edge 6262 of discrete section 6212, and front side bus bar 6226 is formed along right edge 6268 of discrete section 6214. Each front side bus bar 6218, 6220, 6222, 6224, 6226, and 6228 has finger lines extending away therefrom. Back side bus 6230, 6232, 6234, 6236, 6238, and 6240 are formed at corresponding opposite edge locations on the back side 6204 of the solar cell 6200, as shown in FIG. 63.

In yet another embodiment, a solar cell 6400 having six discrete sections 6406, 6408, 6410, 6412, 6414, and 6416 is illustrated in FIGS. 64 and 65. The discrete sections 6406, 6408, 6410, 6412, 6414, and 6416 are each patterned on the front side 6402 of the solar cell 6400 to include front side bus bars 6418, 6420, 6422, 6424, 6426, and 6428, and on the back side 6404 of the solar cell 6400 to include back side bus bars 6430, 6432, 6434, 6436, 6438, and 6440. Front side bus bar 6418 is formed at locations on the solar cell 6400 that is away from its left edge 6442, and in particular, along a right edge 6452 of discrete section 6406. Front side bus bar 6428 is formed away from the right edge 6444 of the solar cell 6400, which is also along the left edge 6470 of discrete section 6416. The remainder of the front side bus bars 6420, 6422, 6424, and 6426 are unevenly spaced between the other front side bus bars 6418, 6426. Specifically, front side bus bar 6420 is formed along right edge 6456 of discrete section 6408, front side bus bar 6422 is formed along left edge 6458 of discrete section 6410, front side bus bar 6424 is formed along right edge 6464 of discrete section 6412, and front side bus bar 6426 is formed along right edge 6468 of discrete section 6414. Each front side bus bar 6418, 6420, 6422, 6424, 6426, and 6428 has finger lines extending away therefrom. Back side bus 6430, 6432, 6434, 6436, 6438, and 6440 are formed at corresponding opposite edge locations on the back side 6404 of the solar cell 6400, as shown in FIG. 65.

In still another embodiment, a solar cell 6600 having six discrete sections 6606, 6608, 6610, 6612, 6614, and 6616 is illustrated in FIGS. 66 and 67. The discrete sections 6606, 6608, 6610, 6612, 6614, and 6616 are each patterned on the front side 6602 of the solar cell 6600 to include front side bus bars 6618, 6620, 6622, 6624, 6626, and 6628, and on the back side 6604 of the solar cell 6600 to include back side bus bars 6630, 6632, 6634, 6636, and 6638, and 6640. Front side bus bar 6618 is formed at locations on the solar cell 6600 that is away from its left edge 6642, and in particular, along a right edge 6652 of discrete section 6606. Front side bus bar 6628 is formed away from the right edge 6644 of the solar cell 6600, which is also along the left edge 6670 of discrete section 6616. The remainder of the front side bus bars 6620, 6622, 6624, and 6628 are unevenly spaced between the other front side bus bars 66118, 6628. Specifically, front side bus bar 6620 is formed along left edge 6654 of discrete section 6608, front side bus bar 6622 is formed along right edge 6660 of discrete section 6610, front side bus bar 6624 is formed along right edge 6664 of discrete section 6612, and front side bus bar 6626 is formed along right edge 6668 of discrete section 6614. Each front side bus bar 6618, 6620, 6622, 6624, 6626, and 6628 has finger lines extending away therefrom. Back side bus 6630, 6632, 6634, 6636, 6638, and 6640 are formed at corresponding opposite edge locations on the back side 6604 of the solar cell 6600, as shown in FIG. 67.

In yet another embodiment, a solar cell 6800 having six discrete sections 6806, 6808, 6810, 6812, 6814, and 6816 is illustrated in FIGS. 68 and 69. The discrete sections 6806, 6808, 6810, 6812, 68614, and 6816 are each patterned on the front side 6802 of the solar cell 6800 to include front side bus bars 6818, 6820, 6822, 6824, 6826, and 6828, and on the back side 6804 of the solar cell 6800 to include back side bus bars 6830, 6832, 6834, 6836, 6838, and 6840. Front side bus bar 6818 is formed at locations on the solar cell 6800 that is away from its left edge 6842, and in particular, along a right edge 6852 of discrete section 6806. Front side bus bar 6828 is formed away from right edge 6844 of the solar cell 6800, which is also along the left edge 6870 of discrete section 6816. The remainder of the front side bus bars 6820, 6822, 6824, and 6826 are unevenly spaced between the other front side bus bars 6818, 6828. Specifically, front side bus bar 6820 is formed along right edge 6856 of discrete section 6808, front side bus bar 6822 is formed along right edge 6860 of discrete section 6810, front side bus bar 6824 is formed along left edge 6862 of discrete section 6812, and front side bus bar 6826 is formed along right edge 6866 of discrete section 6814. Each front side bus bar 6818, 6820, 6822, 6824, 6826, and 6828 has finger lines extending away therefrom. Back side bus 6830, 6832, 6834, 6836, 6838, and 6840 are formed at corresponding opposite edge locations on the back side 6804 of the solar cell 6800, as shown in FIG. 69.

Figures 70, 71:
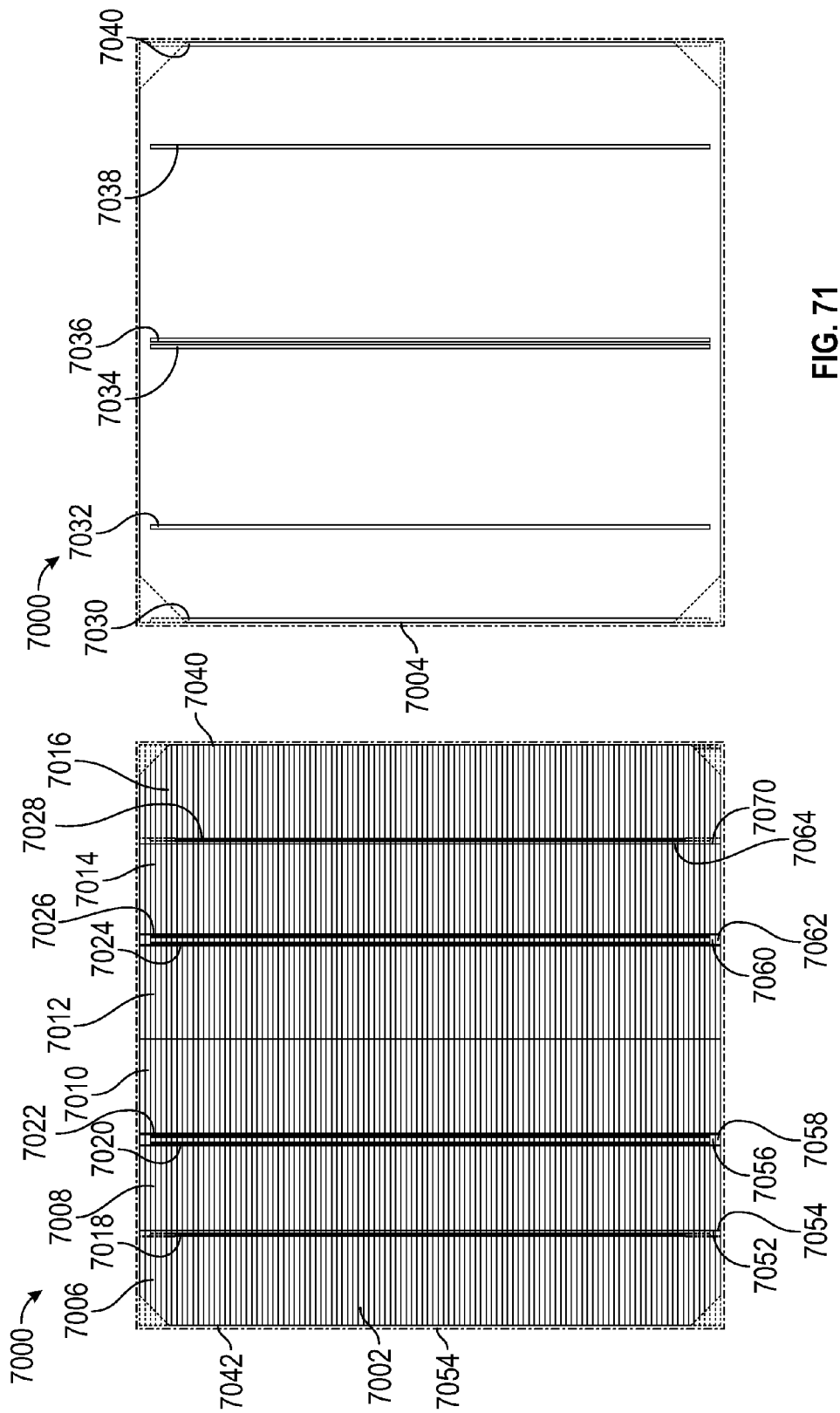

FIGS. 70 and 71 illustrate a solar cell 7000 having six discrete sections 7006, 7008, 7010, 7012, 7014, and 7016 in accordance with an embodiment. The discrete sections 7006, 7008, 7010, 7012, 7014, and 7016 are each patterned on the front side 7002 of the solar cell 7000 to include front side bus bars 7018, 7020, 7022, 7024, 7026, and 7028, and on the back side 7004 of the solar cell 7000 to include back side bus bars 7030, 7032, 7034, 7036, 7038, and 7040. Front side bus bar 7018 is formed at locations on the solar cell 7000 that is away from its left edge 7042, and in particular, along a right edge 7052 of discrete section 7006. Front side bus bar 7028 is formed away from right edge 7044 of the solar cell 7000, which is also along the left edge 7070 of discrete section 7016. The remainder of the front side bus bars 7020, 7022, 7024, and 7026 are unevenly spaced between the other front side bus bars 7018, 7028. Specifically, front side bus bar 7020 is formed along right edge 7056 of discrete section 7008, front side bus bar 7022 is formed along left edge 7058 of discrete section 7010, front side bus bar 7024 is formed along right edge 7060 of discrete section 7012, and front side bus bar 7024 is formed along left edge 7062 of discrete section 7014. Each front side bus bar 7018, 7020, 7022, 7024, 7026, and 7028 has finger lines extending away therefrom. Back side bus 7030, 7032, 7034, 7036, 7038, and 7040 are formed at corresponding opposite edge locations on the back side 7004 of the solar cell 7000, as shown in FIG. 71.

In another embodiment, FIGS. 72 and 73 illustrate a solar cell 7000 having six discrete sections 7206, 7208, 7210, 7212, 7214, and 7216. The discrete sections 7206, 7208, 7210, 7212, 7214, and 7216 are each patterned on the front side 7202 of the solar cell 7200 to include front side bus bars 7218, 7220, 7222, 7224, 7272, and 7228, and on the back side 7204 of the solar cell 7200 to include back side bus bars 7230, 7232, 7234, 7236, 7238, and 7240. Front side bus bar 7218 is formed at locations on the solar cell 7200 that is away from its left edge 7242, and in particular, along a right edge 7252 of discrete section 7206. Front side bus bar 7228 is formed away from the right edge 7244 of the solar cell 7200, which is also along the left edge 7270 of discrete section 7216. The remainder of the front side bus bars 7220, 7222, 7224, and 7226 are unevenly spaced between the other front side bus bars 7218, 7228. Specifically, front side bus bar 7220 is formed along left edge 7254 of discrete section 7208, front side bus bar 7222 is formed along right edge 7260 of discrete section 7210, front side bus bar 7224 is formed along right edge 7264 of discrete section 7212, and front side bus bar 7226 is formed along left edge 7266 of discrete section 7214. Each front side bus bar 7218, 7220, 7222, 7224, 7226, and 7228 has finger lines extending away therefrom. Back side bus 7230, 7232, 7234, 7236, 7238, and 7240 are formed at corresponding opposite edge locations on the back side 7204 of the solar cell 7200, as shown in FIG. 73.

In accordance with another embodiment, FIGS. 74 and 75 illustrate a solar cell 7400 having six discrete sections 7406, 7408, 7410, 7412, 7414, 7416. The discrete sections 7406, 7408, 7410, 7412, 7414, and 7416 are each patterned on the front side 7402 of the solar cell 7400 to include front side bus bars 7418, 7420, 7422, 7424, 7426, and 7428, and on the back side 7404 of the solar cell 7400 to include back side bus bars 7430, 7432, 7434, 7436, 7438, and 7440. Front side bus bar 7418 is formed at locations on the solar cell 7400 that is away from its left edge 7442, and in particular, along a right edge 7452 of discrete section 7406. Front side bus bar 7428 is formed away from the right edge 7444 of the solar cell 7400, which is also along the left edge 7470 of discrete section 7416. The remainder of the front side bus bars 7420, 7422, 7424, and 7426 are unevenly spaced between the other front side bus bars 7418, 7428. Specifically, front side bus bar 7420 is formed along right edge 7454 of discrete section 7408, front side bus bar 7422 is formed along right edge 7460 of discrete section 7410, front side bus bar 7424 is formed along left edge 7462 of discrete section 7412, and front side bus bar 7426 is formed along right edge 7468 of discrete section 7414. Each front side bus bar 7418, 7420, 7422, 7424, 74726, 7428 and has finger lines extending away therefrom. Back side bus 7430, 7432, 7434, 7436, 7438, and 7440 are formed at corresponding opposite edge locations on the back side 7404 of the solar cell 7400, as shown in FIG. 75.

According to another embodiment, FIGS. 76 and 77 illustrate a solar cell 7000 having six discrete sections 7606, 7608, 7610, 7612, 7614, and 7616. The discrete sections 7606, 7608, 7610, 7612, 7614, and 7616 are each patterned on the front side 7602 of the solar cell 7600 to include front side bus bars 7618, 7620, 7622, 7624, 7626, and 7628, and on the back side 7604 of the solar cell 7600 to include back side bus bars 7630, 7632, 7634, 7636, 7638, and 7640. Front side bus bar 7618 is formed at locations on the solar cell 7600 that is away from its left edge 7642, and in particular, along a right edge 7652 of discrete section 7606. Front side bus bar 7628 is formed away from the right edge 7644 of the solar cell 7600, which is also along the left edge 7670 of discrete section 7616. The remainder of the front side bus bars 7620, 7622, 7624, and 7626 are unevenly spaced between the other front side bus bars 7618, 7628. Specifically, front side bus bar 7618 is formed along left edge 7654 of discrete section 7608, front side bus bar 7622 is formed along left edge 7658 of discrete section 7610, front side bus bar 7624 is formed along right edge 7664 of discrete section 7612, and front side bus bar 7626 is formed along right edge 7668 of discrete section 7614. Each front side bus bar 7618, 7620, 7622, 7624, 7626, and 7628 has finger lines extending away therefrom. Back side bus 7630, 7632, 7634, 7636, 7638, and 7640 are formed at corresponding opposite edge locations on the back side 7604 of the solar cell 7600, as shown in FIG. 77.

No matter the particular configuration, the solar cell is ultimately used to form a solar module. In this regard, with reference to FIG. 78, a solar cell is obtained at step 7802 of method 7800. In an embodiment, the solar cell is tested, for example, using flash testing. In embodiments of solar cells including 5 strips, by grouping two bus-bars adjacent each other on the front side of the solar cell, three sets of probes can be used to contact bus-bars in flash testing, which may reduce the impact of shadow produced by the probes when a light is shined on the solar cell. Similarly, in embodiments in which 6 strips are included, by grouping two bus-bars adjacent each other, only five sets of probes may be used in flash testing instead of six probes; alternatively, by grouping two sets of bus-bars adjacent each other, only four sets of probes (rather than six probes) may be used in flash testing.

Figure 79:
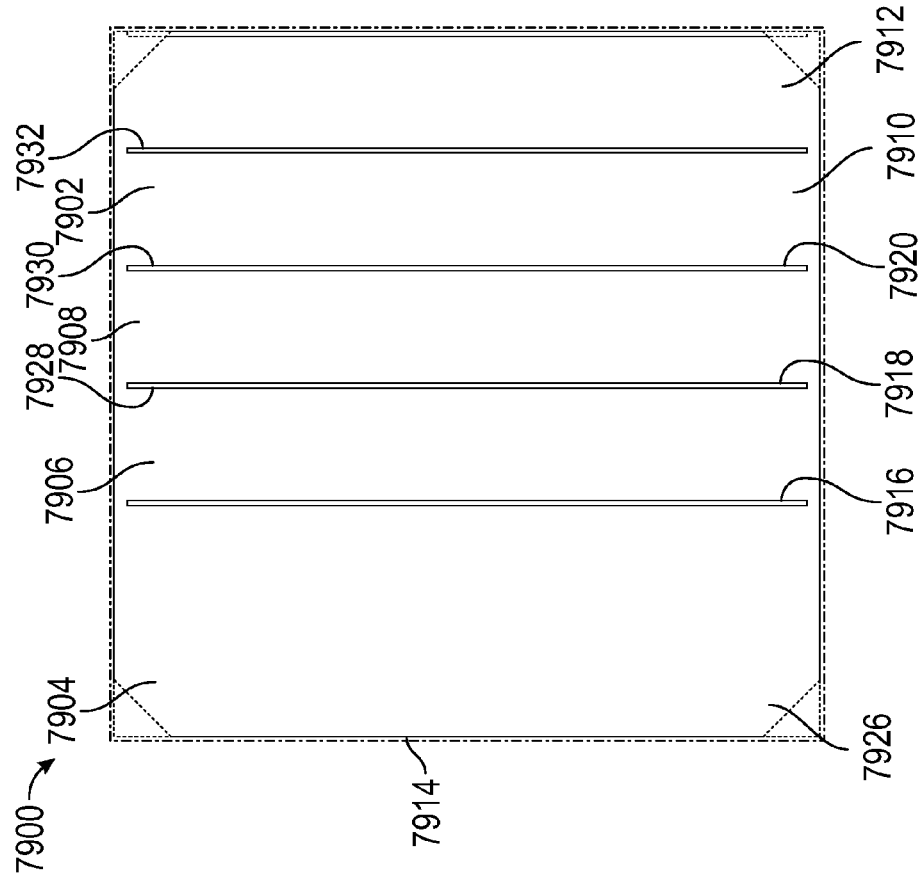
FIG. 79 is a back side view of a solar cell including scribe lines, according to an embodiment.
Figure 80:
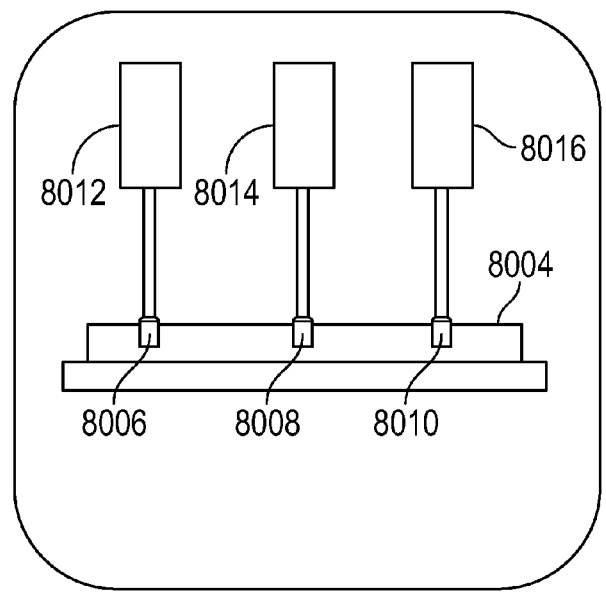
FIG. 80 is a simplified schematic of a step of the method depicted in FIG. 78 during which scribing of the solar cell is performed, in accordance with an embodiment.
Figure 81:
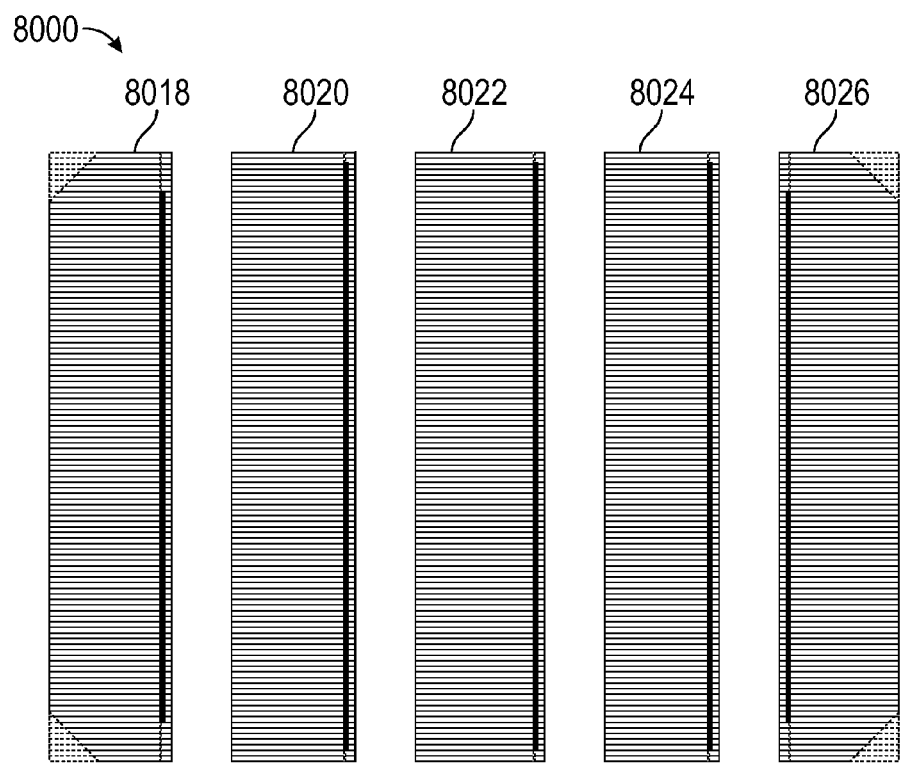
FIG. 81 is a front side view of the solar cell of FIG. 79 after singulation, according to an embodiment.

The solar cell is cut at step 7804. Specifically, scribe lines are formed into the back surface of the solar cell so that when the solar cell is broken, the split occurs in the gap on the front surface of the solar cell between the discrete cells. Each scribe line has a depth of between about 10% and about 90% of wafer thickness. In an embodiment, the scribe lines extend across the solar cell from edge to edge. In another embodiment, one or both of the scribe lines extends from one edge to just short of an opposite edge of the solar cell. An exemplary embodiment of a scribed solar cell 7900 is illustrated in FIG. 79. As shown, the scribed solar cell 7900 has a back side 7902 having five discrete sections 7904, 7906, 7908, 7910, 7912, with back side bus bars 7914, 7916, 7918, 7920, 7922, 7924. Scribe lines 7926, 7928, 7930, 7932 are formed between corresponding discrete sections 7904, 7906, 7908, 7910, 7912. Although five discrete sections are included, more or fewer are included in other embodiments of the solar cell. The scribe lines may be formed using a laser, a dicing saw and the like. In an embodiment, as illustrated in FIG. 80, a solar cell 8000 is placed on a platform 8002 back side 8004 facing up so that scribe lines 8006, 8008, 8010 of the solar cell 8000 may be formed. One or more lasers 8012, 8014, 8016 are aligned at locations on the solar sell to form the scribe lines 8006, 8008, 8010 to thereby allow the solar cell 8000 to be singulated into strips. A front side view of the solar cell 8000 singulated into strips 8018, 8020, 8022, 8024, 8026 is illustrated in FIG. 81.

Next, the cut solar cell is split at step 7806. In an embodiment in which the solar cell may be singulated, the solar cell is placed on a vacuum chuck including a plurality of fixtures which are aligned adjacent each other to form a base. The vacuum chuck is selected so that the number of fixtures matches the number of discrete sections of the solar cell to be singulated into strips. Each fixture has apertures or slits, which provide openings communicating with a vacuum. The vacuum, when desired, may be applied to provide suction for mechanically temporarily coupling the solar cell to the top of the base. To singulate the solar cell, the solar cell is placed on the base such that the each discrete section is positioned on top of a corresponding one of the fixtures. The vacuum is powered on and suction is provided to maintain the solar cell in position on the base. Next, all of the fixtures move relative to each other. In an embodiment, multiple ones of the fixtures move a certain distance away from neighboring fixtures thereby causing the discrete sections of the solar cell to likewise move from each other and form resulting strips. In another embodiment, multiple ones of the fixtures are rotated or twisted relative to their longitudinal axes thereby causing the discrete sections of the solar cell to likewise move and form resulting strips. The rotation or twisting of the fixtures may be effected in a predetermined sequence, in an embodiment, so that no strip is twisted in two directions at once. In still another embodiment, mechanical pressure is applied to the back surface of the solar cell to substantially simultaneously break the solar cell into the strips. It will be appreciated that in other embodiments, other processes by which the solar cell is singulated alternatively may be implemented.

After the solar cell is singulated, the strips are sorted in step 7808. In particular, as shown in FIG. 81, the left-most and right-most strips 8018, 8026 have chamfered corners and, as a result, have dimensions that are different from strips 8020, 8022, 8024, which have non-chamfered corners and substantially identical dimensions. In an embodiment, sorting strips is achieved using an auto-optical sorting process. In another embodiment, the strips are sorted according to their position relative to the full solar cell. After sorting, strips 8018, 8026 having chamfered corners are segregated from those strips 8020, 8022, 8024 having non-chamfered corners. During sorting, strips can be arranged to align the bus bars into desired positions.

Figure 78:
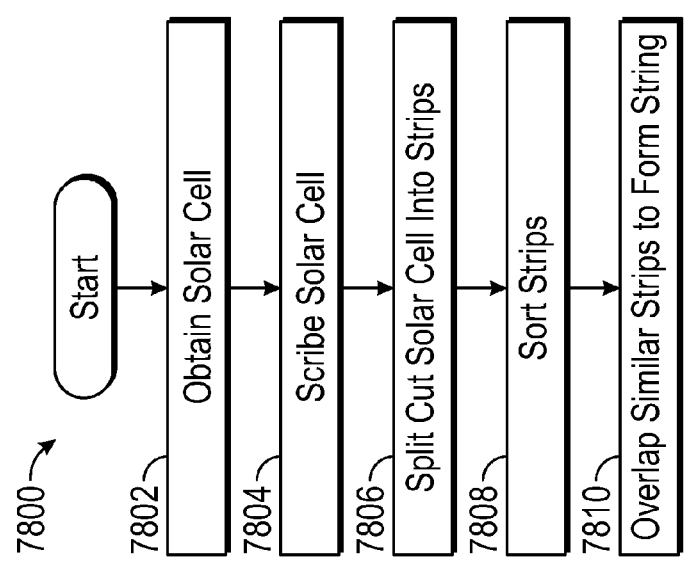
FIG. 78 is a flow diagram of a method of forming a string of solar cell strips, according to an embodiment.

With continued reference to FIG. 78, similarly dimensioned strips are then overlapped to form a string in step 7810. In an embodiment, an electrically-conductive adhesive 8202 is applied to a front surface of the strip 8204 along an edge of that is opposite the edge along which its back side bus bar is formed, as depicted in FIG. 82. In another embodiment, the electrically-conductive adhesive is applied to a back surface of the strip on the back side bus bar. The adhesive may be applied as a single continuous line, as a plurality of dots, dash lines, for example, by using a deposition-type machine configured to dispense adhesive material to a bus bar surface. In an embodiment, the adhesive is deposited such that it is shorter than the length of a corresponding bus bar and has a width and thickness to render sufficient adhesion and conductivity. After the adhesive is deposited onto the strip 8204, the strip 8204 and a second, similarly dimensioned strip 8206 are aligned such that the back side bus bar of one strip 8206 overlaps with the front side bus bar of the other strip 8204, or alternatively, the front side bus bar of one strip overlaps with the back side bus bar of another. The steps of applying adhesive and aligning and overlapping the strips are repeated until a desired number of strips are adhered to form the string. In an embodiment, the string includes 15 to 100 strips. Although step 7810 is described as being performed on two strips, one or both of the strips may be pre-adhered to one or more other strips.

FIG. 83 illustrates a string 8300 of chamfered corner strips 8302, 8304, 8306 where the back side bus bar of each strip 8302, 8304, 8306 overlaps and is disposed over the front side bus bar of an adjacent strip. Here, 15 to 100 strips make up the string 8300. An end of the string 8300 includes a metal foil soldered or electrically connected to the bus bar of each end strip which will be further connected to a module interconnect bus bar so that two or more strings together form the circuit of a solar module, as will be discussed in detail in subsequent paragraphs below. In another embodiment, the module interconnect busbar can be directly soldered or electrically connected to the bus bar of the end strip to form the circuit. In another embodiment as illustrated in FIG. 84, non-chamfered strips 8402, 8404, 8406 are adhered to each other to form a string 8400. Similar to the string 8300 shown in FIG. 83, the string 8400 in FIG. 84 includes 15 to 100 strips and each strip is overlapped such that the back side bus bar of each strip overlaps and is disposed over the front side bus bar of an adjacent strip. The string 8400 of FIG. 84 also includes electrical connections for coupling to another similarly configured string. No matter the particular configuration, the strings 400, 8300, 8400 may include more or fewer strips.

Figure 85A:
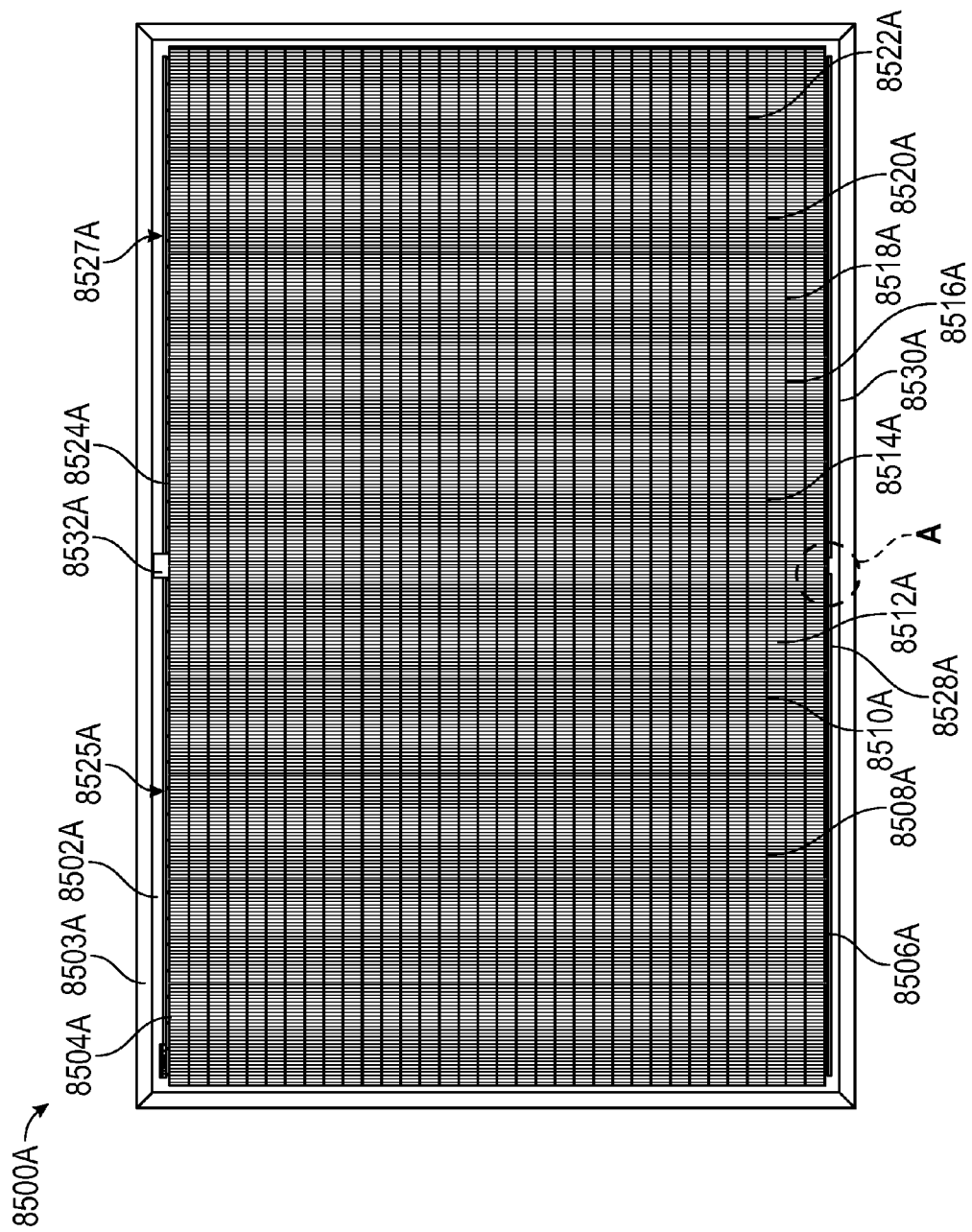
FIGS. 85A-85C are front side views of a solar module, according to various embodiments.
Figure 86A:
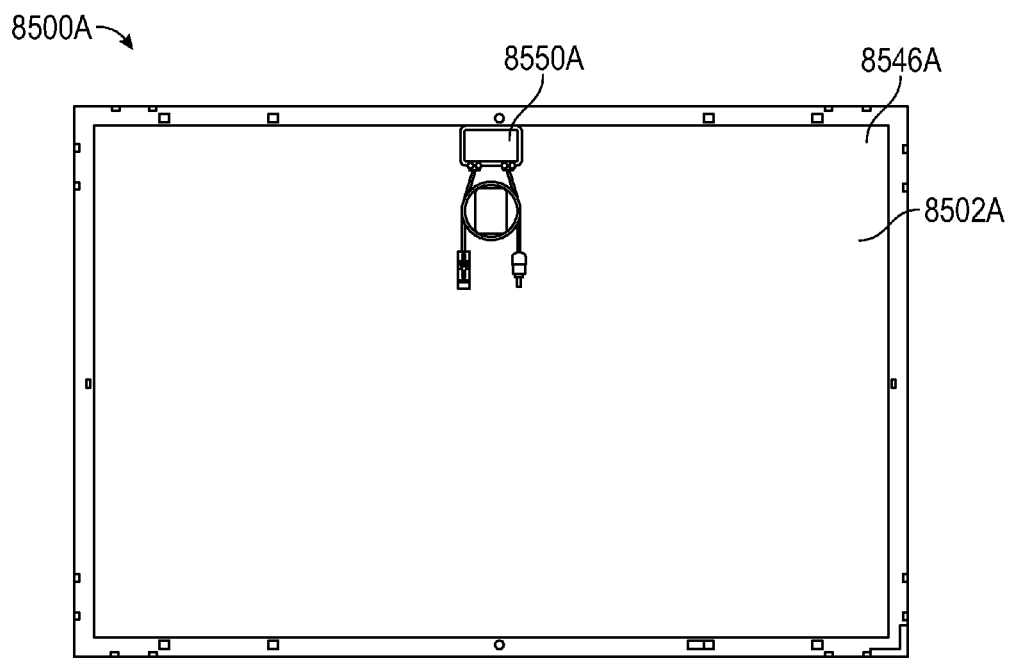
FIGS. 86A and 86B are back side views of the solar modules of FIGS. 85A-85C, according to various embodiments.

FIGS. 85A and 86A are front and back views, respectively, of a solar module 8500A in accordance with an embodiment. As noted briefly above, the solar module 8500A includes a back sheet 8502A and a frame 8503A surrounding all four edges of the back sheet 8502A. The back sheet 8502A is formed from polymer material, and the frame 8503A is formed from anodized aluminum or another lightweight rigid material.

Strings 8504A, 8506A, 8508A, 8510A, 8512A, 8514A, 8516A, 8518A, 8520A, 8522A of strips, ten of which are shown here, are disposed over the back sheet 8502A. Although not specifically depicted, it will be appreciated that a glass layer is disposed over the strips and electrical connections associated therewith for protective purposes. Here, the strips are non-chamfered and have squared-off corners. The strings 8504A, 8506A, 8508A, 8510A, 8512A, 8514A, 8516A, 8518A, 8520A, 8522A are disposed side-by-side lengthwise, and as a result, each strip in each string extends along the back sheet 8502A lengthwise so that the strips extend end-to-end.

Figure 87:
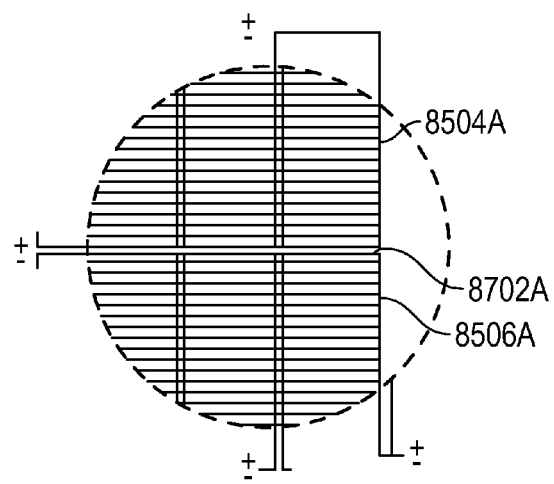
FIG. 87 is a close-up view of a portion of the solar module of FIG. 85A bounded by circle A.

In an embodiment, the edges of two adjacent strings 8504A, 8506A, 8508A, 8510A, 8512A, 8514A, 8516A, 8518A, 8520A, 8522A may be spaced apart providing a gap therebetween. As illustrated in FIG. 87, which is a close up view of a portion of the solar module 8500A encircled by "A", a gap 8702A has a uniform width between the two adjacent strings 8504A, 8506A in a range of between about 1 mm and about 5 mm. In another embodiment, the edges of two or more of the strings 8504A, 8506A, 8508A, 8510A, 8512A, 8514A, 8516A, 8518A, 8520A, 8522A are immediately adjacent each other.

Figure 88:
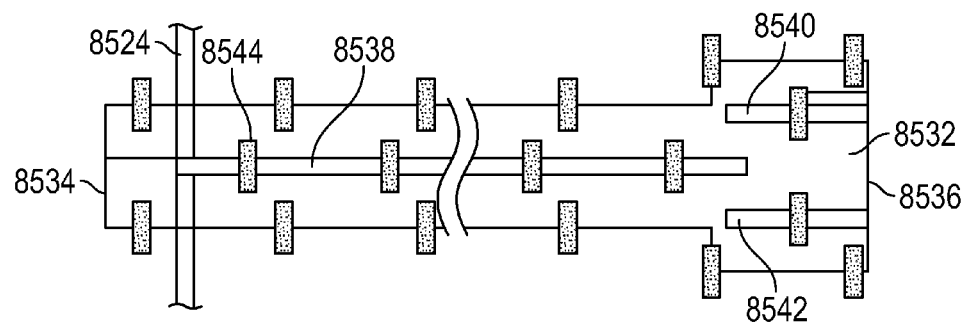
FIG. 88 is a plan view of an isolation strip included in the solar module of FIG. 85A, according to an embodiment.

The strings 8504A, 8506A, 8508A, 8510A, 8512A, 8514A, 8516A, 8518A, 8520A, 8522A are electrically coupled to the top bus bar 8524 and the bottom bus bars 8528A, 8530A each extending a length of the back sheet 8502A on opposite edges. In an embodiment, a first string set 8525A of five strings 8504A, 8506A, 8508A, 8510A, 8512A is connected via the top bus bar 8524 and bottom bus bar 8528A, while a second string set 8527A making up the other five strings 8514A, 8516A, 8518A, 8520A, 8522A is connected via top bus bar and bottom bus bar 8530A. Each connection includes a conductive ribbon material adhered at one end to a corresponding strip and at another end to a corresponding bus bar. In this way, the strings 8504A, 8506A, 8508A, 8510A, 8512A of the first string set 8525A are connected in parallel, the strings 8514A, 8516A, 8518A, 8520A, 8522A of the second string set 8527A are connected in parallel, while the string sets 8525A, 8527A themselves are connected in series. An isolation strip 8532A (shown in FIG. 88) is disposed between the two string sets 8525A, 8527A to provide support between the string sets 8525A, 8527A. The isolation strip 8532A is greater in length than the strings and is sufficiently wide to permit the adjacent strings 8512A, 8514A of the two string sets 8525A, 8527A, respectively, to overlap a portion of the isolation strip 8532A. As detailed in FIG. 88, in an embodiment, the isolation strip 8532A has a squared off end 8534A and a tabbed end 8536A being wider than the squared off end 8534A. The squared off end extends past the strings 8512A, 8514A, in an embodiment, and a portion of the top bus bar 8524A is disposed across its width. An electrically conductive ribbon 8538A extends substantially perpendicularly from the top bus bar 8524A along almost an entire length of the isolation strip down a middle of the tabbed end 8536A terminating just beyond where the tabbed end 8536A begins. Two additional electrically conductive ribbons 8540A, 8542A are disposed over the tabbed end 8536A on either side of the electrically conductive ribbon 8538A. The additional electrically conductive ribbons 8540A, 8542A serve as hidden interconnects to connect the strings 8525A, 8527A to a junction box 8550. Fix tape 8544A is used to maintain the isolation strip 8532A and the conductive ribbons 8538A, 8540A, 8542A in position relative to the strings 8512A, 8514A. In accordance with one embodiment, the series connection of the first string set 8525A to the second string set 8527A can be made by attaching the negative side of the first string set 8525A and the positive side of the second string set 8527A to a common bus bar. Alternatively, positive sides of both the first and second string sets 8525A and 8527A may be placed on the same side of the solar module and a cable, wire, or other connector may be used to electrically connect the negative side of the first string set 8525A to the positive side of the second string set 8527A. This second configuration promotes efficiency in manufacturing by allowing all string sets to be placed in the solar module without reorientation of one of them, and reduces the size of the bus bars, as well as making all bus bars of similar length rather than having one side be long and the other side formed of two short bus bars, thus reducing the number of components of the entire module.

As shown in FIG. 86A, a back side 8546A of the solar module 8500A includes the back sheet 8502A to which a junction box 8550A is attached. In an embodiment, the junction box 8550A does not include a bypass diode. In another embodiment, the junction box 8550A includes one or more bypass diodes disposed therein.

Figure 85B:
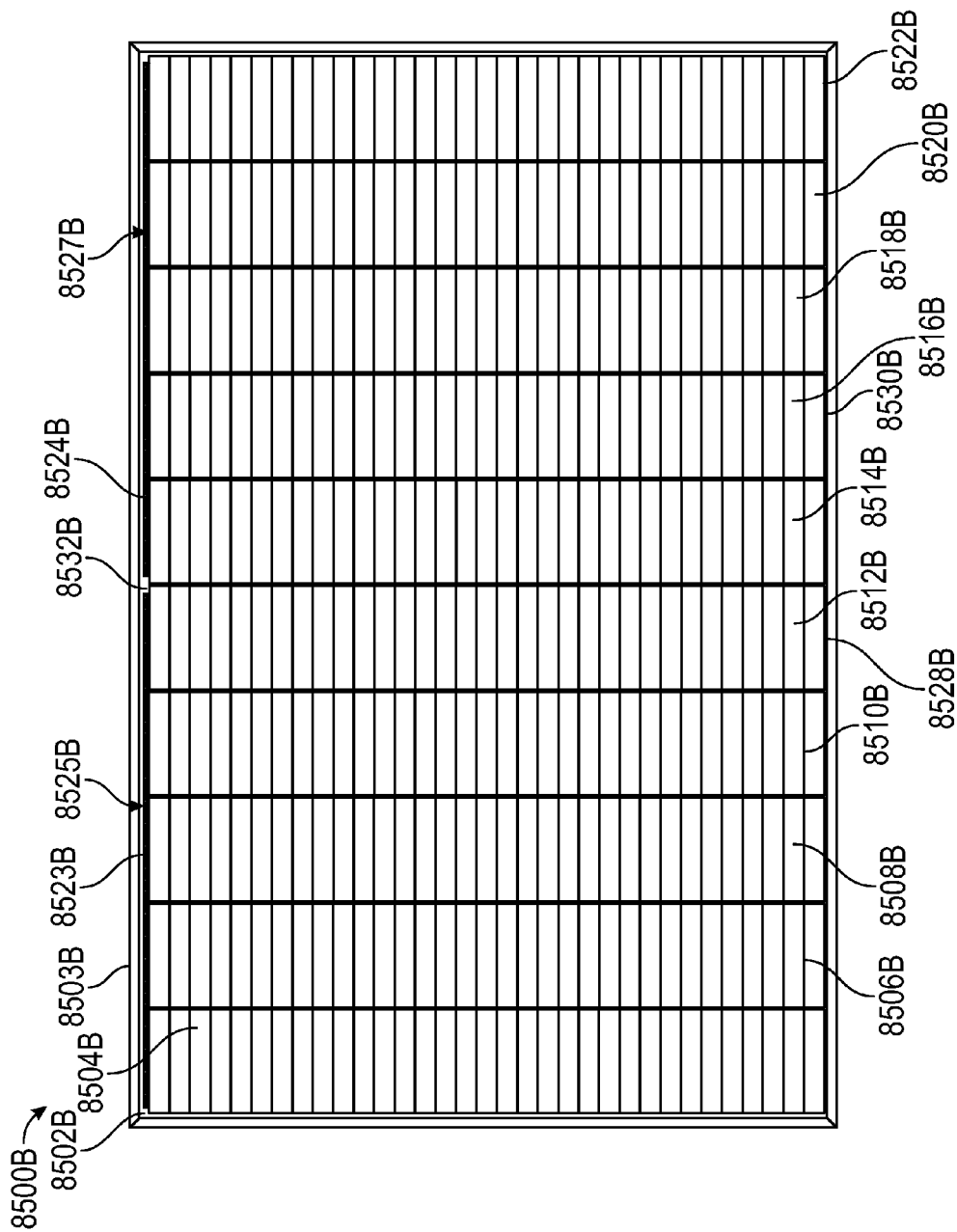
Figure 86B:
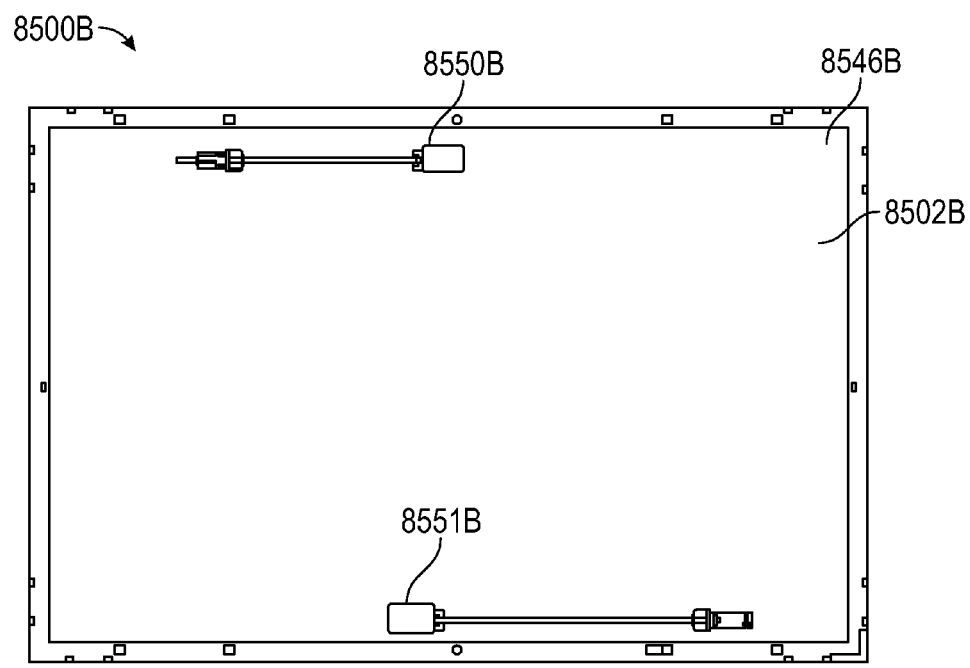

FIGS. 85B and 86B are front and back views, respectively, of a solar module 8500B in accordance with another embodiment. Here, the solar module 8500B includes a back sheet 8502B and a frame 8503B surrounding all four edges of the back sheet 8502B. The back sheet 8502B is formed from polymer material, and the frame 8503B is formed from anodized aluminum.

Strings 8504B, 8506B, 8508B, 8510B, 8512B, 8514B, 8516B, 8518B, 8520B, 8522B of strips, ten of which are shown here, are disposed over the back sheet 8502B, and configured in a manner similar to those of solar module 8500A. The strips are rectangular in shape and are typically covered by a glass layer 8505B and an adhesive layer 8507B (both shown in FIGS. 95 and 96).

Figure 94:
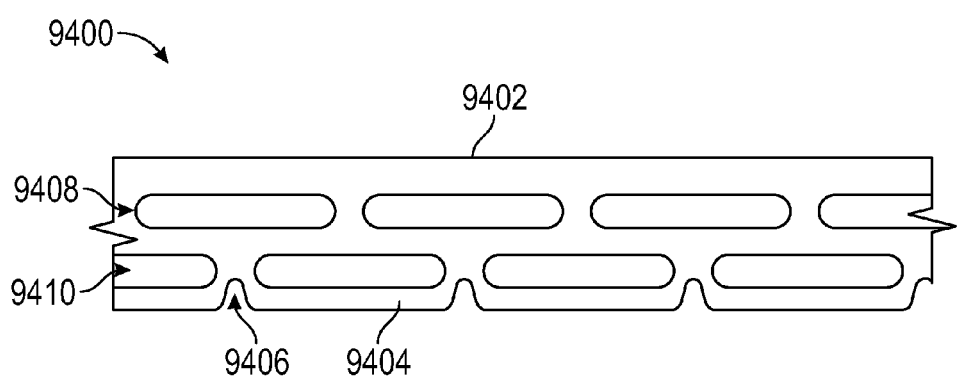
FIG. 94 is a top view of a ribbon configuration of a bus bar, in accordance with an embodiment.

The strings 8504B, 8506B, 8508B, 8510B, 8512B, 8514B, 8516B, 8518B, 8520B, 8522B are electrically coupled to top bus bars 8523B, 8524B (FIG. 95) along one edge and bottom bus bars 8528B, 8530B along an opposite edge. Specifically, strings 8504B, 8506B, 8508B, 8510B, 8512B are coupled to one top bus bar 8523B along one edge, and bus bar 8528B along an opposite edge to form a first string set 8525B, and strings 8514B, 8516B, 8518B, 8520B, 8522B are coupled to a separate bus bar 8524B along one edge, and bus bar 8530B along an opposite edge to form a second string set 8527B. The bus bars 8523B, 8524B, 8528B, 8530B are each in the form of a ribbon, in an embodiment. In another embodiment, each connection includes a conductive ribbon material adhered at one end to a corresponding strip and at another end to a corresponding bus bar. FIG. 94 is a top view of a ribbon configuration of a bus bar 9400, in accordance with an embodiment. The ribbon bus bar 9400 is in the form of a thin metallized tape having a solid edge 9402 disposed substantially parallel with a long edge of the module 8500B and a notched edge 9404 that is disposed closest to the strings (for example, strings 8504B, 8506B, 8508B, 8510B, 8512B or strings 8514B, 8516B, 8518B, 8520B, 8522B). Notches 9406 formed along the notched edge 9404 are substantially equally spaced along the length of the ribbon bus bar 9400, in an embodiment so that when the corresponding strips of the strings are soldered to the ribbon bus bar 9400, soldering stresses are reduced. Otherwise, high soldering stresses could cause unwanted microcracks in one or more of the strips, which could affect product yield and reliability. In another embodiment, the notches 9406 are unequally spaced. Openings formed in two substantially parallel rows 9408, 9410 are included in the ribbon bus bar 9400, where the openings of one row 9408 are located between adjacent notches 9406, and each opening of the other row 9410 is located over a corresponding notch 9406.

When formed as ribbon bus bar 9400, the bus bars 8524B, 8525B, 8528B, 8530B, if exposed, may be covered with an electrically insulative tape. The tape may have a color that matches the color of the backsheet 8502B so that the bus bars 8524B, 8525B, 8528B, 8530B are not visible to the human eye.

Figure 95:
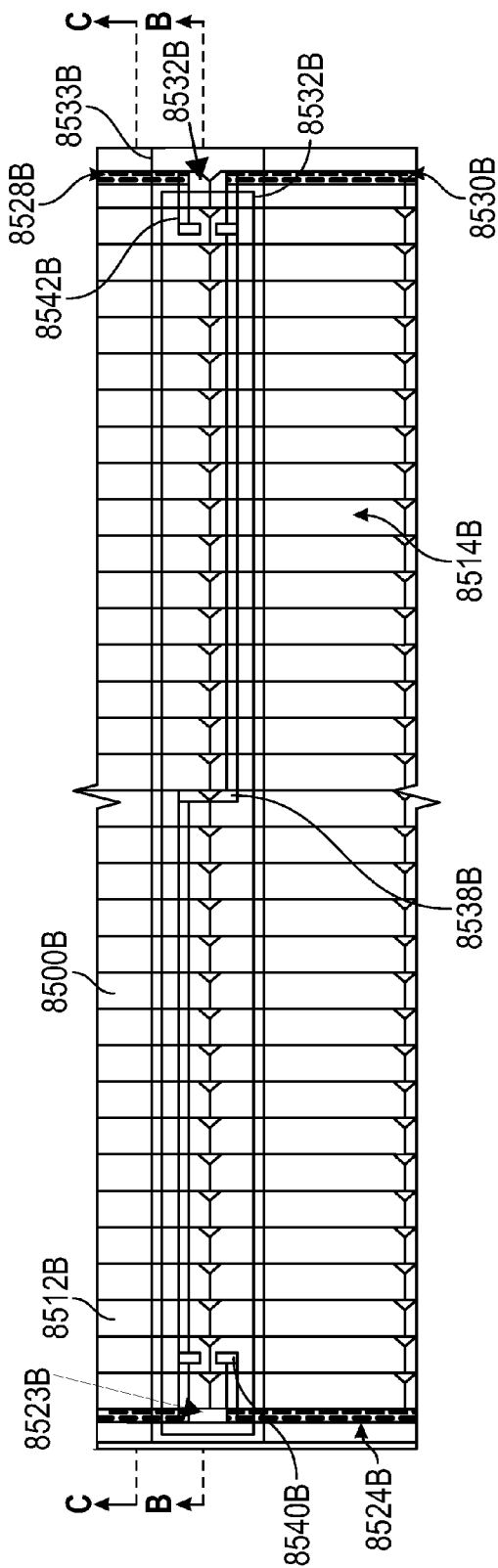
FIG. 95 is a close up view of a portion of the solar module in FIG. 85B, illustrating an isolation strip and associated electrical connections, according to an embodiment.

Similar to module 8500A, the strings 8504B, 8506B, 8508B, 8510B, 8512B of the first string set 8525B in module 8500B are connected in parallel, the strings 8514B, 8516B, 8518B, 8520B, 8522B of the second string set 8527B in module 8500B are connected in parallel, while the string sets 8525B, 8527B themselves are connected in series. FIG. 95 is a close up view of a portion of a back side of the module 8500B with the back sheet 8502B removed, illustrating an isolation strip 8532B and associated electrical connections configured to be disposed between the two string sets 8525B, 8527B shown in phantom to electrically connect and structurally support the string sets 8525B, 8527B. As will be appreciated, the isolation strip 8532B and associated electrical connections are disposed underneath adjacent strings 8514B, 8516B. In an embodiment, the isolation strip 8532B is a cut portion of the back sheet 8502B and disposed between an adhesive layer 8533B and a remainder of the back sheet 8502B. The adhesive layer 8533B may be formed from ethylene vinyl acetate (EVA) or another hot melt type of adhesive. The isolation strip 8532B may be greater in length than the strings. In another embodiment, the isolation strip 8532B is sufficiently wide to permit the adjacent strings 8512B, 8514B of the two string sets 8525B, 8527B, respectively, to overlap a portion of the isolation strip 8532B. As detailed in FIG. 95, in an embodiment, the isolation strip 8532B is rectangular. One end extends past the strings 8512B, 8514B, in an embodiment so that a portion of each of two of the top bus bars 8523B, 8524B is disposed across a portion of its width. The other end is covered by the strings 8512B, 8514B.

With additional reference to FIG. 96, which is a cross section, exploded view of module 8500B illustrated in FIG. 95 taken along line B-B except including back sheet 8502B, an electrically conductive ribbon 8538B extends substantially perpendicularly from top bus bar 8523B behind string 8512B and about half down the length of the isolation strip and makes a turn to extend behind string 8514B to connect to bottom bus bar 8530B. In this way, a terminal of string 8512B having a polarity may be connected directly to a terminal of string 8514B having an opposite polarity. Two additional electrically conductive ribbons 8540B, 8542B are included to provide connection to junction boxes 8550B, 8551B (FIG. 86B), each serving as terminals having opposite polarity. In this regard, ribbon 8540B extends from top bus bar 8524B and ribbon 8542B extends from bottom bus bar 8528B so that each conductive ribbon 8540B, 8542B serves as hidden interconnects to connect the strings 8525, 8527 to a junction boxes 8550B, 8551B. Fix tape (not shown) is included to maintain the conductive ribbons 8538B, 8540B, 8542B in position on the isolation strip 8532B relative to the strings 8512B, 8514B.

Along other areas of module 8500B away from the electrically conductive ribbon 8538B, for example as shown in FIG. 97, which is a cross section, exploded view of module 8500B illustrated in FIG. 95 taken along line C-C, the solar module 8500B includes the glass layer 8505, the adhesive layer 8533B, a top bus bar 8523B at one end of string set 8512B, and a bottom bus bar 8530B at an opposite end of string set 8512, another adhesive layer 8533B, and back sheet 8502B.

As shown in FIG. 86B, a back side 8546B of the solar module 8500B includes the backsheet 8502B to which two junction boxes 8550B, 8551B are attached. In an embodiment, the junction boxes 8550B, 8551B do not include a bypass diode. In another embodiment, one or both of the junction boxes 8550B, 8551B includes one or more bypass diodes disposed therein.

Figure 85C:
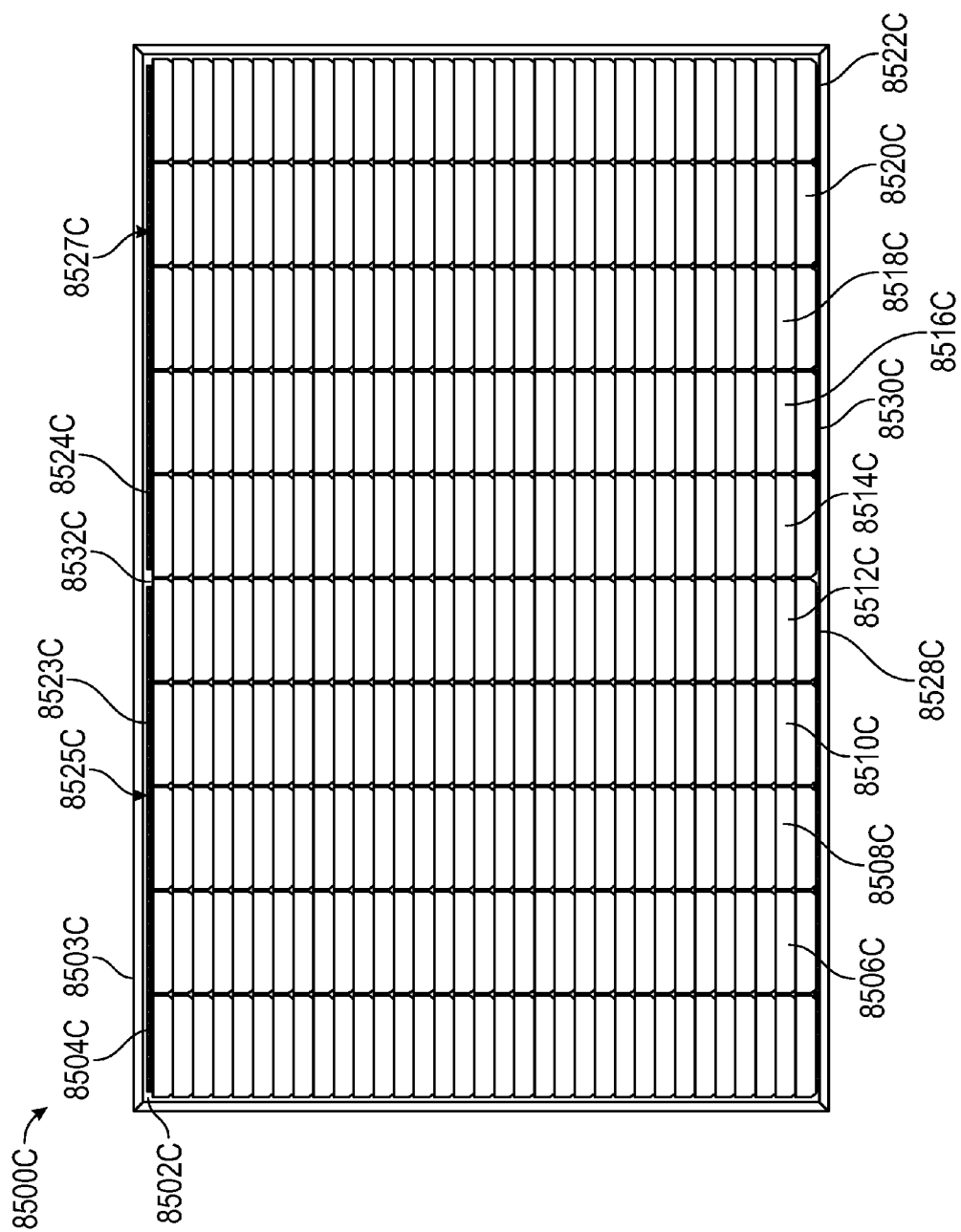

FIG. 85C is a front views of a solar module 8500C in accordance with another embodiment. Here, the solar module 8500C includes a back sheet 8502C and a frame 8503C surrounding all four edges of the back sheet 8502C, and includes strings 8504C, 8506C, 8508C, 8510C, 8512C, 8514C, 8516C, 8518C, 8520C, 8522C of strips. Module 8500C is formed substantially identical manner as module 8500A, except that the strips included in the strings are chamfered. The back view of solar module 8500C is identical to that of solar module 8500B.

As alluded to above, the solar module 8500 may incorporate any one of numerous electrical configurations. For example, turning to FIG. 89, an electrical schematic for solar module 8500 is provided, where ten strings 8900A-8900J are grouped into two sets of strings. The strings of the first set of strings 8902A are connected in parallel with each other and includes a bypass diode 8904A. Similarly, the strings of the second set of strings 8902B are connected in parallel with each other and includes a bypass diode 8904B. The two sets of strings 8902A, 8902B are connected in series with each other.

Figure 89:
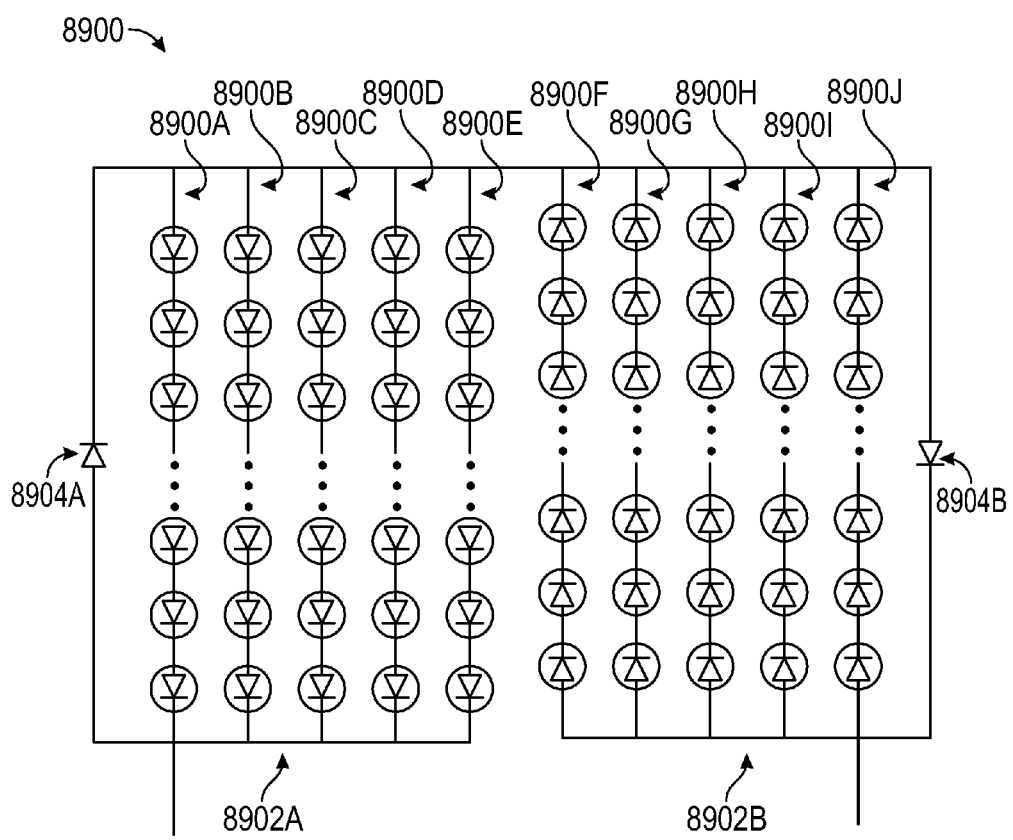
FIG. 89 is an electrical schematic for a solar module, according to an embodiment.
Figure 90:
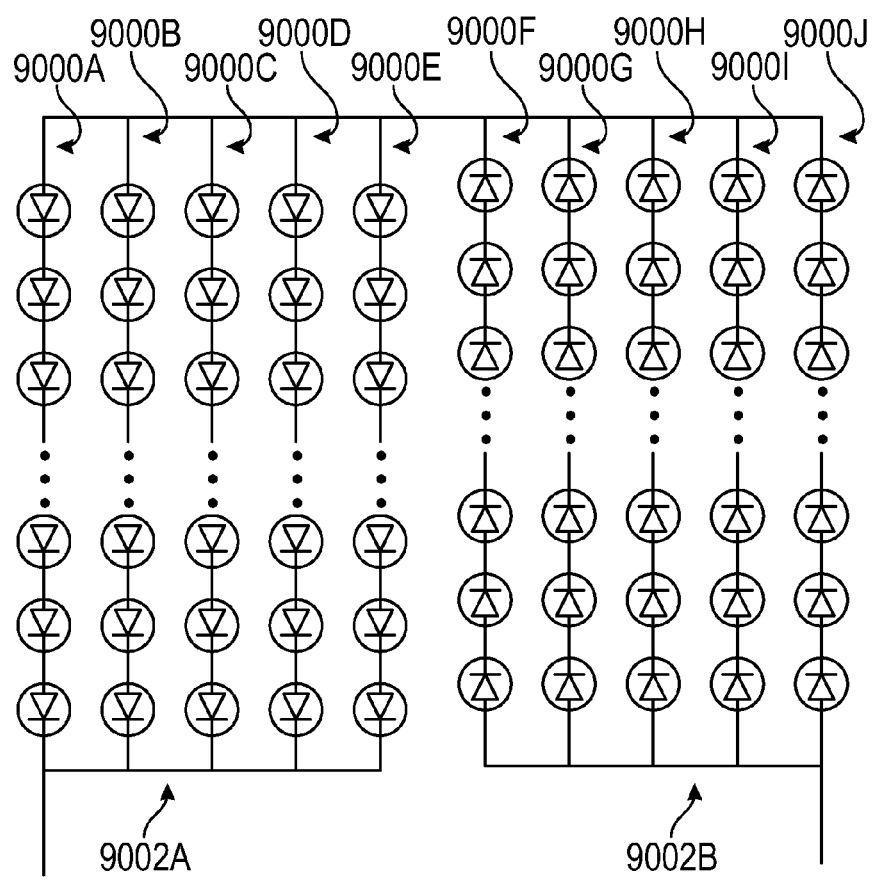
FIG. 90 is an electrical schematic for a solar module, according to another embodiment.

In another embodiment as illustrated in FIG. 90, an electrical schematic for solar module 8500 is provided that is identical to the electrical schematic provided in FIG. 89, except no bypass diodes are included.

Figure 91:
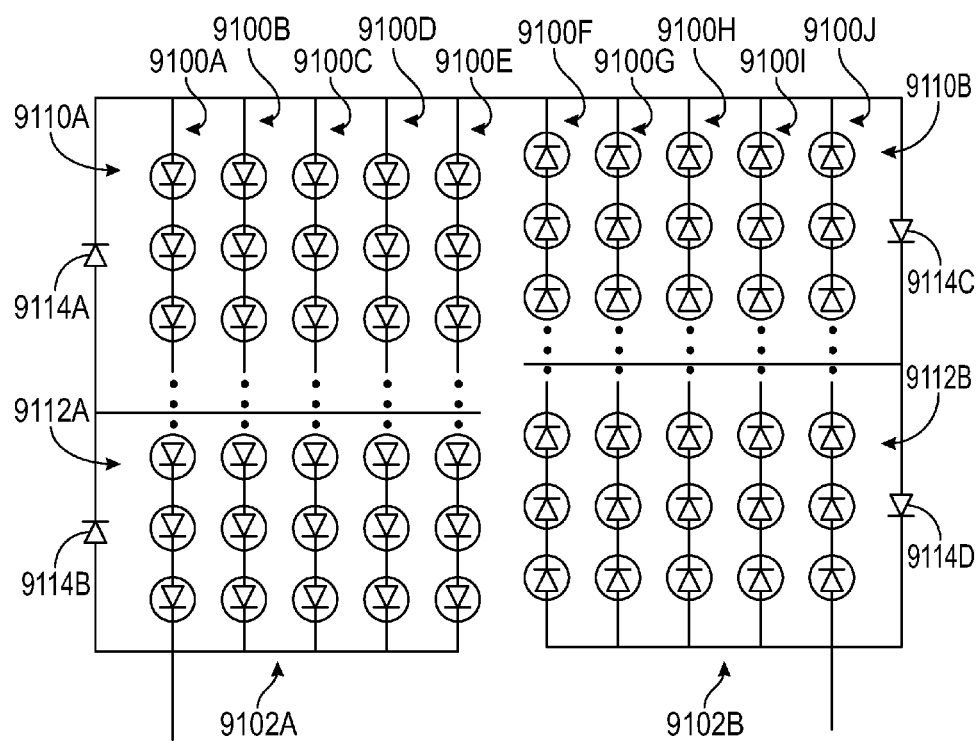
FIG. 91 is an electrical schematic for a solar module, according to still another embodiment.

FIG. 91 is another embodiment of an electrical schematic for solar module 8500. Here, each of the ten strings 9100A-9100J are grouped into two sets of strings 9102A, 9102B are made up of an upper section 9110A, 9110B and a lower section 9112A, 9112B. The upper section 9110A of the first set of strings 9102A are arranged in parallel, and the lower section 9112A of the first set of strings 9102A are arranged in parallel. Each of the sections 9110A, 9112A are further arranged with a bypass diode 9114A, 9114B. The upper section 9110B of the first set of strings 9102B are arranged in parallel, and the lower section 9112B of the first set of strings 9102B are arranged in parallel. Each of the sections 9110B, 9112B are further arranged with a bypass diode 9114C, 9114D. The sets of strings 9102A, 9102B are connected in series.

Figure 92:
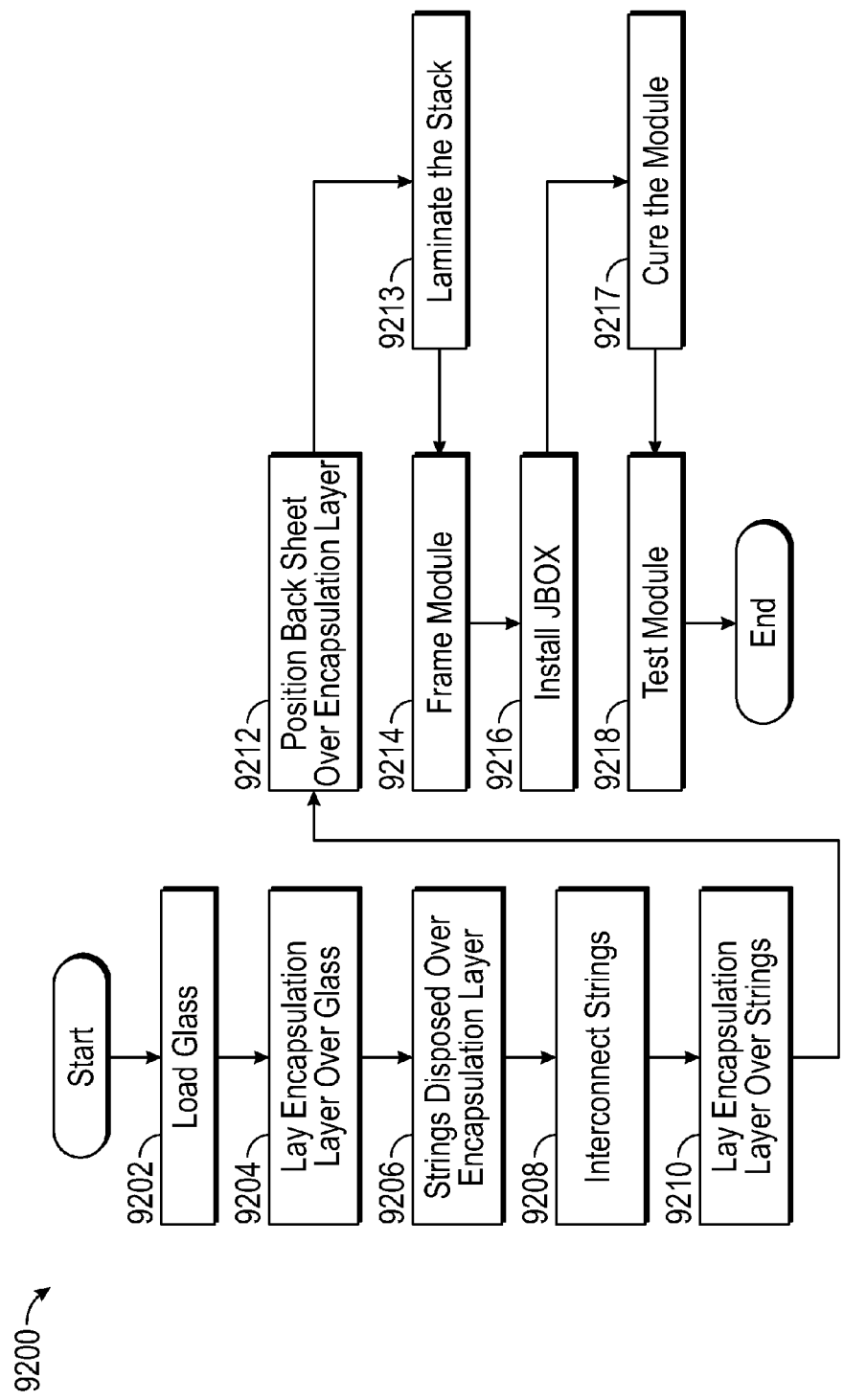
FIG. 92 is a flow diagram of a method of manufacturing a solar module, according to an embodiment.

FIG. 92 is a flow diagram of a method 9200 of manufacturing a solar module, such as the solar module 8500 described above, if provided. In an embodiment, a glass plate, serving as a front plate for the solar module, is loaded as the substrate at step 9202, then an encapsulation layer, such as ethylene vinyl acetate (EVA) or poly olefin (POE) film, is laid on top of glass at step 9204. Next, string sets are disposed over the encapsulation layer at step 9206. In an embodiment, a desired number of string sets can be appropriately positioned and electrically connected by module interconnect busbar to form a desired circuitry. For example, the solar module to be manufactured may be made up of 10 sets of strings and hence, may have a length of between about 1600 mm to about 1700 mm, a width of between about 980 mm to about 1100 mm, and a thickness of between about 2 mm to about 60 mm. In another embodiment, the solar module may be made up of 1 to 18 sets of strings and the glass plate can have a length of between about 500 mm to about 2500 mm, a width of between about 900 mm to about 1200 mm, and a thickness of between about 2 mm to about 60 mm.

In an embodiment, the string sets are positioned over an EVA layer and glass in a configuration as described above with respect to the solar module 8500. The string sets may be placed one at a time over the EVA layer, in an embodiment. Alternatively, the desired number of string sets may be substantially simultaneously placed over the EVA layer. Suitable machinery for automated laying up of the string sets commonly used in mass production of solar modules may be employed.

To form connections between the string sets, the strings are interconnected at step 8908. For example, bus bars are electrically connected to corresponding portions of the string sets via conductive ribbon material. An isolation strip including suitably positioned electrically conductive ribbon adhered thereto, is positioned to extend between two adjacent string sets in a manner as described above. Electrical wires to be hidden in a junction box are either protected or otherwise isolated in order to permit the wires to be placed in the junction box at later stages of manufacture.

Next, another encapsulation layer is laid on top of the string sets at step 9210. Then, a backsheet is positioned over the encapsulation layer at step 9212 to form one or more lamination stacks. The backsheet material protects the solar module circuitry from environmental impact. In an embodiment, the back sheet is dimensioned slightly larger than the glass plate to improve the manufacturing yield. In another embodiment, the backsheet material can be replaced with glass to offer even better protection from environment.

After the back sheet layup, the lamination stacks are loaded into a vacuum lamination chamber in which the stacks are adhered to each other under a high temperature profile in vacuum. The particular details of the lamination process are dependent on the specific properties of the encapsulation material used.

After lamination, the module is framed at step 9214. Framing is employed to provide mechanical strength that is sufficient to withstand wind and snow conditions after the solar module is installed. In an embodiment, the framing is made up of anodized aluminum material. In another embodiment, the framing is disposed on an outer edge of the module. In still another embodiment, the framing extends over a portion of the glass and/or the back sheet. Additionally, silicone is used to seal the gap between glass and framing so that the edges of the solar module are protected from unwanted materials that may unintentionally become trapped within the module which can interfere with the operation of the solar module.

After framing, a junction box is installed on the backsheet, and the interconnect ribbon bus bars are soldered or clamped to contact pads in the junction box at step 9216. Silicone potting material is used to seal the edge of junction box to prevent moisture and or contaminants getting into module. In addition, the junction box itself may be potted to prevent the component from corrosion.

The module is tested at step 8918. Examples of tests include, but are not limited to flash testing to measure the module power output, electroluminescence testing for crack and micro-crack detection, grounding testing and high pot testing for safety, and the like.

Figure 93:
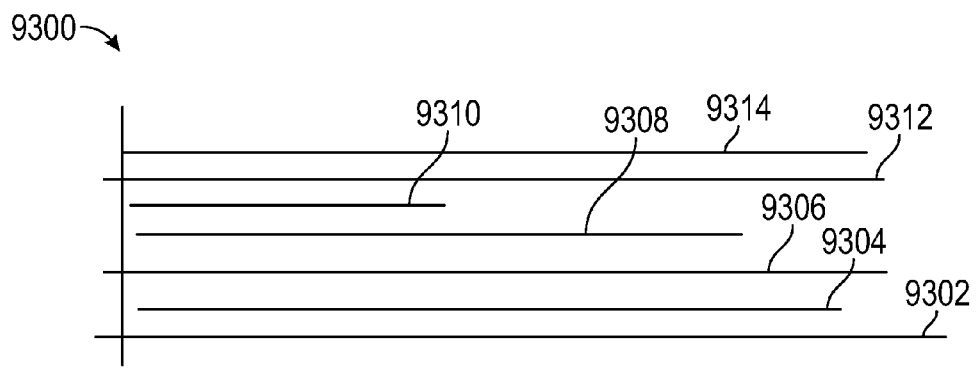
FIG. 93 is a cross-section view of a solar module, according to an embodiment.

FIG. 93 is a simplified cross-sectional view of a solar module 9300 after being processed according to method 9200. As shown, solar module 9300 has a glass layer 9302, which serves as a front of the solar module 9300, an EVA layer 9304, a ribbon layer 9306, a cell 9308, an isolation strip 9310, a rear EVA layer 9312, and a back sheet 9314.

While several embodiments of the disclosure have been shown in the drawings, it is not intended that the disclosure be limited thereto, as it is intended that the disclosure be as broad in scope as the art will allow and that the specification be read likewise. Any combination of the above embodiments is also envisioned and is within the scope of the appended claims. Therefore, the above description should not be construed as limiting, but merely as exemplifications of particular embodiments. Those skilled in the art will envision other modifications within the scope of the claims appended hereto.

What is claimed:

1. A solar cell, comprising:
   a substrate having a front side and a back side;
   a metallization pattern deposited on the front side of the substrate, the metallization pattern including a plurality of front side bus bars, each front side bus bar including fingers extending therefrom; and
   a plurality of back side bus bars deposited on the back side of the substrate,
   wherein:
   on the front side of the substrate, no front side bus bar of the plurality of front side bus bars is formed along an edge of the front side of the substrate, and the plurality of front side bus bars are unequally spaced across the substrate, and
   on the back side of the substrate, two back side bus bars of the plurality of back side bus bars are each formed along a corresponding edge of the back side of the substrate, and a remainder of the back side bus bars of the plurality of back side bus bars are unequally spaced across the substrate.

2. The solar cell of claim 1, wherein the remainder of the front side bus bars of the plurality of front include two front side bus bars that are adjacent each other.

3. The solar cell of claim 1, wherein each front side bus bar of the plurality of front side bus bars includes finger lines extending therefrom and two sets of the finger lines point towards each other.

4. The solar cell of claim 1, wherein each front side bus bar of the plurality of front side bus bars includes finger lines extending therefrom, a first set of the finger lines point toward each other, and a second set of the finger lines point toward each other.

5. The solar cell of claim 1, wherein the solar cell includes five discrete sections, each section including one front side bus bar and one back side bus bar.

6. The solar cell of claim 1, wherein the solar cell includes six discrete sections, each section including one front side bus bar and one back side bus bar.

7. The solar cell of claim 1, wherein the solar cell is dividable into a plurality of strips, each strip is of substantially equal width, and each strip has a front side bus bar on an edge opposite from an edge on which a back side bus bar is formed.

8. The solar cell of claim 1, wherein the solar cell is dividable into a plurality of strips, each strip is of substantially equal area, and each strip has a front side bus bar on an edge opposite from an edge on which a back side bus bar is formed.

9. A method of forming a solar cell comprising:
depositing a metallization pattern on the front side of a substrate, the metallization pattern including a plurality of front side bus bars, each front side bus bar including fingers extending therefrom; and
depositing a plurality of back side bus bars on the back side of the substrate,
wherein:
on the front side of the substrate, no front side bus bar of the plurality of front side bus bars is formed along an edge of the front side of the substrate, and the plurality of front side bus bars are unevenly spaced apart from each other across the substrate, and
on the back side of the substrate, two back side bus bars of the plurality of back side bus bars are each formed along a corresponding edge of the back side of the substrate, and a remainder of the back side bus bars of the plurality of back side bus bars are unequally spaced across the substrate.

10. The method of claim 9, wherein the remainder of the front side bus bars of the plurality of front include two front side bus bars that are adjacent each other.

11. The method of claim 9, wherein each front side bus bar of the plurality of front side bus bars includes finger lines extending therefrom and two sets of the finger lines point towards each other.

12. The method of claim 9, wherein each front side bus bar of the plurality of front side bus bars includes finger lines extending therefrom, a first set of the finger lines point toward each other, and a second set of the finger lines point toward each other.

13. The method of claim 9, further comprising forming scribe lines into the solar cell to define five discrete sections, each section including one front side bus bar and one back side bus bar.

14. The method of claim 9, further comprising forming scribe lines into the solar cell to define six discrete sections, each section including one front side bus bar and one back side bus bar.

15. The method of claim 9, wherein upon cleaving the solar cell into a plurality of strips, each strip is of substantially equal width and each strip has a front side bus bar on an edge opposite from an edge on which a back side bus bar is formed.

16. The method of claim 9, wherein upon cleaving the solar cell into a plurality of strips, each strip is of substantially equal area and each strip has a front side bus bar on an edge opposite from an edge on which a back side bus bar is formed.

* * * * *